(12) United States Patent
Hata et al.

(10) Patent No.: US 8,101,465 B2
(45) Date of Patent: Jan. 24, 2012

(54) METHOD OF FABRICATING A SEMICONDUCTOR DEVICE WITH A BACK ELECTRODE

(75) Inventors: Masayuki Hata, Kadoma (JP); Tadao Toda, Kyoto (JP); Shigeyuki Okamoto, Kobe (JP); Daijiro Inoue, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 266 days.

(21) Appl. No.: 11/723,449

(22) Filed: Mar. 20, 2007

(65) Prior Publication Data

US 2007/0292979 A1    Dec. 20, 2007

Related U.S. Application Data

(62) Division of application No. 10/766,031, filed on Jan. 29, 2004, now Pat. No. 7,372,077.

(30) Foreign Application Priority Data

Feb. 7, 2003   (JP) ................................. 2003-031416
Sep. 30, 2003  (JP) ................................. 2003-339421

(51) Int. Cl.
*H01L 21/00*   (2006.01)

(52) U.S. Cl. ............... 438/113; 438/103; 257/E33.03; 257/E33.04

(58) Field of Classification Search ............... 257/100, 257/E33.03, 31–37, E33.04, 40–49; 438/103, 438/113
See application file for complete search history.

(56) References Cited

U.S. PATENT DOCUMENTS

| 5,309,464 | A |    | 5/1994  | Ko |
| 5,719,605 | A |    | 2/1998  | Anderson et al. |
| 5,861,636 | A |    | 1/1999  | Dutta et al. |
| 6,111,277 | A |    | 8/2000  | Ikeda |
| 6,153,010 | A |    | 11/2000 | Kiyoku et al. |
| 6,225,650 | B1 |   | 5/2001  | Tadatomo et al. |
| 6,509,579 | B2 |   | 1/2003  | Takeya et al. |
| 6,531,784 | B1 | * | 3/2003  | Shim et al. ..................... 257/777 |
| 6,537,513 | B1 |   | 3/2003  | Amano et al. |
| 6,613,461 | B1 | * | 9/2003  | Sugahara ....................... 428/698 |
| 6,639,241 | B2 |   | 10/2003 | Nakahara et al. |

(Continued)

FOREIGN PATENT DOCUMENTS

JP    2-181987    7/1990

(Continued)

OTHER PUBLICATIONS

United States Office Action issued in U.S. Appl. No. 11/976,972 (Jan. 9, 2009).

(Continued)

*Primary Examiner* — Thao Le
*Assistant Examiner* — Allen Parker
(74) *Attorney, Agent, or Firm* — McDermott Will & Emery LLP

(57) ABSTRACT

A semiconductor device capable of stabilizing operations thereof is provided. This semiconductor device comprises a substrate provided with a region having concentrated dislocations at least on part of the back surface thereof, a semiconductor element layer formed on the front surface of the substrate, an insulator film formed on the region of the back surface of the substrate having concentrated dislocations and a back electrode formed to be in contact with a region of the back surface of the substrate other than the region having concentrated dislocations.

10 Claims, 33 Drawing Sheets

U.S. PATENT DOCUMENTS

| | | | |
|---|---|---|---|
| 6,812,496 | B2 | 11/2004 | Takatani et al. |
| 6,855,959 | B2 | 2/2005 | Yamaguchi et al. |
| 2001/0032975 | A1 | 10/2001 | Yamaguchi et al. |
| 2002/0053665 | A1* | 5/2002 | Tsuda et al. ............ 257/14 |
| 2003/0132441 | A1* | 7/2003 | Takatani et al. ......... 257/79 |
| 2003/0145783 | A1 | 8/2003 | Motoki et al. |
| 2003/0207480 | A1 | 11/2003 | Kobayashi et al. |
| 2004/0164308 | A1 | 8/2004 | Asatsuma et al. |
| 2005/0042787 | A1 | 2/2005 | Ito et al. |
| 2006/0097278 | A1* | 5/2006 | Goto et al. ............ 257/103 |

FOREIGN PATENT DOCUMENTS

| | | |
|---|---|---|
| JP | 3-238888 | 10/1991 |
| JP | 07-154026 | 6/1995 |
| JP | 8-51256 | 2/1996 |
| JP | 9-45999 | 2/1997 |
| JP | 10-93186 | 4/1998 |
| JP | 10-093186 | 4/1998 |
| JP | 10-242581 | 9/1998 |
| JP | 11-004048 | 1/1999 |
| JP | 11-130597 | 5/1999 |
| JP | 11-162847 | 6/1999 |
| JP | 11-191637 | 7/1999 |
| JP | 11-214798 | 8/1999 |
| JP | 11-219910 | 8/1999 |
| JP | 11-233893 | 8/1999 |
| JP | 11-312841 | 11/1999 |
| JP | 11-330610 | 11/1999 |
| JP | 2000-044400 | 2/2000 |
| JP | 2000-058972 | 2/2000 |
| JP | 2000-183459 | 6/2000 |
| JP | 2000-294875 | 10/2000 |
| JP | 2000-307184 | 11/2000 |
| JP | 2001-085735 | 3/2001 |
| JP | 2001-102307 | 4/2001 |
| JP | 2001-148544 | 5/2001 |
| JP | 2001-257193 | 9/2001 |
| JP | 2001-267687 | 9/2001 |
| JP | 2001-274521 | 10/2001 |
| JP | 2002-033512 | 1/2002 |
| JP | 2002-33512 | 1/2002 |
| JP | 2002-184707 | 6/2002 |
| JP | 2002-314198 | 10/2002 |
| JP | 2002-368335 | 12/2002 |
| JP | 2003-69153 | 3/2003 |
| JP | 2003-124573 | 4/2003 |
| JP | 2003-133650 | 5/2003 |
| JP | 2003-229638 | 8/2003 |
| JP | 2003-243773 | 8/2003 |
| JP | 2003-273470 | 9/2003 |
| JP | 2004-022785 | 1/2004 |
| JP | 2004-023050 | 1/2004 |
| WO | WO 03/038957 A1 | 5/2003 |
| WO | WO 2004001920 A1 * | 12/2003 |

OTHER PUBLICATIONS

Chinese Office Action, w/ English translation thereof, issued in Chinese Patent Application No. 200710147743.1 dated on Aug. 29, 2008.
Japanese Office Action issued in corresponding Japanese Patent Application No. JP 2003-339421, filed Mar. 13, 2007.
Chinese Office Action issued in corresponding Chinese Patent Application No. CN 2004100048488, filed Feb. 16, 2007.
Japanese Office Action issued in Japanese Patent Application No. JP 2004-027477, dated on May 8, 2007.
Japanese Office Action, with English Translation, issued in Corresponding Japanese Patent Application No. 2003-339421, dated on Oct. 30, 2007.
Japanese Office Action with English Translation issued in Patent Application No. 2007-179158 dated on Jan. 29, 2008.
Japanese Notification of Reason(s) for Rejection, with English translation thereof, issued in Patent Application No. 2007-179158 dated on Jun. 24, 2008.
Japanese Office Action, with English translation, issued in Japanese Patent Application No. 2007-089897, dated Mar. 10, 2009.
Chinese Office Action, w/ English translation thereof, issued in Chinese Patent Application No. CN 2008100088303 dated Mar. 13, 2009.
Japanese Notification of Reasons for Rejection, with English Translation, issued in Japanese Patent Application No. 2007-179157, dated Dec. 8, 2009.
Japanese Decision of Rejection, with English Translation, issued in Japanese Patent Application No. 2007-089897, dated Dec. 8, 2009.
Chinese Office Action, with English translation, issued in Chinese Patent Application No. 2008100088303, mailed Sep. 18, 2009.
JP Office Action dated Apr. 13, 2010 with English Translation thereof, issued in related JP Patent Appln. No. 2007-179157.
Japanese Office Action, with English translation, issued in Japanese Patent Application No. 2010-005023, mailed Oct. 26, 2010.
Japanese Office Action, w/ English translation thereof, issued in Japanese Patent Application No. JP 2007-089897 dated Mar. 15, 2011.
Japanese Office Action, w/ English translation thereof, issued in Japanese Patent Application No. JP 2007-089897 dated Jun. 7, 2011.
Japanese Office Action, with English translation, issued in Japanese Patent Application No. 2007-089894, dated Aug. 23, 2011.

* cited by examiner

METHOD OF FABRICATING A SEMICONDUCTOR DEVICE WITH A BACK ELECTRODE

RELATED APPLICATIONS

This application is a divisional of application Ser. No. 10/766,031, filed on Jan. 29, 2004 now U.S. Pat. No. 7,372,077, which in turn claims the benefit of Japanese Application No. 2003-031416, filed on Feb. 7, 2003, and Japanese Application No. 2003-339421, filed on Sep. 30, 2003, the disclosures of which Applications are incorporated by reference herein.

BACKGROUND OF THE INVENTION

1. Field of the Invention

The present invention relates to a semiconductor device and a method of fabricating the same, and more particularly, it relates to a semiconductor device having a semiconductor element layer formed on a substrate and a method of fabricating the same.

2. Description of the Background Art

In general, a light-emitting diode device or a semiconductor laser device is known as a semiconductor device having a semiconductor element layer formed on a substrate. Such a semiconductor device is disclosed in Japanese Patent Laying-Open No. 11-214798 (1999), for example.

The aforementioned Japanese Patent Laying-Open No. 11-214798 discloses a nitride-based semiconductor laser device having a plurality of nitride-based semiconductor layers formed on a nitride-based semiconductor substrate. More specifically, an n-type nitride-based semiconductor layer, an emission layer consisting of a nitride-based semiconductor and a p-type nitride-based semiconductor layer are successively formed on an n-type GaN substrate in the nitride-based semiconductor laser device disclosed in the aforementioned Japanese Patent Laying-Open No. 11-214798. A ridge portion serving as a current path portion is formed on the p-type nitride-based semiconductor layer, while a p-side electrode is formed on the ridge portion. An n-side electrode is formed on the back surface of the n-type GaN substrate.

When dislocations are present on the back surface of the substrate in the aforementioned semiconductor device having an electrode on the back surface of the substrate, current flows to regions of the back surface of the substrate having the dislocations, to result in development of leakage current. In the aforementioned Japanese Patent Laying-Open No. 11-214798, therefore, the n-type GaN substrate is prepared by lateral growth thereby reducing the number of dislocations present in the n-type GaN substrate. More specifically, a mask layer is formed on a prescribed portion of a sapphire substrate, and an n-type GaN layer is thereafter laterally grown on the sapphire substrate through the mask layer serving as a selective growth mask. At this time, the n-type GaN layer is selectively longitudinally grown on portions of the sapphire substrate formed with no mask layer, and thereafter gradually grown in the lateral direction. The n-type GaN layer is laterally grown to laterally bend dislocations, thereby inhibiting the dislocations from longitudinal propagation. Thus, the n-type GaN layer is so formed as to reduce the number of dislocations reaching the upper surface thereof. Thereafter regions (the sapphire substrate etc.) including the mask layer located under the n-type GaN layer are removed thereby forming an n-type GaN substrate having a reduced number of dislocations.

In the method of the aforementioned literature, however, regions having concentrated dislocations are disadvantageously formed on the portions, allowing longitudinal growth of the n-type GaN layer, formed with no mask layer. If the n-side electrode is formed on regions of the back surface of the n-type GaN substrate having concentrated dislocations when the n-type GaN substrate is prepared from the n-type GaN layer including the regions having concentrated dislocations, current flows to the regions of the back surface of the n-type GaN substrate having concentrated dislocations to disadvantageously result in development of leakage current. In this case, optical output is unstabilized when the device is subjected to constant current driving, and hence it is disadvantageously difficult to stabilize operations of the device.

SUMMARY OF THE INVENTION

The present invention has been proposed in order to solve the aforementioned problem, and an object thereof is to provide a semiconductor device capable of stabilizing operations thereof.

Another object of the present invention is to provide a method of fabricating a semiconductor device capable of stabilizing operations thereof.

In order to attain the aforementioned objects, a semiconductor device according to a first aspect of the present invention comprises a substrate provided with a region of the back surface having concentrated dislocations at least on part of the back surface thereof, a semiconductor element layer formed on the front surface of the substrate, an insulator film formed on the region of the back surface having the concentrated dislocations and a back electrode formed to be in contact with a region of the back surface of the substrate other than the region of the back surface having the concentrated dislocations.

In the semiconductor device according to the first aspect, as hereinabove described, the insulator film is formed on the region of the back surface of the substrate having concentrated dislocations while the back electrode is formed to be in contact with the region of the back surface of the substrate other than the region having concentrated dislocations so that the insulator film covers the region of the back surface of the substrate having concentrated dislocations not to expose the same, whereby it is possible to easily suppress development of leakage current resulting from current flowing to the region of the back surface of the substrate having concentrated dislocations. Consequently, optical output can be easily stabilized when the device is subjected to constant current driving, whereby operations of the semiconductor device can be easily stabilized. Further, the quantity of current flowing to the region having concentrated dislocations can be so reduced that it is possible to reduce unnecessary emission from the region having concentrated dislocations.

In the aforementioned semiconductor device according to the first aspect, the semiconductor element layer is preferably provided with a region of the front surface having the concentrated dislocations at least on part of the front surface thereof, and the semiconductor device preferably further comprises a front electrode formed to be in contact with a region of the front surface of the semiconductor element layer other than the region of the front surface having the concentrated dislocations. According to this structure, it is possible to suppress development of leakage current resulting from current flowing to the region of the front surface of the semiconductor element layer having concentrated dislocations. Consequently, optical output can be stabilized when the device is subjected to constant current driving, whereby operations of the semiconductor device can be stabilized also when the semiconductor element layer is provided with the region having concentrated dislocations on the front surface thereof. Further, the quantity of current flowing to the region having concentrated dislocations can be so reduced that it is possible to reduce unnecessary emission from the region having concentrated dislocations.

In the semiconductor device according to the first aspect, the substrate may include a nitride-based semiconductor substrate. According to this structure, the nitride-based semiconductor substrate can be inhibited from development of leakage current.

A semiconductor device according to a second aspect of the present invention comprises a semiconductor element layer formed on the front surface of a substrate and provided with a region of the front surface having concentrated dislocations at least on part of the front surface thereof, an insulator film formed on the region of the front surface having the concentrated dislocations and a front electrode formed to be in contact with a region of the front surface of the semiconductor element layer other than the region of the front surface having the concentrated dislocations.

In the semiconductor device according to the second aspect, as hereinabove described, the insulator film is formed on the region of the front surface of the semiconductor element layer having concentrated dislocations while the front electrode is formed to be in contact with the region of the front surface of the semiconductor element layer other than the region having concentrated dislocations so that the insulator film covers the region of the front surface of the semiconductor element layer having concentrated dislocations not to expose the same, whereby it is possible to easily suppress development of leakage current resulting from current flowing to the region of the front surface of the semiconductor element layer having concentrated dislocations. Consequently, optical output can be easily stabilized when the device is subjected to constant current driving, whereby operations of the semiconductor device can be easily stabilized. Further, the quantity of current flowing to the region having concentrated dislocations can be so reduced that it is possible to reduce unnecessary emission from the region having concentrated dislocations.

In the aforementioned semiconductor device according to the second aspect, the substrate is preferably provided with a region of the back surface having the concentrated dislocations on at least part of the back surface thereof, and the semiconductor device preferably further comprises a back electrode formed to be in contact with a region of the back surface of the substrate other than the region of the back surface having the concentrated dislocations. According to this structure, it is possible to suppress development of leakage current resulting from current flowing to the region of the back surface of the substrate having concentrated dislocations. Consequently, optical output can be stabilized when the device is subjected to constant current driving, whereby operations of the semiconductor device can be stabilized also when the substrate is provided with the region having concentrated dislocations on the back surface thereof. Further, the quantity of current flowing to the region having concentrated dislocations can be so reduced that it is possible to reduce unnecessary emission from the region having concentrated dislocations.

In this case, the substrate may include a nitride-based semiconductor substrate. According to this structure, the nitride-based semiconductor substrate can be inhibited from development of leakage current.

In this case, the side of the back electrode is preferably provided on a position inwardly separated from the side of the substrate by a prescribed interval. According to this structure, solder can be inhibited from flowing toward the side of the semiconductor element layer formed on the substrate when the solder is welded to the back electrode, for example. Thus, the semiconductor device can be inhibited from a defective short.

In this case, the semiconductor device preferably further comprises an insulator film formed on the region of the back surface having the concentrated dislocations. According to this structure, the insulator film covers the region of the back surface of the substrate having concentrated dislocations not to expose the same, whereby it is possible to easily suppress development of leakage current resulting from current flowing to the region of the back surface of the substrate having concentrated dislocations.

A semiconductor device according to a third aspect of the present invention comprises a semiconductor element layer formed on the front surface of a substrate and provided with a region of the front surface having concentrated dislocations at least on part of the front surface thereof, a recess portion formed on a region of the front surface of the semiconductor element layer located inward beyond the region of the front surface having the concentrated dislocations and a front electrode formed to be in contact with a region of the front surface of the semiconductor element layer other than the region of the front surface having the concentrated dislocations.

In the semiconductor device according to the third embodiment, as hereinabove described, the recess portion is formed on the region of the front surface of the semiconductor element layer located inward beyond the region having concentrated dislocations while the front electrode is formed to be in contact with the region of the front surface of the semiconductor element layer other than the region having concentrated dislocations, whereby it is possible to suppress development of leakage current resulting from current flowing to the region of the front surface of the semiconductor element layer having concentrated dislocations. Consequently, optical output can be stabilized when the device is subjected to constant current driving, whereby operations of the semiconductor device can be stabilized. When the semiconductor device is applied to a light-emitting device, for example, the recess portion parts the region of the front surface of the semiconductor element layer located inward beyond the region having concentrated dislocations and the region of the front surface of the semiconductor element layer having concentrated dislocations from each other, whereby the region of the front surface of the semiconductor element layer having concentrated dislocations can be inhibited from absorbing light emitted from the region of the front surface of the semiconductor element layer located inward beyond the region having concentrated dislocations. Thus, light absorbed by the region having concentrated dislocations can be inhibited from reemission at an unintended wavelength, whereby deterioration of color purity resulting from such reemission can be suppressed.

In the aforementioned semiconductor device according to the third aspect, the substrate is preferably provided with a region of the back surface having the concentrated dislocations at least on part of the back surface thereof, and the semiconductor device preferably further comprises a back electrode formed to be in contact with a region of the back surface of the substrate other than the region of the back surface having the concentrated dislocations. According to this structure, it is possible to suppress development of leakage current resulting from current flowing to the region of the back surface of the substrate having concentrated dislocations. Consequently, optical output can be stabilized when the device is subjected to constant current driving, whereby operations of the semiconductor device can be stabilized also when the substrate is provided with the region having concentrated dislocations the back surface thereof. Further, the quantity of current flowing to the region having concentrated dislocations can be so reduced that it is possible to reduce unnecessary emission from the region having concentrated dislocations.

In this case, the semiconductor device preferably further comprises an insulator film formed on the region of the back surface having the concentrated dislocations. According to this structure, the insulator film covers the region of the back surface of the substrate having concentrated dislocations not to expose the same, whereby it is possible to easily suppress development of leakage current resulting from current flowing to the region of the back surface of the substrate having concentrated dislocations.

In this case, the substrate may include a nitride-based semiconductor substrate. According to this structure, the nitride-based semiconductor substrate can be inhibited from development of leakage current.

A semiconductor device according to a fourth aspect of the present invention comprises a semiconductor element layer formed on the front surface of a substrate and provided with a region of the front surface having concentrated dislocations at least on part of the front surface thereof, a high resistance region formed in the region of the front surface having the concentrated dislocations and a front electrode formed to be in contact with a region of the front surface of the semiconductor element layer other than the region of the front surface having the concentrated dislocations.

In the semiconductor device according to the fourth aspect, as hereinabove described, the high resistance region is formed in the region of the front surface of the semiconductor element layer having concentrated regions while the front electrode is formed to be in contact with the region of the front surface of the semiconductor element layer other than the region having concentrated dislocations so that current hardly flows to the region of the front surface of the semiconductor element layer having concentrated dislocations due to formation of the high resistance region, whereby it is possible to suppress development of leakage current resulting from current flowing to the region of the front surface of the semiconductor element layer having concentrated dislocations. Consequently, optical output can be easily stabilized when the device is subjected to constant current driving, whereby operations of the semiconductor device can be easily stabilized. Further, the quantity of current flowing to the region having concentrated dislocations can be so reduced that it is possible to reduce unnecessary emission from the region having concentrated dislocations.

In the aforementioned semiconductor device according to the fourth aspect, the high resistance region preferably includes an impurity introduction layer formed by introducing the impurity. According to this structure, the high resistance region can be easily formed on the region of the front surface of the semiconductor element layer having concentrated dislocations.

In the aforementioned semiconductor device according to the fourth aspect, the substrate is preferably provided with a region of the back surface having the concentrated dislocations at least on part of the back surface thereof, and the semiconductor device preferably further comprises a back electrode formed to be in contact with a region of the back surface of the substrate other than the region of the back surface having the concentrated dislocations. According to this structure, it is possible to suppress development of leakage current resulting from current flowing to the region of the back surface of the substrate having concentrated dislocations. Consequently, optical output can be stabilized when the device is subjected to constant current driving, whereby operations of the semiconductor device can be stabilized also when the substrate is provided with the region having concentrated dislocations on the back surface thereof. Further, the quantity of current flowing to the region having concentrated dislocations can be so reduced that it is possible to reduce unnecessary emission from the region having concentrated dislocations.

In this case, the semiconductor device preferably further comprises an insulator film formed on the region of the back surface having the concentrated dislocations. According to this structure, the insulator film covers the region of the back surface of the substrate having concentrated dislocations not to expose the same, whereby it is possible to easily suppress development of leakage current resulting from current flowing to the region of the back surface of the substrate having concentrated dislocations.

In the aforementioned semiconductor device according to the fourth aspect, the substrate may include a nitride-based semiconductor substrate. According to this structure, the nitride-based semiconductor substrate can be inhibited from development of leakage current.

A semiconductor device according to a fifth aspect of the present invention comprises a semiconductor element layer formed on the front surface of a substrate and provided with a region of the front surface having concentrated dislocations at least on part of the front surface thereof while including an active layer and a front electrode formed to be in contact with a region of the front surface of the semiconductor element layer other than the region of the front surface having the concentrated dislocations, and the upper surface of the region of the front surface having the concentrated dislocations is partially removed by a prescribed thickness and located downward beyond the active layer.

In the semiconductor device according to the fifth aspect, as hereinabove described, the upper surface of the region of the front surface of the semiconductor element layer having concentrated dislocations is partially removed by the prescribed thickness so that the upper surface of the region of the front surface of the semiconductor element layer having concentrated dislocations is located downward beyond the active layer, whereby part of the region having concentrated dislocations formed through a p-n junction region is removed when the p-n junction region is formed to hold the active layer so that it is possible to suppress development of leakage current resulting from current flowing to the region having concentrated dislocations. Consequently, optical output can be easily stabilized when the device is subjected to constant current driving, whereby operations of the semiconductor device can be easily stabilized. Further, the quantity of current flowing to the region having concentrated dislocations can be so reduced that it is possible to reduce unnecessary emission from the region having concentrated dislocations.

In the aforementioned semiconductor device according to the fifth aspect, the active layer is preferably formed in a region of the front surface of the semiconductor element layer other than the region of the front surface having the concentrated dislocations. According to this structure, it is possible to easily suppress development of leakage current resulting from formation of the region having concentrated dislocations through a p-n junction region when the p-n junction region is formed to hold the active layer.

In this case, the semiconductor element layer preferably includes a first conductivity type first semiconductor layer formed under the active layer, the first semiconductor layer preferably includes a first region having a first thickness located inward beyond the region of the front surface having the concentrated dislocations and a second region, including the region of the front surface having the concentrated dislocations, having a second thickness smaller than the first thickness, and the active layer preferably has a width smaller than the width of the first region of the first semiconductor layer. According to this structure, a p-n junction region is smaller than the first region of the first semiconductor layer when the p-n junction region is formed to hold the active layer, whereby a p-n junction capacitance can be reduced. Thus, the speed of response of the semiconductor device can be increased.

A semiconductor device according to a sixth aspect of the present invention comprises a substrate including a first region having a first thickness and a second region provided with a region of the front surface having concentrated dislocations at least on part of the front surface thereof while having a second thickness smaller than the first thickness, a semiconductor element layer formed on the first region of the front surface of the substrate other than the second region provided with the region of the front surface having the concentrated dislocations and a front electrode formed to be in contact with the front surface of the semiconductor element layer.

In the semiconductor device according to the sixth aspect, as hereinabove described, the semiconductor element layer is formed on the first region of the front surface of the substrate other than the second region provided with the region having concentrated dislocations while the front electrode is formed to be in contact with the front surface of the semiconductor element layer so that the semiconductor element layer is formed with no region having concentrated dislocations, whereby it is possible to suppress development of leakage current resulting from current flowing to the region having concentrated dislocations. Consequently, optical output can be easily stabilized when the device is subjected to constant current driving, whereby operations of the semiconductor device can be easily stabilized. Further, the quantity of current flowing to the region having concentrated dislocations can be so reduced that it is possible to reduce unnecessary emission from the region having concentrated dislocations.

In the aforementioned semiconductor device according to the sixth aspect, the semiconductor element layer preferably includes a first conductivity type first semiconductor layer, an active layer formed on the first semiconductor layer and a second conductivity type second semiconductor layer formed on the active layer. According to this structure, a p-n junction region between the first and second semiconductor layers formed through the active layer is formed with no region having concentrated dislocations, whereby it is possible to easily suppress development of leakage current resulting from current flowing to the region having concentrated dislocations.

In this case, the active layer preferably has a width smaller than the width of the first semiconductor layer. According to this structure, the p-n junction region between the first and second semiconductor layers formed through the active layer is so reduced that the p-n junction capacitance formed by the first and second semiconductor layers can be reduced. Thus, the speed of response of the semiconductor device can be increased.

A semiconductor device according to a seventh aspect of the present invention comprises a substrate provided with a region of the front surface having concentrated dislocations at least on part of the front surface thereof, a first selective growth mask formed on a region of the front surface of the substrate located inward beyond the region of the front surface having the concentrated dislocations with a width smaller than the width of the region of the front surface having the concentrated dislocations, a semiconductor element layer formed on a region of the front surface of the substrate other than a region formed with the first selective growth mask and a front electrode formed to be in contact with a portion of the front surface of the semiconductor element layer located inside the first selective growth mask.

In the semiconductor device according to the seventh aspect, as hereinabove described, the first selective growth mask having the width smaller than the width of the region having concentrated dislocations is formed on the region located inward beyond the region of the front surface of the substrate having concentrated dislocations so that no semiconductor element layer is grown on the first selective growth mask when the semiconductor element layer is grown on the front surface of the substrate, whereby a recess portion is formed between a portion of the semiconductor element layer formed on the region of the front surface of the substrate inside the region having concentrated dislocations and another portion of the semiconductor element layer formed on the region of the front surface of the substrate having concentrated dislocations. Therefore, the recess portion can part the portion of the semiconductor element layer formed on the region of the front surface of the substrate inside the region having concentrated dislocations and the portion of the semiconductor element layer formed on the region of the front surface of the substrate having concentrated dislocations from each other. In this case, it is possible to suppress development of leakage current resulting from current flowing to the region of the front surface of the semiconductor element layer having concentrated dislocations by forming the front electrode to be in contact with the portion of the front surface of the semiconductor element layer located inside the first selective growth mask. Consequently, optical output can be stabilized when the device is subjected to constant current driving, whereby operations of the semiconductor device can be stabilized. When the semiconductor device is applied to a light-emitting device, for example, the recess portion parts the region of the front surface of the semiconductor element layer located inward beyond the region having concentrated dislocations and the region of the front surface of the semiconductor element layer having concentrated dislocations from each other, whereby the region of the front surface of the semiconductor element layer having concentrated dislocations can be inhibited from absorbing light emitted from the region of the front surface of the semiconductor layer located inward beyond the region having concentrated dislocations. Thus, light absorbed by the region having concentrated dislocations can be inhibited from reemission at an unintended wavelength, whereby deterioration of color purity resulting from such reemission can be suppressed. According to the seventh aspect, further, the width of the first selective growth mask is so reduced as to reduce the total quantity of source gas reaching the overall surface of the first selective growth mask, thereby reducing the quantity of the source gas or decomposites thereof diffusing from the surface of the first selective growth mask into the front surface under the growth of the semiconductor element layer located in the vicinity of the first selective growth mask. Thus, amount of increase of the quantity of the source gas or the decomposites thereof supplied to the front surface under the growth of the semiconductor element layer located in the vicinity of the first selective growth mask can be reduced, whereby the thickness of the semiconductor element layer located in the vicinity of the first selective growth mask can be inhibited from increase. Consequently, the thickness of the semiconductor element layer can be inhibited from inequality between a position close to the first selective growth mask and a position separated from the first selective growth mask.

The aforementioned semiconductor device according to the seventh aspect preferably further comprises a second selective growth mask formed on a region located outward beyond the first selective growth mask at a prescribed interval from the first selective growth mask. According to this structure, no semiconductor element layer is grown on the second selective growth mask when the semiconductor element layer is grown on the region of the front surface of the substrate having concentrated dislocations, for example, whereby the semiconductor element layer can be inhibited from formation of dislocations.

In this case, the second selective growth mask is preferably formed on the region of the front surface having the concentrated dislocations. According to this structure, the semiconductor element layer can be easily inhibited from formation of dislocations.

A method of fabricating a semiconductor device according to an eighth aspect of the present invention comprises steps of forming a semiconductor element layer on the front surface of a substrate provided with a region of the back surface having concentrated dislocations at least on part of the back surface thereof, forming a back electrode to be in contact with the back surface of the substrate and removing the region of the back surface having the concentrated dislocations after forming the semiconductor element layer and the back electrode.

In the method of fabricating a semiconductor device according to the eighth aspect, as hereinabove described, the region having concentrated dislocations is removed after formation of the semiconductor element layer and the back electrode so that it is possible to easily suppress development of leakage current resulting from current flowing to the region of the back surface of the substrate having concentrated dislocations. Consequently, optical output can be easily stabilized when the device is subjected to constant current driving, whereby a stably operating semiconductor device can be easily fabricated. When the semiconductor device is applied to a light-emitting device, for example, it is possible to easily inhibit the region of the back surface of the substrate having concentrated dislocations from absorbing light emitted from the semiconductor element layer. Thus, light absorbed by the region having concentrated dislocations can be easily inhibited from reemission at an unintended wavelength, whereby deterioration of color purity resulting from such reemission can be suppressed.

In the aforementioned method of fabricating a semiconductor device according to the eighth aspect, the step of removing the region of the back surface having the concentrated dislocations preferably includes a step of removing a portion between the back surface of the substrate and the front surface of the semiconductor element layer with a substantially identical width. According to this structure, threading dislocations extending from the back surface of the substrate to the front surface of the semiconductor element layer can be easily removed.

In the aforementioned method of fabricating a semiconductor device according to the eighth aspect, the substrate may include a nitride-based semiconductor substrate. According to this structure, a nitride-based semiconductor device capable of inhibiting a nitride-based semiconductor substrate from development of leakage current can be easily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a nitride-based semiconductor laser device according to a first embodiment of the present invention is described with reference to FIGS. 1 and 2.

Figure 1:
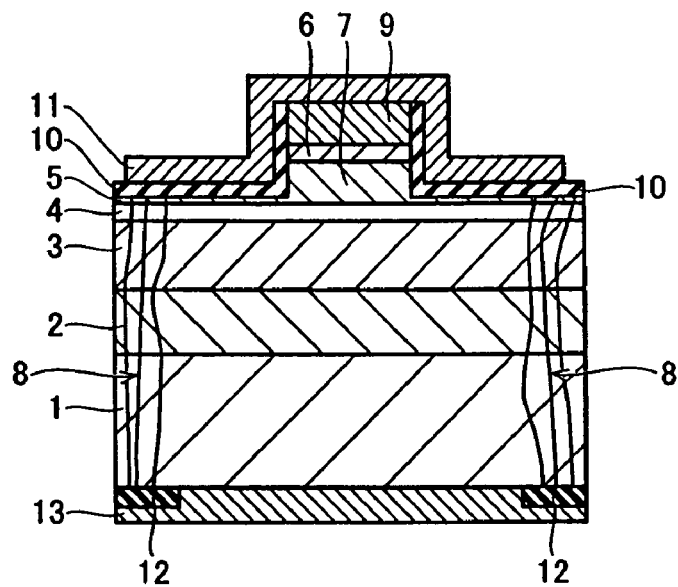
FIG. 1 is a sectional view showing the structure of a nitride-based semiconductor laser device (semiconductor device) according to a first embodiment of the present invention.

In the nitride-based semiconductor laser device according to the first embodiment, an n-type layer 2 having a thickness of about 100 nm and consisting of n-type GaN doped with Si having an atomic density of about $5 \times 10^{18}$ cm$^{-3}$ is formed on the (0001) plane of an n-type GaN substrate 1 of a wurtzite structure having a thickness of about 100 μm and doped with oxygen having a carrier concentration of about $5 \times 10^{18}$ cm$^{-3}$, as shown in FIG. 1. An n-type cladding layer 3 having a thickness of about 400 nm and consisting of n-type Al$_{0.05}$Ga$_{0.95}$N doped with Si having an atomic density of about $5 \times 10^{18}$ cm$^{-3}$ and a carrier concentration of about $5 \times 10^{18}$ cm$^{-3}$ is formed on the n-type layer 2. The n-type GaN substrate 1 is an example of the "substrate" or the "nitride-based semiconductor substrate" in the present invention, and the n-type layer 2 and the n-type cladding layer 3 are examples of the "semiconductor element layer" in the present invention.

An emission layer 4 is formed on the n-type cladding layer 3. As shown in FIG. 2, this emission layer 4 is constituted of an n-type carrier blocking layer 4a, an n-type light guide layer 4b, a multiple quantum well (MQW) active layer 4e, a p-type light guide layer 4f and a p-type cap layer 4g. The n-type carrier blocking layer 4a has a thickness of about 5 nm, and consists of n-type Al$_{0.1}$Ga$_{0.9}$N doped with Si having an atomic density of about $5 \times 10^{18}$ cm$^{-3}$ and a carrier concentration of about $5 \times 10^{18}$ cm$^{-3}$. The n-type light guide layer 4b has a thickness of about 100 nm, and consists of n-type GaN doped with Si having an atomic density of about $5 \times 10^{18}$ cm$^{-3}$ and a carrier concentration of about $5 \times 10^{18}$ cm$^{-3}$. The MQW active layer 4e is formed by alternately stacking four barrier layers 4c of undoped In$_{0.05}$Ga$_{0.95}$N each having a thickness of about 20 nm and three well layers 4d of undoped In$_{0.15}$Ga$_{0.85}$N each having a thickness of about 3 nm. The p-type light guide layer 4f has a thickness of about 100 nm, and consists of p-type GaN doped with Mg having an atomic density of about $4 \times 10^{19}$ cm$^{-3}$ and a carrier concentration of about $5 \times 10^{17}$ cm$^{-3}$. The p-type cap layer 4g has a thickness of about 20 nm, and consists of p-type Al$_{0.1}$Ga$_{0.9}$N doped with Mg having an atomic density of about $4 \times 10^{19}$ cm$^{-3}$ and a carrier concentration of about $5 \times 10^{17}$ cm$^{-3}$. The emission layer 4 is an example of the "semiconductor element layer" in the present invention.

As shown in FIG. 1, a p-type cladding layer 5 having a projecting portion and consisting of p-type Al$_{0.05}$Ga$_{0.95}$N doped with Mg having an atomic density of about $4 \times 10^{19}$ cm$^{-3}$ and a carrier concentration of about $5 \times 10^{17}$ cm$^{-3}$ is formed on the emission layer 4. The projecting portion of this p-type cladding layer 5 has a width of about 1.5 μm and a height of about 300 nm. Flat portions of the p-type cladding layer 5 other than the projecting portion have a thickness of about 100 nm. A p-type contact layer 6 having a thickness of about 10 nm and consisting of p-type GaN doped with Mg having an atomic density of about $4 \times 10^{19}$ cm$^{-3}$ and a carrier concentration of about $5 \times 10^{17}$ cm$^{-3}$ is formed on the projecting portion of the p-type cladding layer 5. The projecting portion of the p-type cladding layer 5 and the p-type contact layer 6 constitute a striped (elongated) ridge portion 7 extending in a prescribed direction. The p-type cladding layer 5 and the p-type contact layer 6 are examples of the "semiconductor element layer" in the present invention.

A p-side ohmic electrode 9 consisting of a Pt layer having a thickness of about 5 nm, a Pd layer having a thickness of about 100 nm and an Au layer having a thickness of about 150 nm in ascending order is formed on the p-type contact layer 6 constituting the ridge portion 7. The p-side ohmic electrode 9 is an example of the "front electrode" in the present invention. Insulator films 10 of SiN having a thickness of about 250 nm are formed on the front surfaces of the flat portions of the p-type cladding layer 5 other than the projecting portion to cover the side surfaces of the ridge portion 7 and the p-side ohmic electrode 9. A p-side pad electrode 11 consisting of a Ti layer having a thickness of about 100 nm, a Pd layer having a thickness of about 100 nm and an Au layer having a thickness of about 3 µm in ascending order is formed on the front surfaces of the insulator films 10 to be in contact with the upper surface of the p-side ohmic electrode 9.

In the vicinity of ends of the n-type GaN substrate 1 and the nitride-based semiconductor layers 2 to 5, regions 8 of about 10 µm in width having concentrated dislocations, extending from the back surface of the n-type GaN substrate 1 to the front surfaces of the flat portions of the p-type cladding layer 5, are formed with a period of about 400 µm in a striped (elongated) shape. According to the first embodiment, insulator films 12 of $SiO_2$ having a thickness of about 250 nm and a width of about 40 µm are formed to cover the regions 8 having concentrated dislocations on the back surface of the n-type GaN substrate 1. An n-side electrode 13 is formed on the back surface of the n-type GaN substrate 1 to be in contact with a region of the back surface of the n-type GaN substrate 1 other than the regions 8 having concentrated dislocations while covering the insulator films 12. This n-side electrode 13 consists of an Al layer having a thickness of about 10 nm, a Pt layer having a thickness of about 20 nm and an Au layer having a thickness of about 300 nm successively from the side closer to the back surface of the n-type GaN substrate 1. The n-side electrode 13 is an example of the "back electrode" in the present invention.

According to the first embodiment, as hereinabove described, the insulator films 12 are formed on the regions 8 having concentrated dislocations on the back surface of the n-type GaN substrate 1 and the n-side electrode 13 is formed to be in contact with the region of the back surface of the n-type GaN substrate 1 other than the regions 8 having concentrated dislocations so that the insulator films 12 cover the regions 8 having concentrated dislocations not to expose the same on the back surface of the n-type GaN substrate 1, whereby it is possible to easily suppress development of leakage current resulting from current flowing to the regions 8 having concentrated dislocations on the back surface of the n-type GaN substrate 1. Consequently, optical output can be easily stabilized when the device is subjected to constant current driving, whereby operations of the semiconductor device can be easily stabilized. Further, the quantity of current flowing to the regions 8 having concentrated dislocations can be so reduced that it is possible to reduce unnecessary emission from the regions 8 having concentrated dislocations.

Fabrication processes for the nitride-based semiconductor laser device according to the first embodiment are now described with reference to FIGS. 1 to 12.

Figure 3:
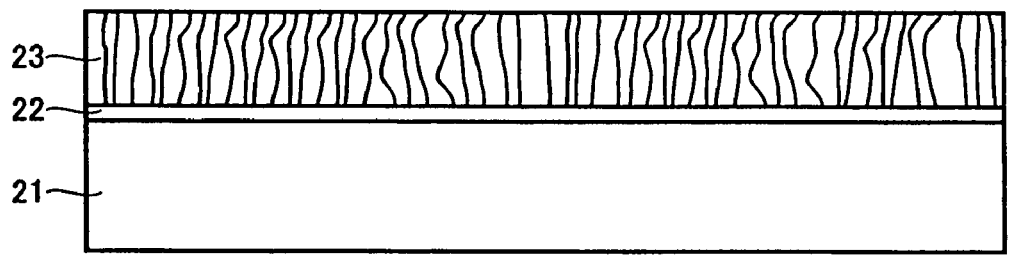
FIGS. 3 to 12 are sectional views for illustrating fabrication processes for the nitride-based semiconductor laser device according to the first embodiment shown in FIG. 1.

First, formation processes for the n-type GaN substrate 1 are described with reference to FIGS. 3 to 6. More specifically, an AlGaN layer 22 having a thickness of about 20 nm is grown on a sapphire substrate 21 by MOCVD (metal organic chemical vapor deposition) while holding the substrate temperature at about 600° C., as shown in FIG. 3. Thereafter the substrate temperature is increased to about 1100° C., for growing a GaN layer 23 having a thickness of about 1 µm on the AlGaN layer 22. At this time, longitudinally propagated dislocations are formed on the overall region of the GaN layer 23 with a density of at least about $5 \times 10^8$ cm$^{-2}$ (about $5 \times 10^9$ cm$^{-2}$, for example).

Figure 4:
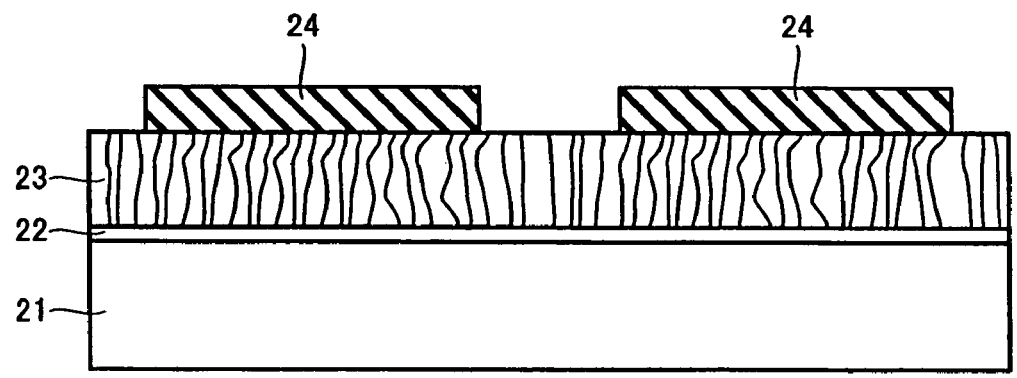

As shown in FIG. 4, mask layers 24 of SiN or $SiO_2$ having a thickness of about 390 µm and a thickness of about 200 nm are formed on the GaN layer 23 by plasma CVD at an interval of about 10 µm with a period of about 400 µm in a striped (elongated) shape.

Figure 5:
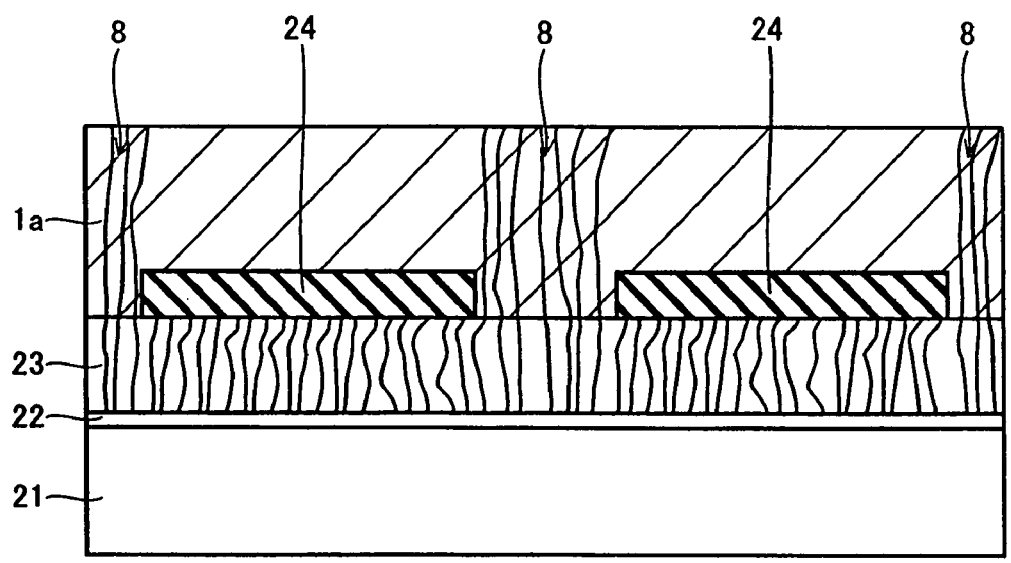
Figure 6:
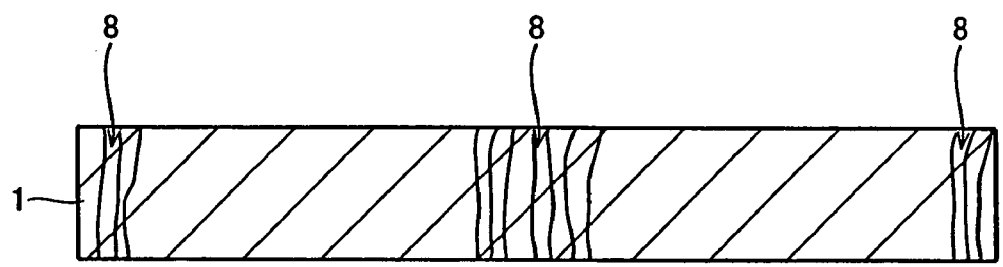

As shown in FIG. 5, the mask layers 24 are employed as selective growth masks for laterally growing an n-type GaN layer 1a of about 150 µm in thickness doped with oxygen having a carrier concentration of about $5 \times 10^{18}$ cm$^{-3}$ on the GaN layer 23 by HVPE (halide vapor phase epitaxy) while holding the substrate temperature at about 1100° C. At this time, the n-type GaN layer 1a is selectively longitudinally grown on portions of the GaN layer 23 formed with no mask layers 24 and thereafter gradually grown in the lateral direction. Therefore, the regions 8 having concentrated dislocations propagated in the longitudinal direction with a density of at least about $5 \times 10^8$ cm$^{-2}$ (about $5 \times 10^9$ cm$^{-2}$, for example) are formed on the portions of the n-type GaN layer 1a located on the portions of the GaN layer 23 formed with no mask layers 24 in a striped (elongated) shape with the width of about 10 µm. On the other hand, dislocations are laterally bent on the remaining portions of the n-type GaN layer 1a located on the mask layers 24 due to the lateral growth of the n-type GaN layer 1a so that longitudinally propagated dislocations are hardly formed and the dislocation density is not more than about $5 \times 10^7$ cm$^{-2}$ (about $1 \times 10^6$ cm$^{-2}$, for example). Thereafter regions (the sapphire substrate etc.) including the mask layers 24 located under the n-type GaN layer 1a are removed. Thus, the n-type GaN substrate 1 doped with oxygen having the carrier concentration of about $5 \times 10^{18}$ cm$^{-3}$ is formed as shown in FIG. 6.

Figure 7:
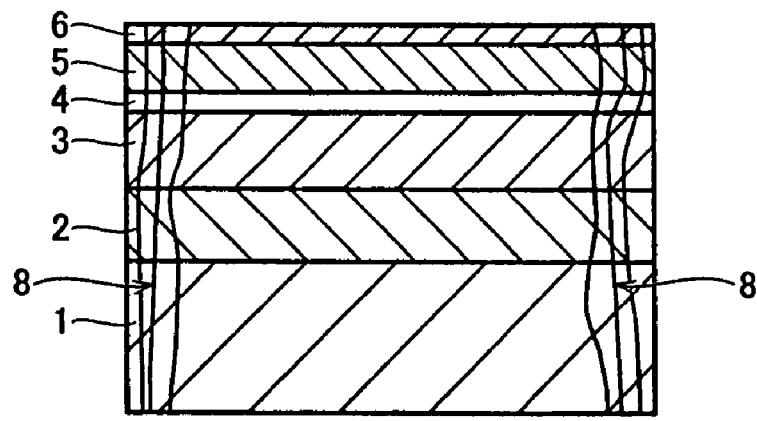
Figure 8:
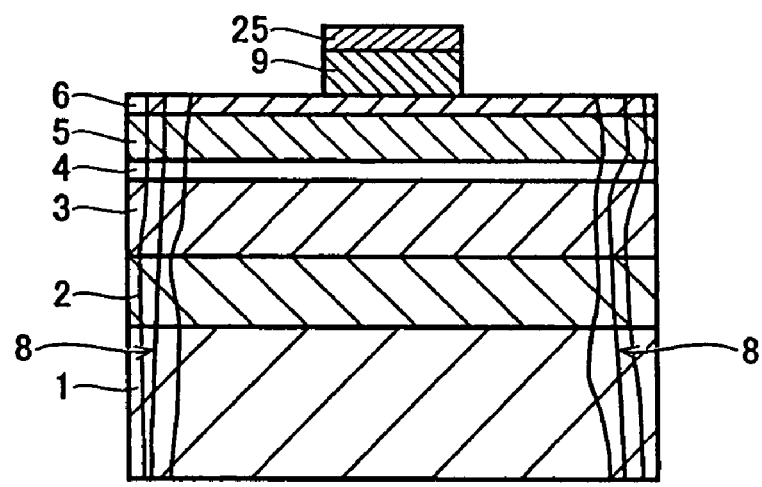

Then, the n-type layer 2, the n-type cladding layer 3, the emission layer 4, the p-type cladding layer 5 and the p-type contact layer 6 are successively formed on the n-type GaN substrate 1 by MOCVD, as shown in FIG. 7.

More specifically, the n-type layer 2 having the thickness of about 100 nm and consisting of n-type GaN doped with Si having the atomic density of about $5 \times 10^{18}$ cm$^{-3}$ is formed on the n-type GaN substrate 1 with carrier gas consisting of $H_2$ and $N_2$, material gas consisting of $NH_3$ and TMGa and dopant gas consisting of $SiH_4$ while holding the substrate temperature at the growth temperature of about 1100° C. Thereafter TMAl is further added to the material gas for growing the n-type cladding layer 3 having the thickness of about 400 nm and consisting of n-type $Al_{0.05}Ga_{0.95}N$ doped with Si having the atomic density of about $5 \times 10^{18}$ cm$^{-3}$ and the carrier concentration of about $5 \times 10^{18}$ cm$^{-3}$ on the n-type layer 2.

Figure 2:
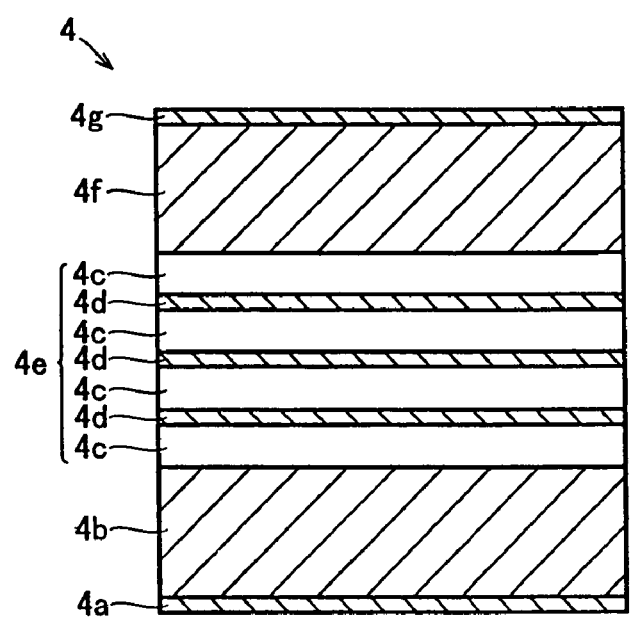
FIG. 2 is an enlarged sectional view detailedly showing an emission layer of the nitride-based semiconductor laser device according to the first embodiment shown in FIG. 1.

Then, the carrier blocking layer 4a having the thickness of about 5 nm and consisting of n-type $Al_{0.1}Ga_{0.9}N$ doped with Si having the atomic density of about $5 \times 10^{18}$ cm$^{-3}$ and the carrier concentration of about $5 \times 10^{18}$ cm$^{-3}$ is grown on the n-type cladding layer 3 (see FIG. 7), as shown in FIG. 2.

Then, the n-type light guide layer 4b consisting of n-type GaN doped with Si having the atomic density of about $5 \times 10^{18}$ cm$^{-3}$ and the carrier concentration of about $5 \times 10^{18}$ cm$^{-3}$ is grown on the n-type carrier blocking layer 4a with carrier gas consisting of $H_2$ and $N_2$, material gas consisting of $NH_3$ and TMGa and dopant gas consisting of $SiH_4$ while holding the substrate temperature at the growth temperature of about 800° C.

Thereafter TMIn is further added to the material gas for alternately growing the four barrier layers 4c of undoped $In_{0.05}Ga_{0.95}N$ each having the thickness of about 20 nm and the three well layers 4d of undoped $In_{0.15}Ga_{0.85}N$ each having the thickness of about 3 nm on the n-type light guide layer 4b with no dopant gas, thereby forming the MQW active layer 4e.

The material gas is changed to that consisting of $NH_3$ and TMGa and dopant gas consisting of $Cp_2Mg$ is employed for growing the p-type light guide layer 4f having the thickness of about 100 nm and consisting of p-type GaN doped with Mg having the atomic density of about $4 \times 10^{19}$ cm$^{-3}$ and the carrier concentration of about $5 \times 10^{17}$ cm$^{-3}$ on the MQW active layer 4e. Thereafter TMAl is further added to the material gas for growing the p-type cap layer 4g having the thickness of about 20 nm and consisting of p-type Al$_{0.1}$Ga$_{0.9}$N doped with Mg having the atomic density of about $4 \times 10^{19}$ cm$^{-3}$ and the carrier concentration of about $5 \times 10^{17}$ cm$^{-3}$ on the p-type light guide layer 4f. Thus, the emission layer 4 consisting of the n-type carrier blocking layer 4a, the n-type light guide layer 4b, the MQW active layer 4e, the p-type light guide layer 4f and the p-type cap layer 4g is formed.

As shown in FIG. 7, the p-type cladding layer 5 having the thickness of about 400 nm and consisting of p-type Al$_{0.05}$Ga$_{0.95}$N doped with Mg having the atomic density of about $4 \times 10^{19}$ cm$^{-3}$ and the carrier concentration of about $5 \times 10^{17}$ cm$^{-3}$ is formed on the emission layer 4 with carrier gas consisting of H$_2$ and N$_2$, material gas consisting of NH$_3$, TMGa and TMAl and dopant gas consisting of Cp$_2$Mg while holding the substrate temperature at the growth temperature of about 1100° C. Thereafter the material gas is changed to that consisting of NH$_3$ and TMGa for growing the p-type contact layer 6 having the thickness of about 10 nm and consisting of p-type GaN doped with Mg having the atomic density of about $4 \times 10^{19}$ cm$^{-3}$ and the carrier concentration of about $5 \times 10^{17}$ cm$^{-3}$ on the p-type cladding layer 5.

At this time, dislocations of the n-type GaN substrate 1 are propagated to form the regions 8 having concentrated dislocations extending from the back surface of the n-type GaN substrate 1 to the upper surface of the p-type contact layer 6.

Thereafter annealing is performed in a nitrogen gas atmosphere under a temperature condition of about 800° C.

Then, the p-side ohmic electrode 9 consisting of the Pt layer having the thickness of about 5 nm, the Pd layer having the thickness of about 100 nm and the Au layer having the thickness of about 150 nm in ascending order is formed on the prescribed region of the p-type contact layer 6 by vacuum evaporation and an Ni layer 25 having a thickness of about 250 nm is thereafter formed on the p-side ohmic electrode 9 by vacuum evaporation. At this time, the p-side ohmic electrode 9 and the Ni layer 25 are formed in a striped (elongated) shape with a width of about 1.5 μm.

Figure 9:
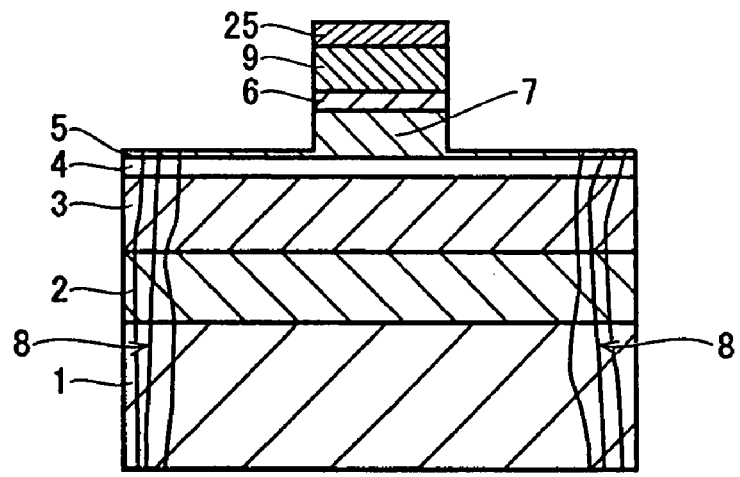

As shown in FIG. 9, the Ni layer 25 is employed as a mask for partially dry-etching the p-type contact layer 6 and the p-type cladding layer 5 by thicknesses of about 300 nm from the upper surfaces thereof respectively with Cl$_2$-based gas. Thus, the striped (elongated) ridge portion 7 constituting of the projecting portion of the p-type cladding layer 5 and the p-type contact layer 6 is formed to extend in the prescribed direction. Thereafter the Ni layer 25 is removed.

Figure 10:
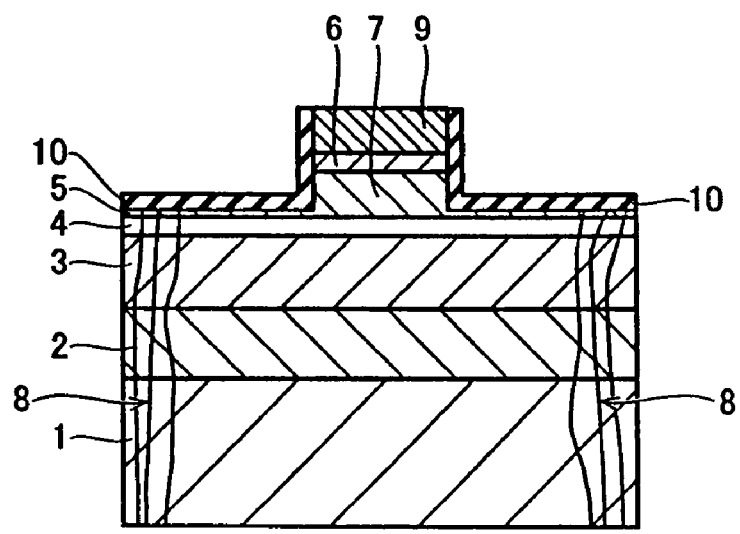

Then, an SiN film (not shown) having a thickness of about 250 nm is formed to cover the overall surface by plasma CVD and a portion of this SiN film located on the upper surface of the p-side ohmic electrode 9 is removed thereby forming the insulator films 10 consisting of SiN having the thickness of about 250 nm, as shown in FIG. 10.

Figure 11:
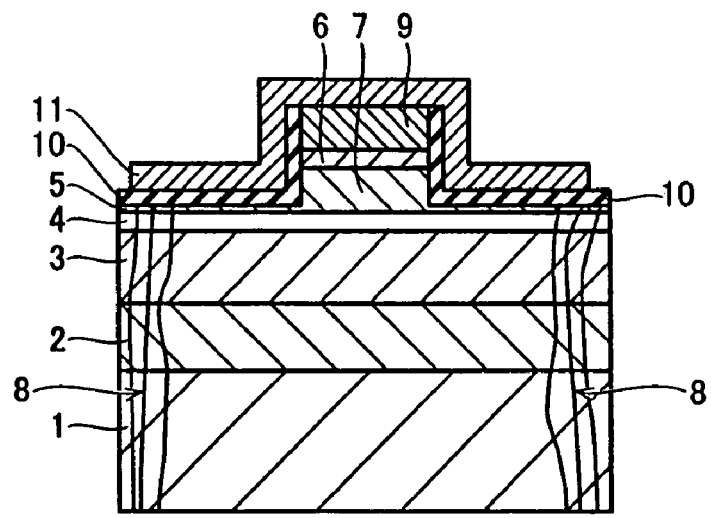

Then, the p-side pad electrode 11 consisting of the Ti layer having the thickness of about 100 nm, the Pd layer having the thickness of about 100 nm and the Au layer having the thickness of about 3 μm in ascending order is formed on the front surfaces of the insulator films 10 by vacuum evaporation to be in contact with the upper surface of the p-side ohmic electrode 9, as shown in FIG. 11. Thereafter the back surface of the n-type GaN substrate 1 is polished so that the thickness thereof is about 100 μm.

Figure 12:
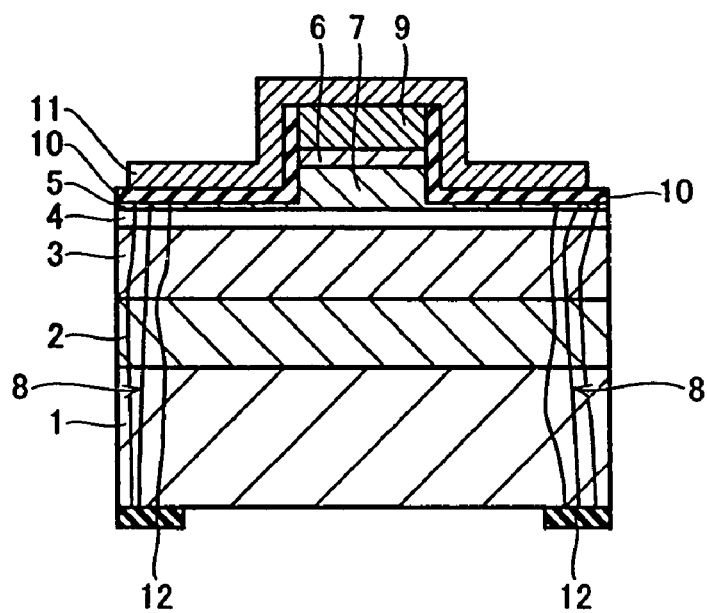

According to the first embodiment, an SiO$_2$ film (not shown) having a thickness of about 250 nm is formed on the overall back surface of the n-type GaN substrate 1 by plasma CVD, an SOG (spin-on-glass) method (application) or electron beam evaporation. Thereafter a portion of the SiO$_2$ film located on the region of the back surface of the n-type GaN substrate 1 other than the regions 8 having concentrated dislocations is removed, thereby forming the insulator films 12 of SiO$_2$ having the thickness of about 250 nm and the width of about 40 μm, as shown in FIG. 12. Thus, the insulator films 12 cover the regions 8 having concentrated dislocations on the back surface of the n-type GaN substrate 1.

Thereafter the n-side electrode 13 is formed on the back surface of the n-type GaN substrate 1 by vacuum evaporation to be in contact with the region of the back surface of the n-type GaN substrate 1 other than the regions 8 having concentrated dislocations while covering the insulator films 12, as shown in FIG. 1. More specifically, the Al layer having the thickness of about 10 nm, the Pt layer having the thickness of about 20 nm and the Au layer having the thickness of about 300 nm are successively formed from the side closer to the back surface of the n-type GaN substrate 1, thereby forming the n-side electrode 13. Finally, scribing lines (not shown) are formed on the side of the device provided with the p-side pad electrode 11 and the device is cleaved into each chip along the scribing lines, thereby forming the nitride-based semiconductor laser device according to the first embodiment.

Second Embodiment

Figure 13:
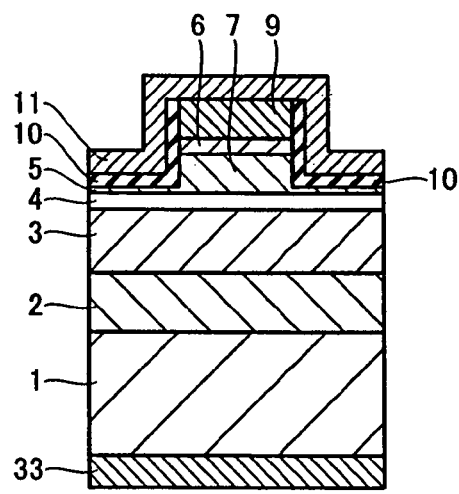
FIG. 13 is a sectional view showing the structure of a nitride-based semiconductor laser device (semiconductor device) according to a second embodiment of the present invention.

Referring to FIG. 13, prescribed regions of ends of an n-type GaN substrate 1 and nitride-based semiconductor layers 2 to 5 are removed in a nitride-based semiconductor laser device according to a second embodiment of the present invention dissimilarly to the aforementioned first embodiment. Therefore, the nitride-based semiconductor laser device is provided with no regions 8 having concentrated dislocations dissimilarly to the first embodiment shown in FIG. 1. An n-side electrode 33 consisting of an Al layer having a thickness of about 10 nm, a Pt layer having a thickness of about 20 nm and an Au layer having a thickness of about 300 nm successively from the side closer to the back surface of the n-type GaN substrate 1 is formed on the back surface of the n-type GaN substrate 1 to be in contact with the overall back surface of the n-type GaN substrate 1. The n-side electrode 33 is an example of the "back electrode" in the present invention. The remaining structure of the second embodiment is similar to that of the aforementioned first embodiment.

Figure 14:
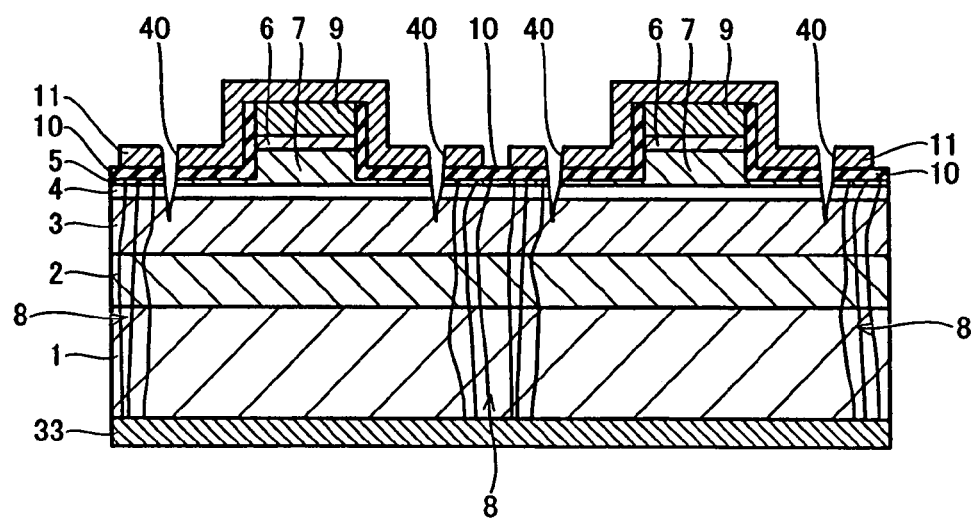
FIGS. 14 and 15 are sectional views for illustrating fabrication processes for the nitride-based semiconductor laser device according to the second embodiment shown in FIG. 13.
Figure 15:
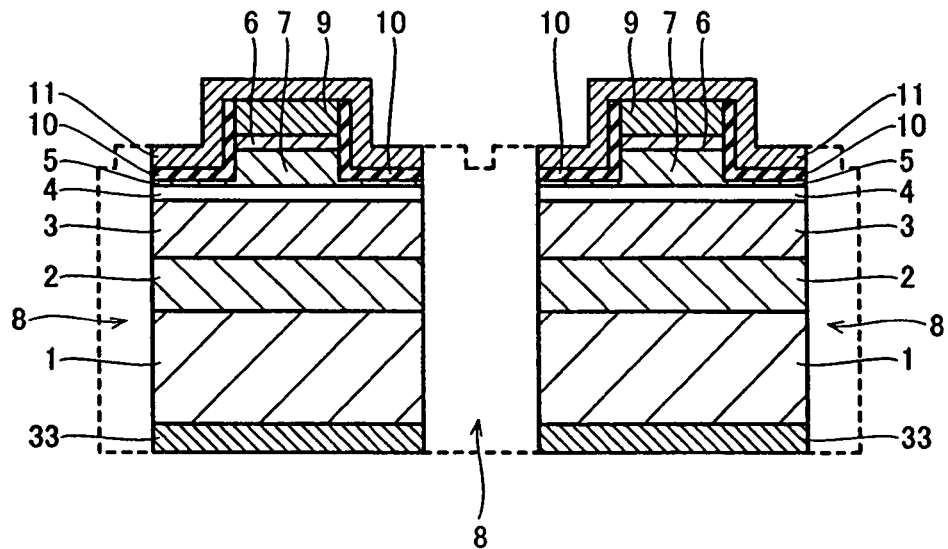

Fabrication processes for the nitride-based semiconductor laser device according to the second embodiment are described with reference to FIGS. 13 to 15.

First, layers and films up to a p-side pad electrode 11 are formed through fabrication processes similar to those of the first embodiment shown in FIGS. 3 to 11, and the back surface of the n-type GaN substrate 1 is thereafter polished. Then, the n-side electrode 33 having a thickness and a composition similar to those of the n-side electrode 13 in the aforementioned first embodiment is formed on the back surface of the n-type GaN substrate 1 to be in contact with the overall back surface of the n-type GaN substrate 1, thereby obtaining a structure shown in FIG. 14.

According to the second embodiment, scribing lines 40 are finally formed on the device from the side provided with the p-side pad electrode 11 to hold regions 8 having concentrated dislocations therebetween. More specifically, the scribing lines 40 are formed on positions of about 10 μm from center lines (not shown) between adjacent lines. Thereafter the device is cleaved into each chip along the scribing lines 40 (see FIG. 14) for removing the regions 8 having concentrated dislocations extending from the back surface of the n-type GaN substrate 1 to the front surfaces of flat portions of a p-type cladding layer 5 other than a projecting portion with the same width, as shown in FIG. 15. Thus, the nitride-based semiconductor laser device according to the second embodiment is formed as shown in FIG. 13.

In the fabrication processes according to the second embodiment, as hereinabove described, the device is cleaved into each chip for removing the regions 8 having concentrated dislocations extending from the back surface of the n-type GaN substrate 1 to the front surfaces of the flat portions of the p-type cladding layer 5 other than the projecting portion with the same width, whereby it is possible to easily suppress development of leakage current resulting from current flowing to the regions 8 having concentrated dislocations. Consequently, optical output can be easily stabilized when the device is subjected to constant current driving, whereby a stably operating nitride-based semiconductor laser device can be easily fabricated.

Further, it is possible to easily inhibit the regions 8 having concentrated dislocations from absorbing light emitted from an emission layer 4. Thus, light absorbed by the regions 8 having concentrated dislocations can be inhibited from reemission at an unintended wavelength, whereby deterioration of color purity resulting from such reemission can be suppressed.

Third Embodiment

Figure 16:
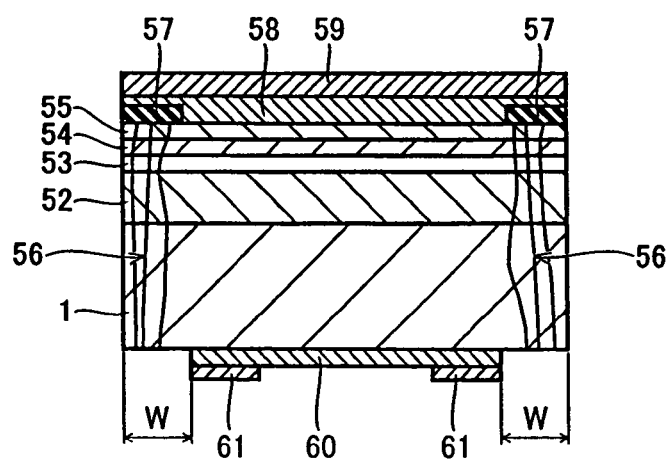
FIG. 16 is a sectional view showing the structure of a light-emitting diode device (semiconductor device) according to a third embodiment of the present invention.
Figure 17:
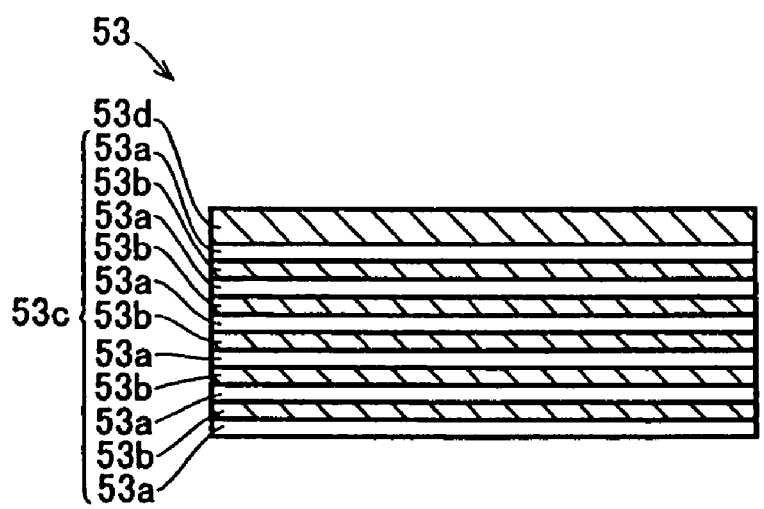
FIGS. 17 to 21 are sectional view for illustrating fabrication processes for the light-emitting diode device according to the third embodiment shown in FIG. 16.

Referring to FIGS. 16 and 17, a third embodiment of the present invention is applied to a light-emitting diode device, dissimilarly to the aforementioned first embodiment.

According to the third embodiment, an n-type cladding layer 52 having a thickness of about 5 μm and consisting of n-type GaN doped with Si is formed on an n-type GaN substrate 1, as shown in FIG. 16. The n-type cladding layer 52 is an example of the "semiconductor element layer" in the present invention.

An emission layer 53 is formed on the n-type cladding layer 52. As shown in FIG. 17, this emission layer 53 is constituted of an MQW active layer 53c formed by alternately stacking six barrier layers 53a of undoped GaN each having a thickness of about 5 nm and five well layers 53b of undoped $In_{0.35}Ga_{0.65}N$ each having a thickness of about 5 nm and a protective layer 53d of undoped GaN having a thickness of about 10 nm. The emission layer 53 is an example of the "semiconductor element layer" in the present invention.

As shown in FIG. 16, a p-type cladding layer 54 having a thickness of about 0.15 μm and consisting of p-type $Al_{0.05}Ga_{0.95}N$ doped with Mg is formed on the emission layer 53. A p-type contact layer 55 having a thickness of about 0.3 μm and consisting of p-type GaN doped with Mg is formed on the p-type cladding layer 54. The p-type cladding layer 54 and the p-type contact layer 55 are examples of the "semiconductor element layer" in the present invention.

Regions 56 having concentrated dislocations, extending from the back surface of the n-type GaN substrate 1 to the upper surface of the p-type contact layer 55, are formed in the vicinity of ends of the n-type GaN substrate 1 and the nitride-based semiconductor layers 52 to 55.

In the light-emitting diode device according to the third embodiment, insulator films 57 of $SiO_2$ having a thickness of about 250 nm and a width of about 40 μm are formed on the regions 56 having concentrated dislocations on the p-type contact layer 55. A p-side ohmic electrode 58 is formed on the p-type contact layer 55 to be in contact with a region of the upper surface of the p-type contact layer 55 other than the regions 56 having concentrated dislocations while covering the insulator films 57. This p-side ohmic electrode 58 consists of a Pt layer having a thickness of about 5 nm, a Pd layer having a thickness of about 100 nm and an Au layer having a thickness of about 5 nm in ascending order. The p-side ohmic electrode 58 is an example of the "front electrode" in the present invention. A p-side pad electrode 59 consisting of a Ti layer having a thickness of about 100 nm, a Pd layer having a thickness of about 100 nm and an Au layer having a thickness of about 3 μm in ascending order is formed on the p-side ohmic electrode 58.

According to the third embodiment, an n-side ohmic transparent electrode 60 is formed on the back surface of the n-type GaN substrate 1 to be in contact with a region of the back surface of the n-type GaN substrate 1 other than the regions 56 having concentrated dislocations. This n-side ohmic transparent electrode 60 consists of an Al layer having a thickness of about 5 nm, a Pt layer having a thickness of about 15 nm and an Au layer having a thickness of about 40 nm successively from the side closer to the back surface of the n-type GaN substrate 1. The distance W between each end surface of the n-side ohmic transparent electrode 60 and each end surface of the device is about 40 μm. The n-side transparent electrode 60 is an example of the "back electrode" in the present invention. N-side pad electrodes 61 consisting of Ti layers having a thickness of about 100 nm, Pd layers having a thickness of about 100 nm and Au layers having a thickness of about 3 μm successively from the side closer to the back surface of the n-side ohmic transparent electrode 60 are formed on prescribed regions of the back surface of the n-side ohmic transparent electrode 60.

According to the third embodiment, as hereinabove described, the insulator films 57 are formed on the regions 56 having concentrated dislocations on the p-type contact layer 55 while the p-side ohmic electrode 58 is formed to be in contact with the region of the upper surface of the p-type contact layer 55 other than the regions 56 having concentrated dislocations so that the insulator films 57 cover the regions 56 having concentrated dislocations not to expose the same on the upper surface of the p-type contact layer 55, whereby it is possible to suppress development of leakage current resulting from current flowing to the regions 56 having concentrated dislocations on the upper surface of the p-type contact layer 55. Further, the n-side ohmic transparent electrode 60 is formed on the back surface of the n-type GaN substrate 1 to be in contact with the region of the back surface of the n-type GaN substrate 1 other than the regions 56 having concentrated dislocations, whereby it is also possible to suppress development of leakage current resulting from current flowing to the regions 56 having concentrated dislocations on the back surface of the n-type GaN substrate 1. Consequently, optical output can be easily stabilized when the device is subjected to constant current driving, whereby operations of the semiconductor device can be easily stabilized. Further, the quantity of current flowing to the regions 56 having concentrated dislocations can be so reduced that it is possible to reduce unnecessary emission from the regions 56 having concentrated dislocations.

According to the third embodiment, further, the distance W between the sides of the n-side ohmic transparent electrode 60 and the device is set to about 40 μm so that solder can be inhibited from flowing toward the sides of the device when the solder is welded to the n-side pad electrodes 61 formed on the n-side ohmic transparent electrode 60. Thus, the device can be inhibited from a defective short.

Fabrication processes for the light-emitting diode device according to the third embodiment are described with reference to FIGS. 16 to 21.

Figure 18:
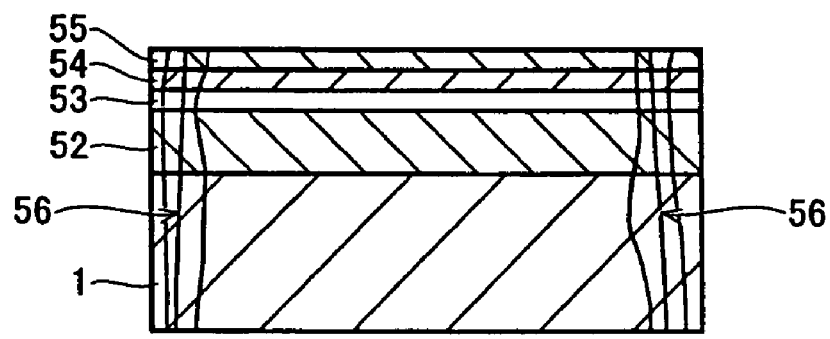

First, the n-type cladding layer 52, the emission layer 53, the p-type cladding layer 54 and the p-type contact layer 55 are successively grown on the n-type GaN substrate 1 by MOCVD, as shown in FIG. 18.

More specifically, the n-type cladding layer 52 having the thickness of about 5 µm and consisting of n-type GaN doped with Si is grown on the n-type GaN substrate 1 with carrier gas consisting of $H_2$ and $N_2$ ($H_2$ content: about 50%), material gas consisting of $NH_3$ and TMGa and dopant gas consisting of $SiH_4$ at a growth rate of about 3 µm/h while holding the substrate temperature at a growth temperature of about 1000° C. to about 1200° C. (about 1150° C., for example).

Then, the six barrier layers 53*a* of undoped GaN each having the thickness of about 5 nm and the five well layers 53*b* of undoped $In_{0.35}Ga_{0.65}N$ each having the thickness of about 5 nm are alternately grown on the n-type cladding layer 52 (see FIG. 18) with carrier gas consisting of $H_2$ and $N_2$ ($H_2$ content: about 1% to about 5%) and material gas consisting of $NH_3$, TEGa and TMIn at a growth rate of about 0.4 nm/s. while holding the substrate temperature at a growth temperature of about 700° C. to about 1000° C. (about 850° C., for example) thereby forming the MQW active layer 53*c*, as shown in FIG. 17. Then, the protective layer 53 of undoped GaN having the thickness of about 10 nm is grown at a growth rate of about 0.4 nm/s. Thus, the emission layer 53 consisting of the MQW active layer 53*c* and the protective layer 53*d* is formed.

As shown in FIG. 18, the p-type cladding layer 54 having the thickness of about 0.15 µm and consisting of p-type $Al_{0.05}Ga_{0.95}N$ doped with Mg is grown on the emission layer 53 with carrier gas consisting of $H_2$ and $N_2$ ($H_2$ content: about 1% to about 3%), material gas consisting of $NH_3$, TMGa and TMAl and dopant gas consisting of $Cp_2Mg$ at a growth rate of about 3 µm/h. while holding the substrate temperature at a growth temperature of about 1000° C. to about 1200° C. (about 1150° C., for example). Then, the material gas is changed to that consisting of $NH_3$ and TMGa for growing the p-type contact layer 55 having the thickness of about 0.3 µm and consisting of p-type GaN doped with Mg on the p-type cladding layer 54 at a growth rate of about 3 µm/h.

At this time, dislocations of the n-type GaN substrate 1 are propagated to form the regions 56 having concentrated dislocations extending from the back surface of the n-type GaN substrate 1 to the upper surface of the p-type contact layer 55. The $H_2$ content of the carrier gas consisting of $H_2$ and $N_2$ is so reduced that the Mg dopant can be activated without performing annealing in a nitrogen gas atmosphere.

Figure 19:
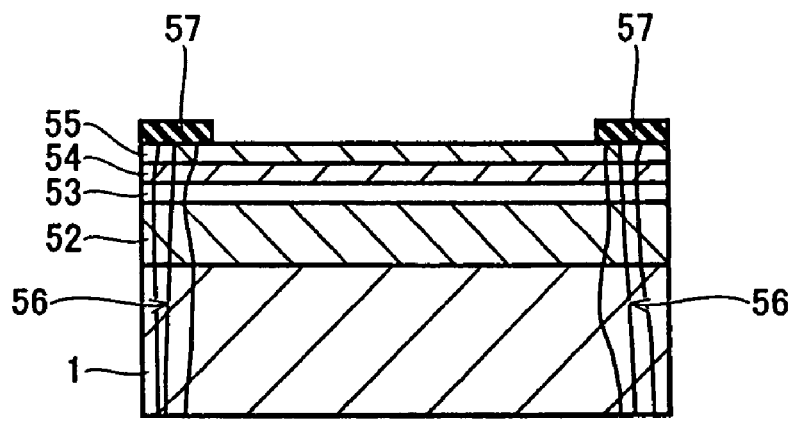

According to the third embodiment, an $SiO_2$ film (not shown) having a thickness of about 250 nm is formed on the overall upper surface of the p-type contact layer 55 by plasma CVD, an SOG method (application) or electron beam evaporation. Thereafter a portion of the $SiO_2$ film located on a region of the p-type contact layer 55 other than the regions 56 having concentrated dislocations is removed thereby forming the insulator films 57 having the thickness of about 250 nm and the width of about 40 µm, as shown in FIG. 19. Thus, the insulator films 57 cover the regions 56 having concentrated dislocations on the upper surface of the p-type contact layer 55.

Figure 20:
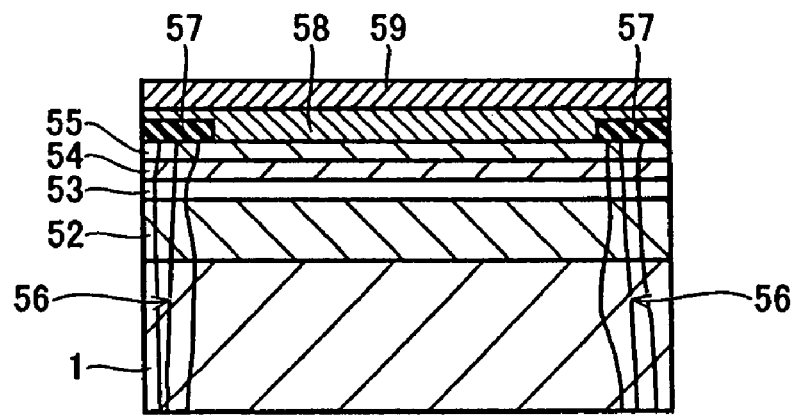

As shown in FIG. 20, the p-side ohmic electrode 58 is formed on the p-type contact layer 55 by vacuum evaporation to be in contact with the region of the upper surface of the p-type contact layer 55 other than the regions 56 having concentrated dislocations while covering the insulator films 57. More specifically, the Pt layer having the thickness of about 5 nm, the Pd layer having the thickness of about 100 nm and the Au layer having the thickness of about 150 nm are formed in ascending order, thereby forming the p-side ohmic electrode 58. Then, the p-side pad electrode 59 consisting of the Ti layer having the thickness of about 100 nm, the Pd layer having the thickness of about 100 nm and the Au layer having the thickness of about 3 µm in ascending order is formed on the p-side ohmic electrode 58 by vacuum evaporation. Thereafter the back surface of the n-type GaN substrate 1 is polished so that the thickness of the n-type GaN substrate 1 is about 100 µm.

Figure 21:
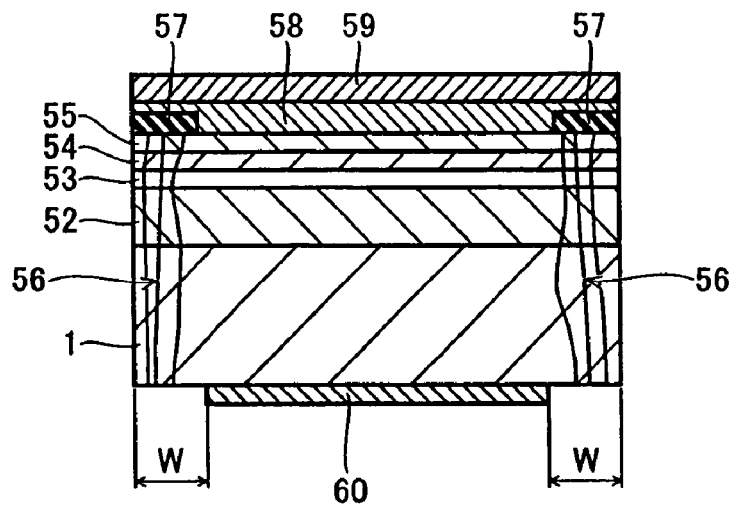

According to the third embodiment, a metal layer (not shown) consisting of an Al layer having a thickness of about 5 nm, a Pt layer having a thickness of about 15 nm and an Au layer having a thickness of about 40 nm successively from the side closer to the back surface of the n-type GaN substrate 1 is formed on the overall back surface of the n-type GaN substrate 1 by vacuum evaporation. Thereafter a portion of the metal layer located on a region of the back surface of the n-type GaN substrate 1 other than the regions 56 having concentrated dislocations is removed thereby forming the n-side ohmic transparent electrode 60, as shown in FIG. 21. At this time, the portion of the metal layer is so removed that the distance W between the sides of the n-side ohmic transparent electrode 60 and the device is about 40 µm.

Thereafter the n-side pad electrodes 61 consisting of the Ti layers having the thickness of about 100 nm, the Pd layers having the thickness of about 100 nm and the Au layers having the thickness of about 3 µm successively from the side closer to the back surface of the n-side ohmic transparent electrode 60 are formed on the prescribed regions of the back surface of the n-side ohmic transparent electrode 60 by vacuum evaporation, as shown in FIG. 16. Finally, scribing lines (not shown) are formed from the side of the device provided with the p-side pad electrode 59 and the device is cleaved into each chip along the scribing lines, thereby forming the light-emitting diode device according to the third embodiment.

Fourth Embodiment

Figure 22:
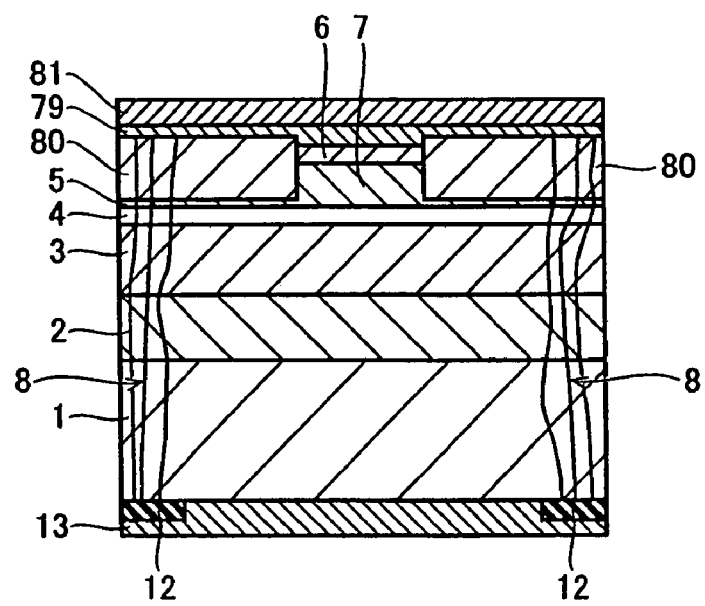
FIG. 22 is a sectional view showing the structure of a nitride-based semiconductor laser device (semiconductor device) according to a fourth embodiment of the present invention.

Referring to FIG. 22, n-type current blocking layers 80 having a thickness of about 0.4 µm and consisting of n-type $Al_{0.12}Ga_{0.88}N$ doped with Ge are formed on the front surfaces of flat portions of a p-type cladding layer 5 other than a projecting portion in a nitride-based semiconductor laser device according to a fourth embodiment of the present invention, dissimilarly to the aforementioned first embodiment.

According to the fourth embodiment, regions 8 having concentrated dislocations extending from the back surface of an n-type GaN substrate 1 to the upper surfaces of the n-type current blocking layers 80 are formed in the vicinity of ends of the n-type GaN substrate 1 and nitride-based semiconductor layers 2 to 5 and 80. A p-side ohmic electrode 79 consisting of a Pt layer having a thickness of about 5 nm, a Pd layer having a thickness of about 100 nm and an Au layer having a thickness of about 150 nm in ascending order is formed on the n-type current blocking layers 80 to be in contact with the upper surface of a p-type contact layer 6 constituting a ridge portion 7. A p-side pad electrode 81 consisting of a Ti layer having a thickness of about 100 nm, a Pd layer having a thickness of about 100 nm and an Au layer having a thickness of about 3 µm in ascending order is formed on the p-side ohmic electrode 79. The n-type current blocking layers 80 are examples of the "semiconductor element layer" in the present invention, and the p-side ohmic electrode 79 is an example of the "front electrode" in the present invention.

According to the fourth embodiment, insulator films 12 of SiN having a thickness of about 250 nm and a width of about 40 μm are formed to cover the regions 8 having concentrated dislocations on the back surface of the n-type GaN substrate 1, similarly to the aforementioned first embodiment. An n-side electrode 13 is formed on the back surface of the n-type GaN substrate 1 to be in contact with the region of the back surface of the n-type GaN substrate 1 other than the regions 8 having concentrated dislocations while covering the insulator films 12.

The remaining structure of the fourth embodiment is similar to that of the aforementioned first embodiment.

According to the fourth embodiment, effects similar to those of the aforementioned embodiment can be attained also in the nitride-based semiconductor laser device formed with the n-type current blocking layers 80 consisting of n-type $Al_{0.12}Ga_{0.88}N$ as current blocking layers, as hereinabove described. In other words, the insulator films 12 are formed on the regions 8 having concentrated dislocations on the back surface of the n-type GaN substrate 1 while the n-side electrode 13 is formed to be in contact with the region of the back surface of the n-type GaN substrate 1 other than the regions 8 having concentrated dislocations so that the insulator films 12 cover the regions 8 having concentrated dislocations not to expose the same on the back surface of the n-type GaN substrate 1, whereby it is possible to easily suppress development of leakage current resulting from current flowing to the regions 8 having concentrated dislocations on the back surface of the n-type GaN substrate 1. Consequently, optical output can be easily stabilized when the device is subjected to constant current driving, whereby operations of the semiconductor device can be easily stabilized. In the fourth embodiment, however, the regions 8 having concentrated dislocations are in contact with the p-side ohmic electrode 79 on the upper surfaces of the n-type current blocking layers 80, and hence leakage current is more easily developed as compared with the aforementioned first embodiment.

Fabrication processes for the nitride-based semiconductor laser device according to the fourth embodiment are now described with reference to FIGS. 22 to 26.

Figure 23:
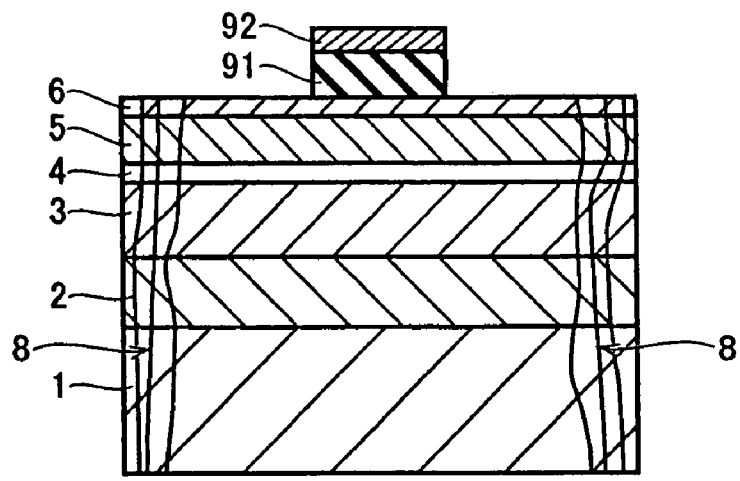
FIGS. 23 to 26 are sectional views for illustrating fabrication processes for the nitride-based semiconductor laser device according to the fourth embodiment shown in FIG. 22.

First, layers up to a p-type contact layer 6 are formed through fabrication processes similar to those of the first embodiment shown in FIGS. 3 to 7, and annealing is thereafter performed in a nitrogen gas atmosphere. Then, an SiN layer 91 having a thickness of about 200 nm is formed on a prescribed region of the p-type contact layer 6 by plasma CVD, and an Ni layer 92 having a thickness of about 250 nm is thereafter formed on the SiN layer 91, as shown in FIG. 23. At this time, the SiN layer 91 and the Ni layer 92 are formed in a striped (elongated) shape with widths of about 1.5 μm.

Figure 24:
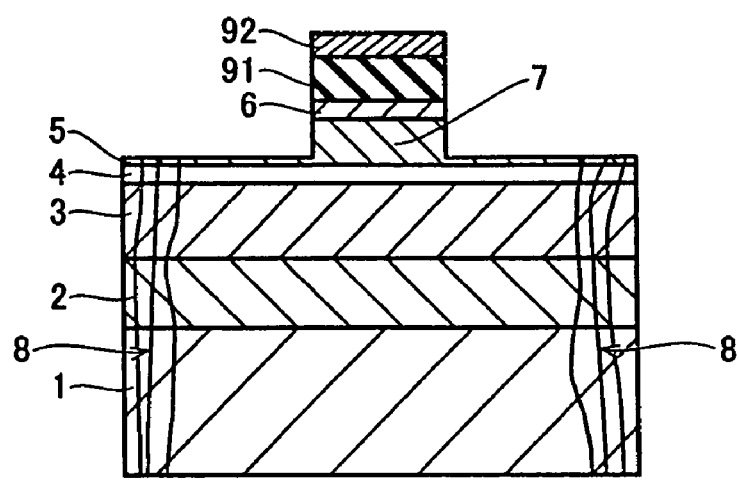

Then, the Ni layer 92 is employed as a mask for dry-etching portions of the p-type contact layer 6 and the p-type cladding layer 5 by thicknesses of about 300 nm from the upper surfaces thereof with $Cl_2$-based gas, as shown in FIG. 24. Thus, a striped (elongated) ridge portion 7 constituted of the projecting portion of the p-type cladding layer 5 and the p-type contact layer 6 is formed to extend in a prescribed direction. Thereafter the Ni layer 92 is removed.

Figure 25:
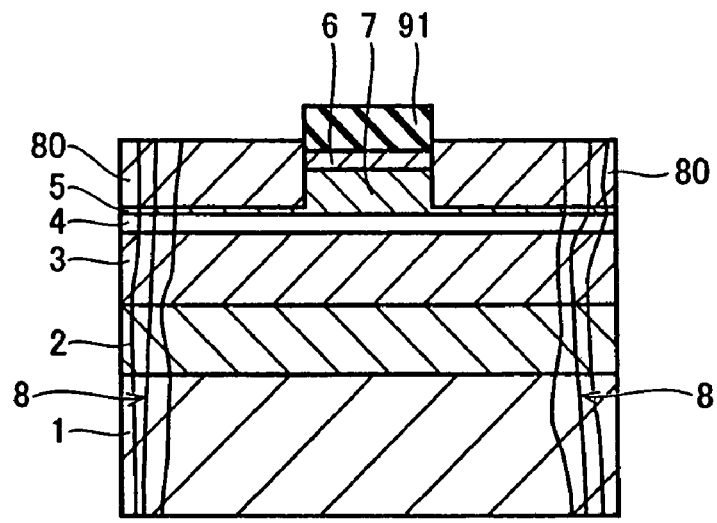

As shown in FIG. 25, the n-type current blocking layers 80 having the thickness of about 0.4 μm and consisting of n-type $Al_{0.12}Ga_{0.88}N$ doped with Ge are formed on the front surfaces of the flat portions of the p-type cladding layer 5 other than the projecting portion by MOCVD through the SiN layer 91 serving as a selective growth mask. At this time, dislocations on the front surfaces of the flat portions of the p-type cladding layer 5 other than the projecting portion are propagated to form the regions 8 having concentrated dislocations extending from the back surface of the n-type GaN substrate 1 to the upper surfaces of the n-type current blocking layers 80. Thereafter the SiN layer 91 is removed.

Figure 26:
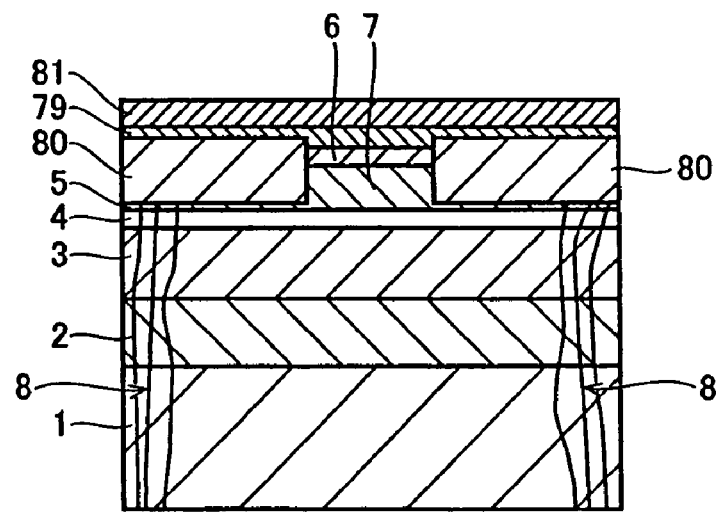

As shown in FIG. 26, the p-side ohmic electrode 79 consisting of the Pt layer having the thickness of about 5 nm, the Pd layer having the thickness of about 100 nm and the Au layer having the thickness of about 150 nm in ascending order is formed on the n-type current blocking layers 80 by vacuum evaporation to be in contact with the upper surface of the p-type contact layer 6 constituting the ridge portion 7. Thereafter the p-side pad electrode 81 consisting of the Ti layer having the thickness of about 100 nm, the Pd layer having the thickness of about 100 nm and the Au layer having the thickness of about 3 μm in ascending order is formed on the p-side ohmic electrode 79. Thereafter the back surface of the n-type GaN substrate 1 is polished so that the thickness of the n-type GaN substrate 1 is about 100 μm.

As shown in FIG. 22, the insulator films 12 are formed to cover the regions 8 having concentrated dislocations on the back surface of the n-type GaN substrate 1 through a fabrication process similar to that of the first embodiment shown in FIG. 12. Thereafter the n-side electrode 13 is formed on the back surface of the n-type GaN substrate 1 by vacuum evaporation to be in contact with the region of the n-type GaN substrate 1 other than the regions 8 having concentrated dislocations while covering the insulator films 12. Finally, scribing lines (not shown) are formed from the side of the device provided with the p-side pad electrode 81 and the device is thereafter cleaved into each chip along the scribing lines, thereby forming the nitride-based semiconductor laser device according to the fourth embodiment.

Fifth Embodiment

Figure 27:
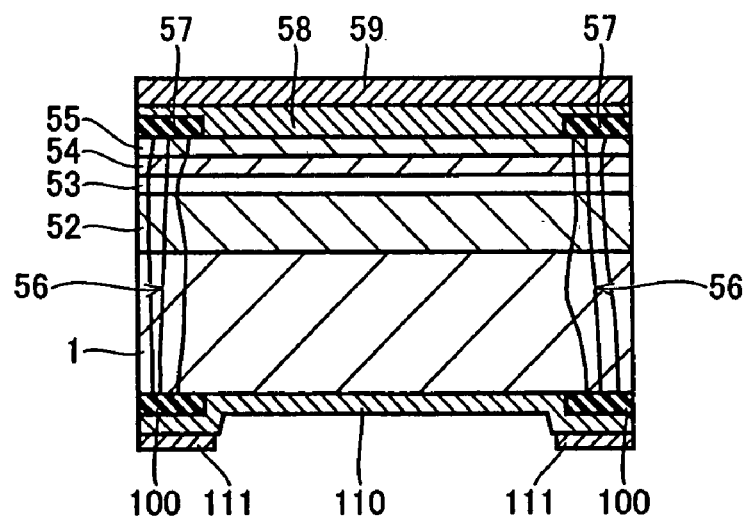
FIG. 27 is a sectional view showing the structure of a light-emitting diode device (semiconductor device) according to a fifth embodiment of the present invention.

Referring to FIG. 27, insulator films 100 of $SiO_2$ having a thickness of about 250 nm and a width of about 40 μm are formed on regions 56 having concentrated dislocations on the back surface of an n-type GaN substrate 1 in a light-emitting diode device according to a fifth embodiment of the present invention, dissimilarly to the aforementioned third embodiment.

According to the fifth embodiment, an n-side ohmic transparent electrode 110 having a thickness and a composition similar to those of the n-side ohmic transparent electrode 60 in the aforementioned third embodiment is formed on the back surface of the n-type GaN substrate 1 to be in contact with a region of the back surface of the n-type GaN substrate 1 other than the regions 56 having concentrated dislocations while covering the insulator films 100. This n-side ohmic transparent electrode 110 consists of an Al layer having a thickness of about 5 nm, a Pt layer having a thickness of about 15 nm and an Au layer having a thickness of about 40 nm successively from the side closer to the back surface of the n-type GaN substrate 1. N-side pad electrodes 111 consisting of Ti layers having a thickness of about 100 nm, Pd layers having a thickness of about 100 nm and Au layers having a thickness of about 3 μm from the side closer to the back surface of the n-side ohmic transparent electrode 110 are formed on prescribed regions of the back surface of the n-side ohmic transparent electrode 110. The n-side ohmic transparent electrode 110 is an example of the "back electrode" in the present invention. The remaining structure of the fifth embodiment is similar to that of the aforementioned third embodiment.

According to the fifth embodiment, as hereinabove described, the insulator films 100 are formed on the regions 56 having concentrated dislocations on the back surface of the n-type GaN substrate 1 while the n-side ohmic transparent electrode 110 is formed to be in contact with the region of the back surface of the n-type GaN substrate 1 other than the regions 56 having concentrated dislocations so that the insulator films 100 cover the regions 56 having concentrated dislocations not to expose the same on the back surface of the n-type GaN substrate 1, whereby it is possible to easily suppress development of leakage current resulting from current flowing to the regions 56 having concentrated dislocations on the back surface of the n-type GaN substrate 1. Further, the insulator films 57 cover the regions 56 having concentrated dislocations not to expose the same on the upper surface of a p-type contact layer 55 similarly to the aforementioned third embodiment, whereby it is also possible to easily suppress development of leakage current flowing to the regions 56 having concentrated dislocations on the upper surface of the p-type contact layer 55. Consequently, optical output can be further easily stabilized when the device is subjected to constant current driving, whereby operations of the semiconductor device can be further easily stabilized. Further, the quantity of current flowing to the regions 56 having concentrated dislocations can be so reduced that it is possible to reduce unnecessary emission from the regions 56 having concentrated dislocations.

Figure 28:
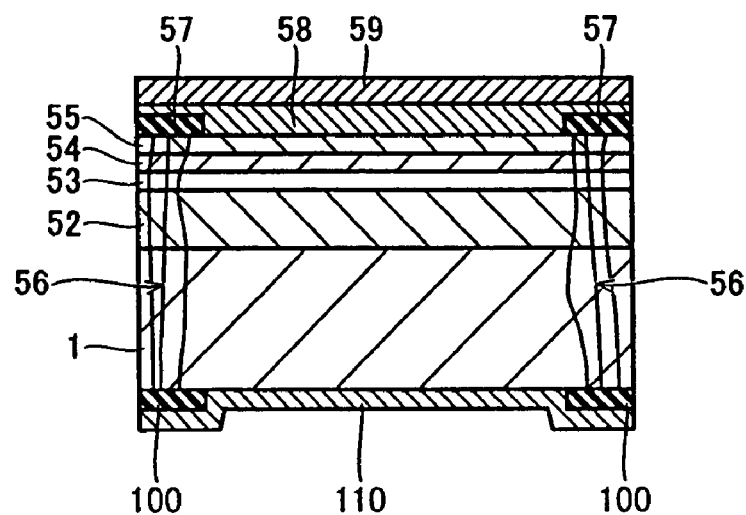
FIG. 28 is a sectional view for illustrating a fabrication process for the light-emitting diode device according to the fifth embodiment shown in FIG. 27.

Fabrication processes for the light-emitting diode device according to the fifth embodiment are described with reference to FIGS. 27 and 28.

First, layers and films up to the p-side pad electrode 59 are formed through fabrication processes similar to those of the third embodiment shown in FIGS. 18 to 20, and the back surface of the n-type GaN substrate 1 is thereafter polished. According to the fifth embodiment, an $SiO_2$ film (not shown) having a thickness of about 250 nm is formed on the overall back surface of the n-type GaN substrate 1 by plasma CVD, an SOG method (application) or electron beam evaporation. Thereafter a portion of the $SiO_2$ film located on the region of the back surface of the n-type GaN substrate 1 other than the regions 56 having concentrated dislocations is removed thereby forming the insulator films 100 of $SiO_2$ having the thickness of about 250 μm and the width of about 40 μm, as shown in FIG. 28. Thus, the insulator films 100 cover the regions 56 having concentrated dislocations on the back surface of the n-type GaN substrate 1. Then, the n-side ohmic transparent electrode 110 is formed on the back surface of the n-type GaN substrate 1 by vacuum evaporation to be in contact with the region of the back surface of the n-type GaN substrate 1 other than the regions 56 having concentrated dislocations while covering the insulator films 100. More specifically, the Al layer having the thickness of about 5 nm, the Pt layer having the thickness of about 15 nm and the Au layer having the thickness of about 40 nm are formed successively from the side closer to the back surface of the n-type GaN substrate 1, thereby forming the n-side ohmic transparent electrode 110.

As shown in FIG. 27, the n-side pad electrodes 111 consisting of the Ti layers having the thickness of about 100 nm, the Pd layers having the thickness of about 100 nm and the Au layers having the thickness of about 3 μm successively from the side closer to the back surface of the n-side ohmic transparent electrode 110 are formed on the prescribed regions of the back surface of the n-side ohmic transparent electrode 110 by vacuum evaporation. Finally, scribing lines (not shown) are formed from the side of the device provided with the p-side pad electrode 59 and the device is thereafter cleaved into each chip along the scribing lines, thereby forming the light-emitting diode device according to the fifth embodiment.

Sixth Embodiment

Figure 29:
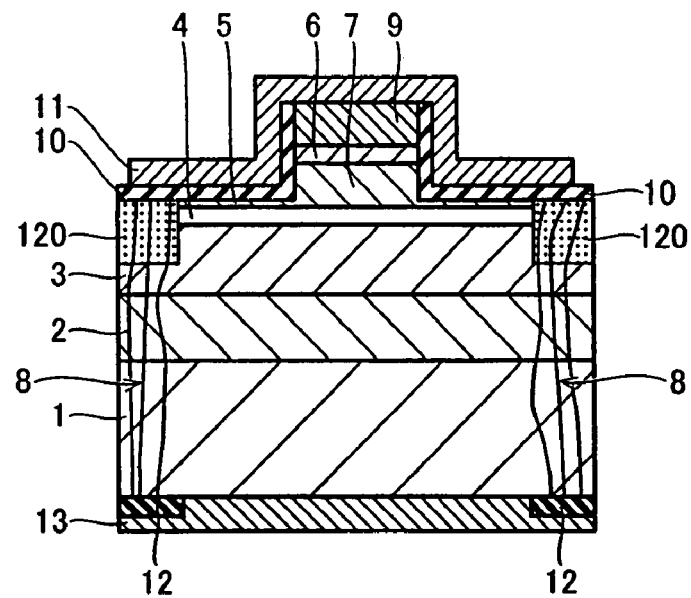
FIG. 29 is a sectional view showing the structure of a nitride-based semiconductor laser device (semiconductor device) according to a sixth embodiment of the present invention.

Referring to FIG. 29, ion implantation layers 120 having a depth reaching the inner part of an n-type cladding layer 3 from the front surfaces of flat portions of a p-type cladding layer 5 other than a projecting portion are provided on regions 8 having concentrated dislocations in a nitride-based semiconductor laser device according to a sixth embodiment of the present invention, dissimilarly to the aforementioned first embodiment. The ion implantation layers 120 are formed by ion-implanting an impurity such as carbon (C), whereby the regions provided with the ion implantation layers 120 exhibit high resistance. The ion implantation layers 120 are examples of the "high resistance region" in the present invention. The remaining structure of the sixth embodiment is similar to that of the aforementioned first embodiment.

According to the sixth embodiment, as hereinabove described, the ion implantation layers 120 having the depth reaching the inner part of the n-type cladding layer 3 from the front surfaces of the flat portions of the p-type cladding layer 5 other than the projecting portion are provided on the regions 8 having concentrated dislocations so that current hardly flows to the regions 8 having concentrated dislocations on the front surfaces of the flat portions of the p-type cladding layer 5 other than the projecting portion due to the ion implantation layers 120, whereby it is possible to suppress development of leakage current resulting from current flowing to the regions 8 having concentrated dislocations on the front surfaces of the flat portions of the p-type cladding layer 5 other than the projecting portion. Consequently, optical output can be easily stabilized when the device is subjected to constant current driving, whereby operations of the semiconductor device can be easily stabilized.

The remaining effects of the sixth embodiment are similar to those of the aforementioned first embodiment.

In fabrication processes for the nitride-based semiconductor laser device according to the sixth embodiment, carbon (C) is ion-implanted into the regions 8 having concentrated dislocations on the top surfaces of the flat portions of the p-type cladding layer 5 other than the projecting portion at the energy of about 150 kV after a fabrication process similar to that of the first embodiment shown in FIG. 9 and before formation of insulator films 10. Thus, the ion implantation layers 120 having the ion implantation depth (thickness) reaching the inner part of the n-type cladding layer 3 from the front surfaces of the flat portions of the p-type cladding layer 5 other than the projecting portion are formed and arranged in the regions 8 having concentrated dislocations. The dose for the ion implantation is preferably set to at least about $1\times10^{14}$ $cm^{-2}$.

Seventh Embodiment

Figure 30:
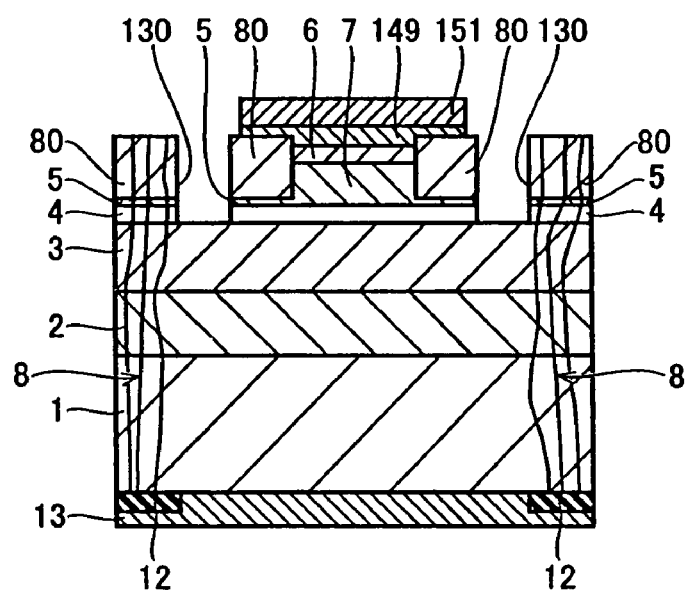
FIG. 30 is a sectional view showing the structure of a nitride-based semiconductor laser device (semiconductor device) according to a seventh embodiment of the present invention.

Referring to FIG. 30, recess portions 130 having a depth reaching the upper surface of an n-type cladding layer 3 from the upper surfaces of n-type current blocking layers 80 are provided on regions located inward beyond regions 8 having concentrated dislocations (in the range of about 50 μm to about 100 μm from both ends of the device) in a nitride-based semiconductor laser device according to a seventh embodiment of the present invention in a structure similar to that (see FIG. 22) of the aforementioned fourth embodiment. A p-side ohmic electrode 149 consisting of a Pt layer having a thickness of about 5 nm, a Pd layer having a thickness of about 100 nm and an Au layer having a thickness of about 150 nm in ascending order is formed on a region located inward beyond the recess portions 130 above the n-type current blocking layers 80 to be in contact with the upper surface of a p-type contact layer 6. A p-side pad electrode 151 consisting of a Ti layer having a thickness of about 100 nm, a Pd layer having a thickness of about 100 nm and an Au layer having a thickness of about 3 μm in ascending order is formed on the p-side ohmic electrode 149. The p-side ohmic electrode 149 is an example of the "front electrode" in the present invention. The remaining structure of the seventh embodiment is similar to that of the aforementioned fourth embodiment.

According to the seventh embodiment, as hereinabove described, the recess portions 130 having the depth reaching the upper surface of the n-type cladding layer 3 from the upper surfaces of the n-type current blocking layers 80 are provided on the regions located inward beyond the regions 8 having concentrated dislocations (in the range of about 50 μm to about 100 μm from both ends) while the p-side ohmic electrode 149 is formed on the region located inward beyond the recess portions 130 above the n-type current blocking layers 80 to be in contact with the upper surface of the p-type contact layer 6, whereby it is possible to suppress development of leakage current resulting from current flowing to the regions 8 having concentrated dislocations on the upper surfaces of the n-type current blocking layers 80. Consequently, optical output can be stabilized when the device is subjected to constant current driving, whereby operations of the semiconductor device can be stabilized. Further, the recess portions 130 part the regions of the p-type cladding layer 5 and the n-type current blocking layers 80 located inward beyond the regions 8 having concentrated dislocations and the regions 8 having concentrated dislocations from each other, whereby the regions 8 having concentrated dislocations can be inhibited from absorbing light emitted from an emission layer 4 located inward beyond the regions 8 having concentrated dislocations. Thus, light absorbed by the regions 8 having concentrated dislocations can be inhibited from reemission at an unintentional wavelength, whereby deterioration of color purity resulting from such reemission can be suppressed.

The remaining effects of the seventh embodiment are similar to those of the aforementioned first embodiment.

In fabrication processes for the nitride-based semiconductor laser device according to the seventh embodiment, the n-type current blocking layers 80 are formed through a fabrication process similar to that of the fourth embodiment shown in FIG. 25, and the recess portions 130 having the depth reaching the upper surface of the n-type cladding layer 3 from those of the n-type current blocking layers 80 are thereafter formed on the regions located inward beyond the regions 8 having concentrated dislocations by RIE (reactive ion etching). A metal layer (not shown) for constituting the p-side ohmic electrode 149 and the p-side pad electrode 151 is formed on the overall surface including the inner surfaces of the recess portions 130 by vacuum evaporation. Thereafter portions of the metal layer located on the regions 8 having concentrated dislocations on the n-type current blocking layers 80 and the inner surfaces of the recess portions 130 are removed. Thus, the p-side ohmic electrode 149 is formed on the region located inward beyond the recess portions 130 on the n-type current blocking layers 80 to be in contact with the upper surface of the p-type contact layer 6 while the p-side pad electrode 151 is formed on the p-side ohmic electrode 149.

Figure 31:
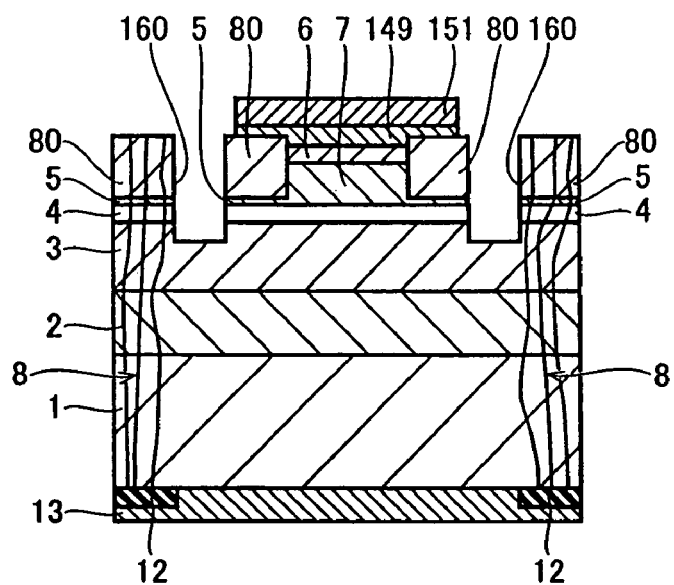
FIG. 31 is a sectional view showing the structure of a nitride-based semiconductor laser device according to a first modification of the seventh embodiment shown in FIG. 30.

Referring to FIG. 31, recess portions 160 provided on regions located inward beyond regions 8 having concentrated dislocations have a depth reaching the inner part of an n-type cladding layer 3 from the upper surfaces of n-type current blocking layers 80 in a nitride-based semiconductor laser device according to a first modification of the seventh embodiment. Effects similar to those of the aforementioned seventh embodiment can be attained also according to this structure.

Figure 32:
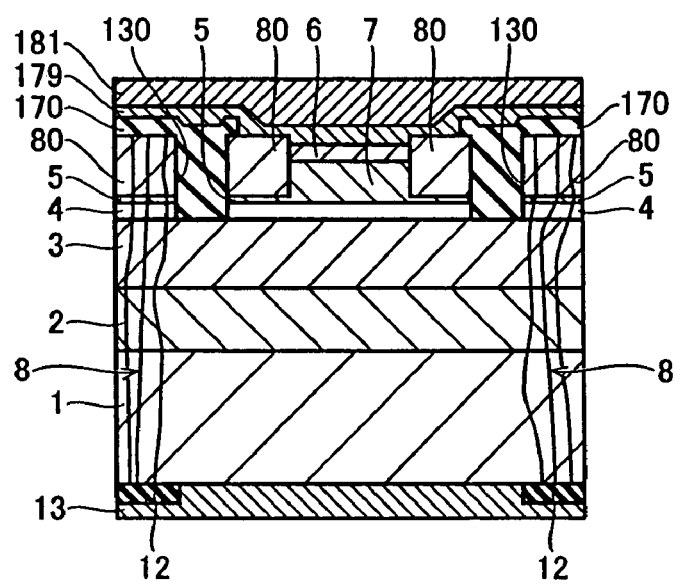
FIG. 32 is a sectional view showing the structure of a nitride-based semiconductor laser device according to a second modification of the seventh embodiment shown in FIG. 30.

Referring to FIG. 32, insulator films 170 are formed to fill up regions 8 having concentrated dislocations on the upper surfaces of n-type current blocking layers 80 and recess portions 130 in a nitride-based semiconductor laser device according to a second modification of the seventh embodiment. A p-side ohmic electrode 179 consisting of a Pt layer having a thickness of about 5 nm, a Pd layer having a thickness of about 100 nm and an Au layer having a thickness of about 150 nm in ascending order is formed on the overall upper surfaces of the n-type current blocking layers 80, the insulator films 170 and a p-type contact layer 6. Further, a p-side pad electrode 181 consisting of a Ti layer having a thickness of about 100 nm, a Pd layer having a thickness of about 100 nm and an Au layer having a thickness of about 3 μm in ascending order is formed on the p-side ohmic electrode 179. Effects similar to those of the aforementioned seventh embodiment can be attained also according to this structure.

Eighth Embodiment

Figure 33:
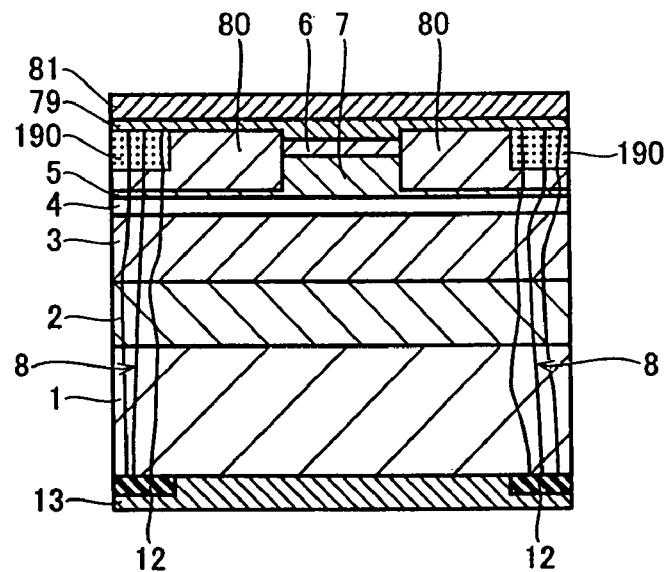
FIG. 33 is a sectional view showing the structure of a nitride-based semiconductor laser device (semiconductor device) according to an eighth embodiment of the present invention.

Referring to FIG. 33, ion implantation layers 190 having a depth of about 0.2 μm from the upper surfaces of n-type current blocking layers 80 are provided on regions 8 having concentrated dislocations in a nitride-based semiconductor laser device according to an eighth embodiment of the present invention in a structure similar to that of the aforementioned fourth embodiment (see FIG. 22). The ion implantation layers 190 are formed by ion-implanting an impurity such as carbon (C), whereby the regions provided with the ion implantation layers 190 exhibit high resistance. The ion implantation layers 190 are examples of the "high resistance region" in the present invention. The remaining structure of the eighth embodiment is similar to that of the aforementioned fourth embodiment.

According to the eighth embodiment, as hereinabove described, the ion implantation layers 190 having the depth of about 0.2 μm from the upper surfaces of the n-type current blocking layers 80 are provided on the regions 8 having concentrated dislocations so that current hardly flows to the regions 8 having concentrated dislocations on the upper surfaces of the n-type current blocking layers 80 due to the ion implantation layers 190, whereby it is possible to suppress development of leakage current resulting from current flowing to the regions 8 having concentrated dislocations on the upper surfaces of the n-type current blocking layers 80. Consequently, optical output can be easily stabilized when the device is subjected to constant current driving, whereby operations of the semiconductor device can be easily stabilized.

The remaining effects of the eighth embodiment are similar to those of the aforementioned first embodiment.

In fabrication processes for the nitride-based semiconductor laser device according to the eighth embodiment, carbon (C) is ion-implanted into the regions 8 having concentrated dislocations on the upper surfaces of the n-type current blocking layers 80 at an energy of about 40 keV before a step (see FIG. 26) of forming a p-side ohmic electrode 79 in processes similar to those of the aforementioned fourth embodiment. Thus, the ion implantation layers 190 having the ion implantation depth (thickness) of about 0.2 μm from the upper surfaces of the n-type current blocking layers 80 and arranged in the regions 8 having concentrated dislocations, as shown in FIG. 33. The dose for the ion implantation is preferably set to at least about $1\times10^{14}$ cm$^{-2}$.

Ninth Embodiment

In a nitride-based semiconductor laser device according to a ninth embodiment of the present invention, a nitride-based semiconductor layer including a sapphire substrate is employed as the substrate for the nitride-based semiconductor laser device dissimilarly to the aforementioned first to eighth embodiments.

Figure 34:
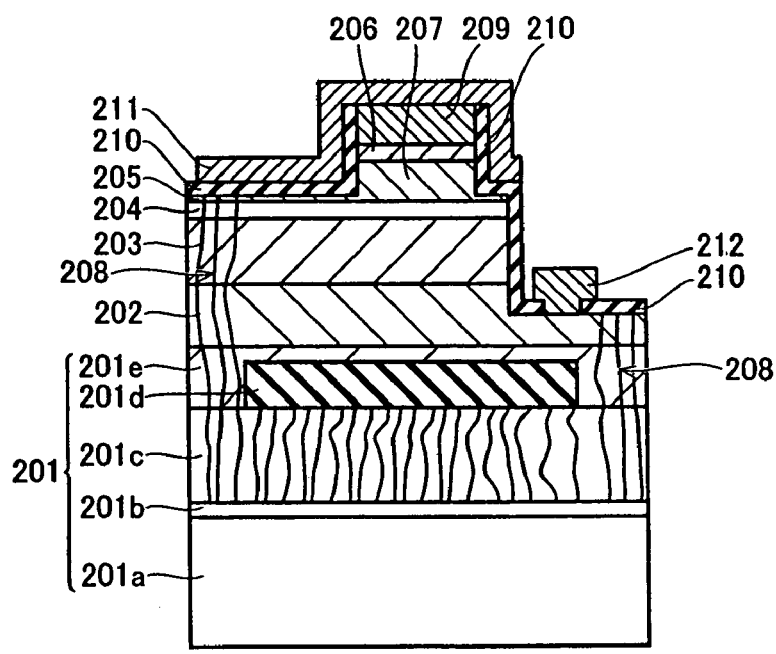
FIG. 34 is a sectional view showing the structure of a nitride-based semiconductor laser device (semiconductor device) according to a ninth embodiment of the present invention.

As shown in FIG. 34, an AlGaN layer 201b having a thickness of about 20 nm is formed on a sapphire substrate 201a according to the ninth embodiment. A GaN layer 201c having a thickness of about 1 μm is formed on the AlGaN layer 201b. Longitudinally propagated dislocations are formed on the overall region of the GaN layer 201c. A mask layer 201d of SiN or SiO$_2$ having a thickness of about 200 nm is formed on a prescribed region of the GaN layer 201c. This mask layer 201d functions as a selective growth mask in a fabrication process described later. An undoped GaN layer 201e having a thickness of about 5 μm is formed on the GaN layer 201c to cover the mask layer 201d. The sapphire substrate 201a, the AlGaN layer 201b, the GaN layer 201c, the mask layer 201d and the GaN layer 201e constitute a substrate 201 of the nitride-based semiconductor laser device according to the ninth embodiment. The GaN layer 201e constituting the substrate 201 is an example of the "nitride-based semiconductor substrate" in the present invention.

An n-type layer 202 having a thickness of about 100 nm and consisting of n-type GaN doped with Si having an atomic density of about $5\times10^{18}$ cm$^{-3}$ is formed on the substrate 201. An n-type cladding layer 203 having a thickness of about 400 nm and consisting of n-type Al$_{0.05}$Ga$_{0.95}$N doped with Si having an atomic density of about $5\times10^{18}$ cm$^{-3}$ and a carrier concentration of about $5\times10^{18}$ cm$^{-3}$ is formed on the n-type layer 202. An emission layer 204 having a structure similar to that of the emission layer 4 in the first embodiment shown in FIG. 2 is formed on the n-type cladding layer 203. The n-type layer 202, the n-type cladding layer 203 and the emission layer 204 are examples of the "semiconductor element layer" in the present invention.

A p-type cladding layer 205 having a projecting portion and consisting of p-type Al$_{0.05}$Ga$_{0.95}$N doped with Mg having an atomic density of about $4\times10^{19}$ cm$^{-3}$ and a carrier concentration of about $5\times10^{17}$ cm$^{-3}$ is formed on the emission layer 204. The projecting portion of the p-type cladding layer 205 has a width of about 1.5 μm and a height of about 300 nm. Flat portions of the p-type cladding layer 205 other than the projecting portion have a thickness of about 100 nm. A p-type contact layer 206 having a thickness of about 10 nm and consisting of p-type GaN doped with Mg having an atomic density of about $4\times10^{19}$ cm$^{-3}$ and a carrier concentration of about $5\times10^{17}$ cm$^{-3}$ is formed on the projecting portion of the p-type cladding layer 205. The projecting portion of the p-type cladding layer 205 and the p-type contact layer 206 constitute a striped (elongated) ridge portion 207 extending in a prescribed direction. The p-type cladding layer 205 and the p-type contact layer 206 are examples of the "Semiconductor element layer" in the present invention.

Prescribed regions of the elements from the flat portions of the p-type cladding layer 205 other than the projecting portion up to the n-type layer 202 are removed thereby partially exposing the front surface of the n-type cladding layer 202. A region 208 having concentrated dislocations extending from the interface between the GaN layer 201c and the AlGaN layer 201b up to the front surface of one of the flat portions of the p-type cladding layer 205 other than the projecting portion is formed in the vicinity of first ends of the GaN layer 201e constituting the substrate 201 and the nitride-based semiconductor layers 202 to 205. Another region 208 having concentrated dislocations extending from the interface between the GaN layer 201c and the AlGaN layer 201b up to the exposed front surface of the n-type layer 202 is also formed in the vicinity of second ends of the GaN layer 201e constituting the substrate 201 and the n-type layer 202.

A p-side ohmic electrode 209 consisting of a Pt layer having a thickness of about 5 nm, a Pd layer having a thickness of about 100 nm and an Au layer having a thickness of about 150 nm in ascending order is formed on the p-type contact layer 206 constituting the ridge portion 207. The p-side ohmic electrode 209 is an example of the "front electrode" in the present invention.

According to the ninth embodiment, insulator films 210 of SiN having a thickness of about 250 nm are formed to expose the upper surface of the p-side ohmic electrode 209 and a prescribed region of the exposed front surface of the n-type layer 202 other than the region 208 having concentrated dislocations. In other words, the insulator films 210 cover the front surfaces of the p- and n-side regions 208 having concentrated dislocations.

A p-side pad electrode 211 consisting of a Ti layer having a thickness of about. 100 nm, a Pd layer having a thickness of about 100 nm and an Au layer having a thickness of about 3 μm in ascending order is formed on the front surface of the first insulator film 201 located on the front surface of one of the flat portions of the p-type cladding layer 205 other than the projecting portion to be in contact with the upper surface of the p-side ohmic electrode 209.

According to the ninth embodiment, further, an n-side electrode 212 is formed to be in contact with the region of the exposed front surface of the n-type layer 202 other than the region 208 having concentrated dislocations. This n-side electrode 212 consists of an Al layer having a thickness of about 10 nm, a Pt layer having a thickness of about 20 nm and an Au layer having a thickness of about 300 nm in ascending order. The n-side electrode 212 is an example of the "front electrode" in the present invention.

According to the ninth embodiment, as hereinabove described, the second insulator film 210 is formed to expose the prescribed region of the exposed front surface of the n-type layer 202 other than the region 208 having concentrated dislocations while the n-side electrode 212 is formed to be in contact with the region of the exposed front surface of the n-type layer 202 other than the region 208 having concentrated dislocations, whereby the second insulator film 210 covers the region 208 having concentrated dislocations not to expose the same on the exposed front surface of the n-type layer 202 and hence it is possible to easily suppress development of leakage current resulting from current flowing to the region 208 having concentrated dislocations on the exposed front surface of the n-type layer 202. Consequently, optical output can be easily stabilized when the device is subjected to constant current driving, whereby operations of the semiconductor device can be easily stabilized. Further, unnecessary emission resulting from current flowing to the region 280 having concentrated dislocations can be suppressed.

Fabrication processes for the nitride-based semiconductor laser device according to the ninth embodiment are described with reference to FIGS. 34 to 38.

Figure 35:
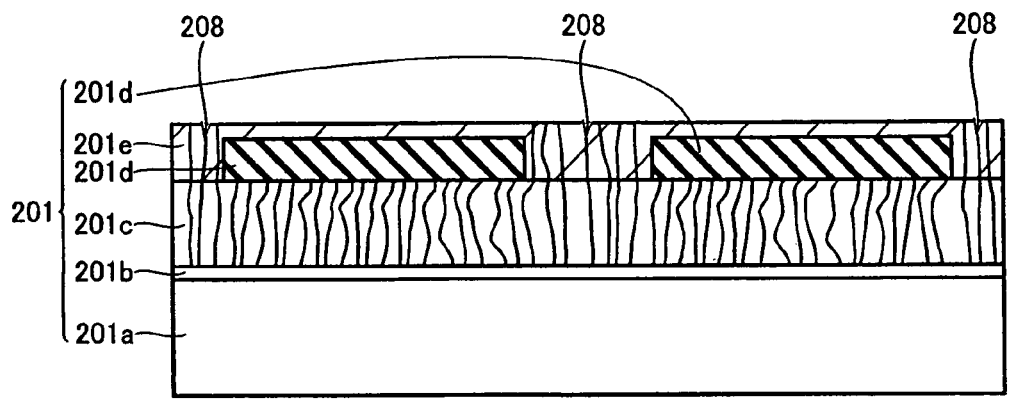
FIGS. 35 to 38 are sectional views for illustrating fabrication processes for the nitride-based semiconductor laser device according to the ninth embodiment shown in FIG. 34.

First, a process of forming the substrate 201 is described with reference to FIG. 35. More specifically, the AlGaN layer 201b having the thickness of about 20 nm is grown on the sapphire substrate 201a by MOCVD while holding the substrate temperature at about 600° C., as shown in FIG. 35. Thereafter the substrate temperature is increased to about 1100° C. for growing the GaN layer 201c having the thickness of about 1 μm on the AlGaN layer 201b. At this time, longitudinally propagated dislocations are formed on the overall region of the GaN layer 201c. Then, the mask layer 201d of SiN or $SiO_2$ having the thickness of about 200 nm is formed on the GaN layer 201c by plasma CVD at a prescribed interval.

Then, the undoped GaN layer 201e having the thickness of about 5 μm is laterally grown on the GaN layer 201c by HVPE through the mask layer 201d serving as a selective growth mask while holding the substrate temperature at about 1100° C. At this time, the GaN layer 201e is selectively longitudinally grown on portions of the GaN layer 201c formed with no mask layer 201d and thereafter gradually grown in the lateral direction. Therefore, the regions 208 having concentrated longitudinally propagated dislocations are formed on the portions of the GaN layer 201e formed with no mask layer 201d. On the other hand, the GaN layer 201e is laterally grown on the portion of the GaN layer 201e located on the mask layer 201d thereby laterally bending dislocations so that longitudinally propagated dislocations are hardly formed. The sapphire substrate 201a, the AlGaN layer 201b, the GaN layer 201c, the mask layer 201d and the GaN layer 201e constitute the substrate 201.

Figure 36:
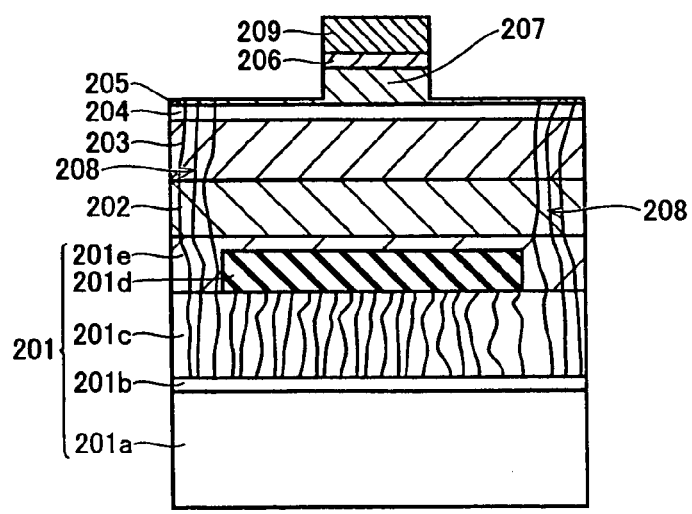

As shown in FIG. 36, the n-type layer 202, the n-type cladding layer 203, the emission layer 204, the p-type cladding layer 205 and the p-type contact layer 206 are successively grown on the substrate 201 by MOCVD. The striped (elongated) p-side ohmic electrode 209 is formed on the prescribed region of the p-type contact layer 206. Thereafter portions of the p-type contact layer 206 and the p-type cladding layer 205 are removed by etching by thicknesses of about 30 nm from the upper surfaces thereof, thereby forming the striped (elongated) ridge portion 207 constituted of the projecting portion of the p-type cladding layer 205 and the p-type contact layer 206 to extend in the prescribed direction.

Figure 37:
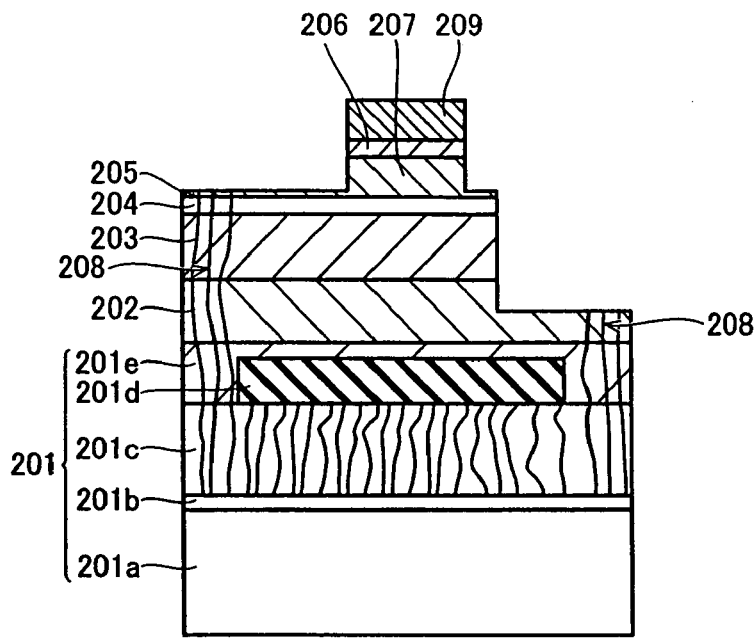

As shown in FIG. 37, prescribed regions from the front surfaces of the flat portions of the p-type cladding layer 205 other than the projecting portion up to the n-type layer 202 are removed by etching thereby partially exposing the front surface of the n-type layer 202.

Figure 38:
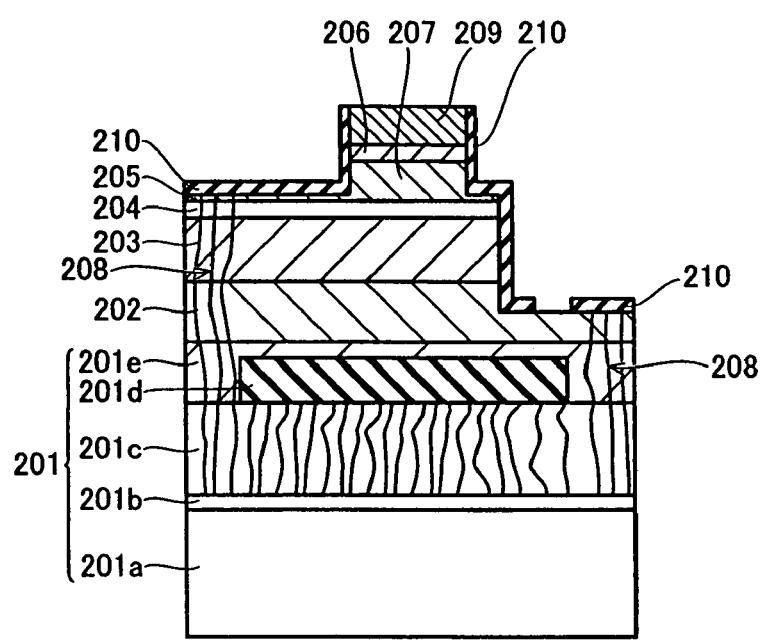

Then, an SiN film (not shown) having a thickness of about 250 nm is formed by plasma CVD to cover the overall surface. Thereafter portions of the SiN film located on the p-side ohmic electrode 209 and the prescribed region of the exposed front surface of the n-type layer 202 other than the region 208 having concentrated dislocations are removed thereby forming the insulator films 210 as shown in FIG. 38.

Then, the p-side pad electrode 211 is formed on the front surface of the first insulator film 210 located on the front surface of one of the flat portions of the p-type cladding layer 205 other than the projecting portion by vacuum evaporation to be in contact with the upper surface of the p-side ohmic electrode 209, as shown in FIG. 34. According to the ninth embodiment, the n-side electrode 212 is thereafter formed on the prescribed region of the second insulator film 210 located on the exposed front surface of the n-type layer 202 to be in contact with the region of the exposed front surface of the n-type layer 202 other than the region 208 having concentrated dislocations. Finally, scribing lines (not shown) are formed from the side of the device provided with the p-side pad electrode 211 and the device is cleaved into each chip along the scribing lines, thereby forming the nitride-based semiconductor laser device according to the ninth embodiment.

Tenth Embodiment

Figure 39:
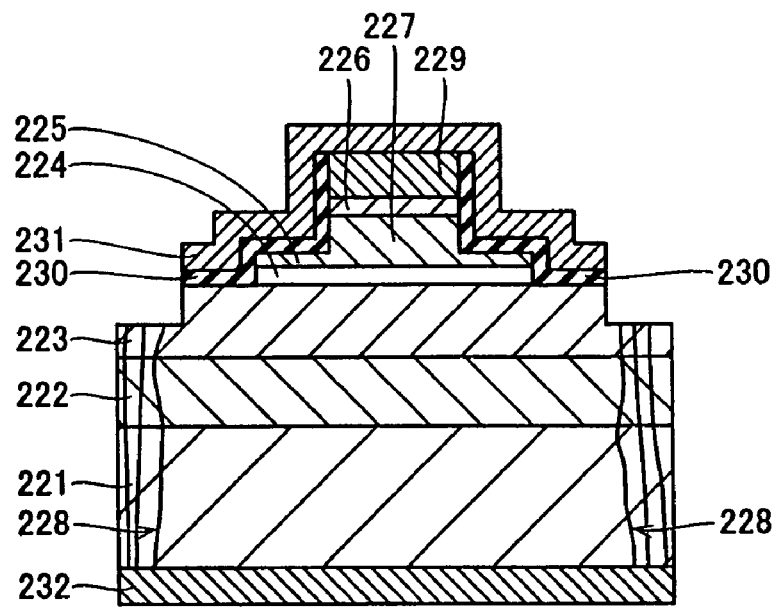
FIG. 39 is a sectional view showing the structure of a nitride-based semiconductor laser device (semiconductor device) according to a tenth embodiment of the present invention.

Referring to FIG. 39, an n-type GaN substrate 221 is employed as a substrate and the thickness of regions 228 having concentrated dislocations on an n-type cladding layer 223 is reduced below that of the remaining region of the n-type cladding layer 223 other than the regions 228 having concentrated dislocations in a nitride-based semiconductor laser device according to a tenth embodiment of the present invention dissimilarly to the aforementioned first to ninth embodiments.

In the nitride-based semiconductor laser device according to the tenth embodiment, an n-type layer 222 having a thickness of about 100 nm and consisting of n-type GaN doped with Si having an atomic density of about $5 \times 10^{18}$ cm$^{-3}$ is formed on the n-type GaN substrate 221 of about 100 μm in thickness doped with oxygen having a carrier concentration of about $5 \times 10^{18}$ cm$^{-3}$, as shown in FIG. 39. The n-type GaN substrate 221 has a wurtzite structure with a front surface of the (0001) plane. The n-type cladding layer 223 having a thickness of about 400 nm and consisting of n-type $Al_{0.05}Ga_{0.95}N$ doped with Si having an atomic density of about $5 \times 10^{18}$ cm$^{-3}$ and a carrier concentration of about $5 \times 10^{18}$ cm$^{-3}$ is formed on the n-type layer 222. The regions 228 having concentrated dislocations, extending from the back surface of the n-type GaN substrate 221 to the front surface of the n-type cladding layer 223 with a width of about 10 μm, are formed in the vicinity of ends of the n-type GaN substrate 221, the n-type layer 222 and the n-type cladding layer 223 with a period of about 400 μm in a striped (elongated) shape. The n-type GaN substrate 221 is an example of the "substrate" in the present invention, and the n-type layer 222 and the n-type cladding layer 223 are examples of the "semiconductor element layer" and the "first semiconductor layer" in the present invention respectively.

According to the tenth embodiment, the n-type cladding layer 223 is partially removed up to a prescribed depth from the upper surface thereof so that the thickness of the regions 228 having concentrated dislocations on the n-type cladding layer 223 is smaller than that of the region of the n-type cladding layer 223 other than the regions 228 having concentrated dislocations. An emission layer 224 having an MQW active layer is formed on the region of the n-type cladding layer 223 other than the regions 228 having concentrated dislocations. This emission layer 224 consists of nitride-based semiconductor layers having thicknesses and compositions similar to those of the layers forming the emission layer 4 in the first embodiment shown in FIG. 2, and has a width (about 7.5 μm) smaller than the width of the region of the n-type cladding layer 223 other than the regions 228 having concentrated dislocations. The emission layer 224 is an example of the "semiconductor element layer" in the present invention.

A p-type cladding layer 225 having a projecting portion and consisting of p-type $Al_{0.05}Ga_{0.95}N$ doped with Mg having an atomic density of about $4 \times 10^{19}$ cm$^{-3}$ and a carrier concentration of about $5 \times 10^{17}$ cm$^{-3}$ is formed on the emission layer 224. The projecting portion of this p-type cladding layer 225 has a width of about 1.5 μm and a height of about 300 nm from the upper surfaces of flat portions of the p-type cladding layer 225. The flat portions of the p-type cladding layer 225 have a thickness of about 100 nm. A p-type contact layer 226 having a thickness of about 10 nm and consisting of p-type GaN doped with Mg having an atomic density of about $4 \times 10^{19}$ cm$^{-3}$ and a carrier concentration of about $5 \times 10^{17}$ cm$^{-3}$ is formed on the projecting portion of the p-type cladding layer 225. The projecting portion of the p-type cladding layer 225 and the p-type contact layer 226 constitute a striped (elongated) ridge portion 227 extending in a prescribed direction. The p-type cladding layer 225 and the p-type contact layer 226 are examples of the "semiconductor element layer" and the "second semiconductor layer" in the present invention respectively.

A p-side ohmic electrode 229 consisting of a Pt layer having a thickness of about 5 nm, a Pd layer having a thickness of about 100 nm and an Au layer having a thickness of about 150 nm in ascending order is formed on the p-type contact layer 226 constituting the ridge portion 227. The p-side ohmic electrode 229 is an example of the "front electrode" in the present invention. Insulator films 230 of SiN having a thickness of about 250 nm are formed on exposed front surface portions of the n-type cladding layer 223 and regions of the p-side ohmic electrode 229 other than the upper surface thereof. A p-side pad electrode 231 consisting of a Ti layer having a thickness of about 100 nm, a Pd layer having a thickness of about 100 nm and an Au layer having a thickness of about 3 µm in ascending order is formed on the front surfaces of the insulator films 230 to be in contact with the upper surface of the p-side ohmic electrode 229. An n-side electrode 232 consisting of an Al layer having a thickness of about 10 nm, a Pt layer having a thickness of about 20 nm and an Au layer having a thickness of about 300 nm from the side closer to the back surface of the n-type GaN substrate 221 is formed on the back surface of the n-type GaN substrate 221 to be in contact with the overall back surface of the n-type GaN substrate 221.

According to the tenth embodiment, as hereinabove described, the thickness of the regions 228 having concentrated dislocations on the n-type cladding layer 223 is reduced below that of the region of the n-type cladding layer 223 other than the regions 228 having concentrated dislocations while the emission layer 224 is formed on the region of the n-type cladding layer 223 other than the regions 228 having concentrated dislocations so that no region 228 having concentrated dislocations is formed on the p-n junction region between the n-type cladding layer 223 and the p-type cladding layer 225 formed through the emission layer 224, whereby it is possible to suppress development of leakage current resulting from current flowing to the regions 228 having concentrated dislocations. Consequently, optical output can be easily stabilized when the device is subjected to constant current driving, whereby operations of the nitride-based semiconductor laser device can be easily stabilized. Further, the quantity of current flowing to the regions 228 having concentrated dislocations can be so reduced that it is possible to reduce unnecessary emission from the regions 228 having concentrated dislocations.

According to the tenth embodiment, the width of the emission layer 224 is reduced below that of the region of the n-type cladding layer 223 other than the regions 228 having concentrated dislocations for reducing the p-n junction region between the n-type cladding layer 223 and the p-type cladding layer 225 formed through the emission layer 224, whereby a p-n junction capacitance formed by the n-type cladding layer 223 and the p-type cladding layer 225 can be reduced. Thus, the speed of response of the nitride-based semiconductor laser device can be increased.

Fabrication processes for the nitride-based semiconductor laser device according to the tenth embodiment are now described with reference to FIGS. 39 to 45.

Figure 40:
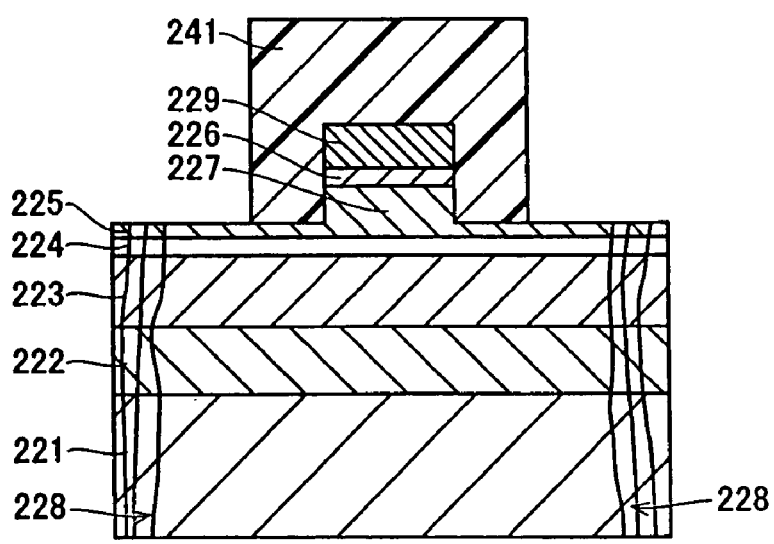
FIGS. 40 to 45 are sectional views for illustrating fabrication processes for the nitride-based semiconductor laser device according to the tenth embodiment shown in FIG. 39.

As shown in FIG. 40, elements up to the ridge portion 227 constituted of the projecting portion of the p-type cladding layer 225 and the p-type contact layer 226 and the p-side ohmic electrode 229 are formed through fabrication processes similar to those of the first embodiment shown in FIGS. 3 to 9. Thereafter a resist film 241 is formed on a prescribed region of the p-type cladding layer 225 other than the regions 228 having concentrated dislocations on the flat portions thereof, to cover the front surfaces of the p-side ohmic electrode 229 and the ridge portion 227.

Figure 41:
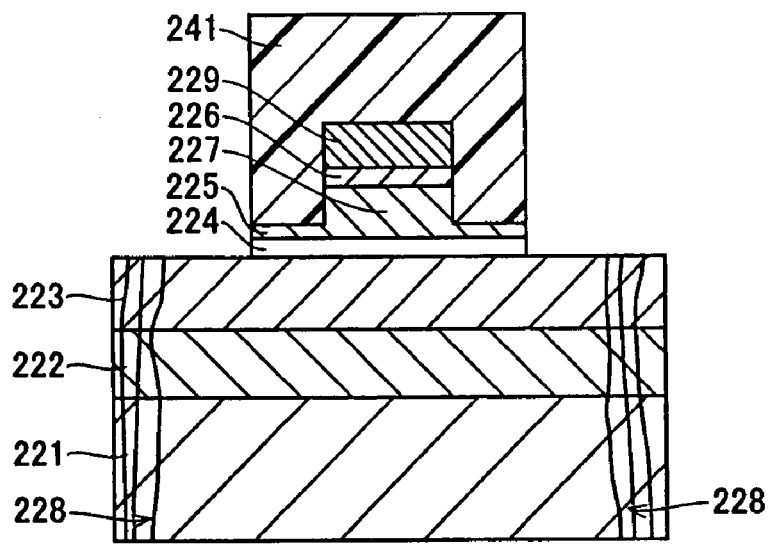

As shown in FIG. 41, the resist film 241 is employed as a mask for etching the upper surfaces of the flat portions of the p-type cladding layer 225 and the emission layer 224. Thus, the regions 228 having concentrated dislocations are removed from the p-type cladding layer 225 and the emission layer 224 while the widths of the p-type cladding layer 225 and the emission layer 224 are reduced below that of the region of the n-type cladding layer 223 other than the regions 228 having concentrated dislocations. Thereafter the resist film 241 is removed.

Figure 42:
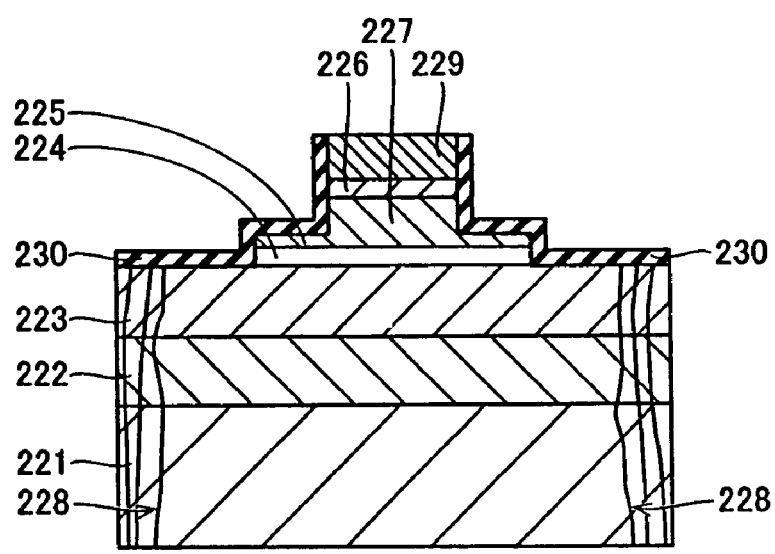

As shown in FIG. 42, an SiN film (not shown) having a thickness of about 250 nm is formed by plasma CVD to cover the overall surface, and a portion of the SiN film located on the upper surface of the p-side ohmic electrode 229 is removed thereby forming the insulator films 230 of SiN having the thickness of about 250 nm.

Figure 43:
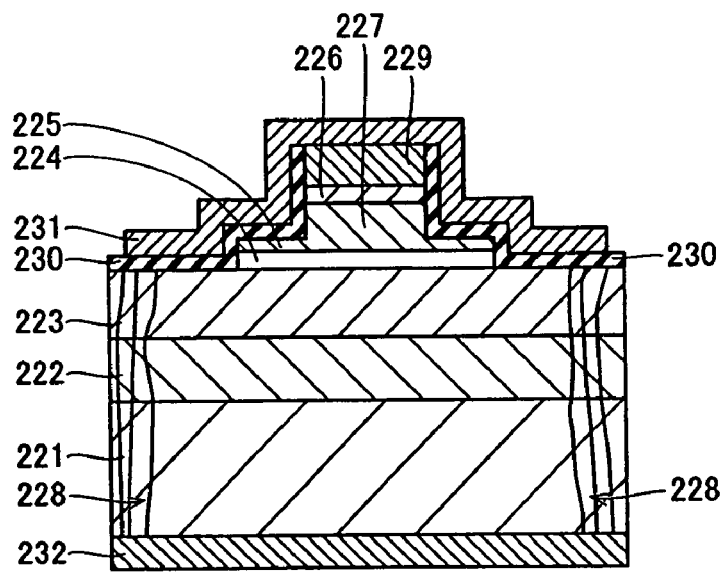

As shown in FIG. 43, the p-side pad electrode 231 consisting of the Ti layer having the thickness of about 100 nm, the Pd layer having the thickness of about 100 nm and the Au layer having the thickness of about 3 µm in ascending order is formed on prescribed regions of the front surfaces of the insulator films 230 by vacuum evaporation to be in contact with the upper surface of the p-side ohmic electrode 229. The back surface of the n-type GaN substrate 221 is polished so that the thickness of the n-type GaN substrate 221 is about 100 µm. Thereafter the n-side electrode 232 consisting of the Al layer having the thickness of about 10 nm, the Pt layer having the thickness of about 20 nm and the Au layer having the thickness of about 300 nm from the side closer to the back surface of the n-type GaN substrate 221 is formed on the back surface of the n-type GaN substrate 221 by vacuum evaporation to be in contact with the overall back surface of the n-type GaN substrate 221.

Figure 44:
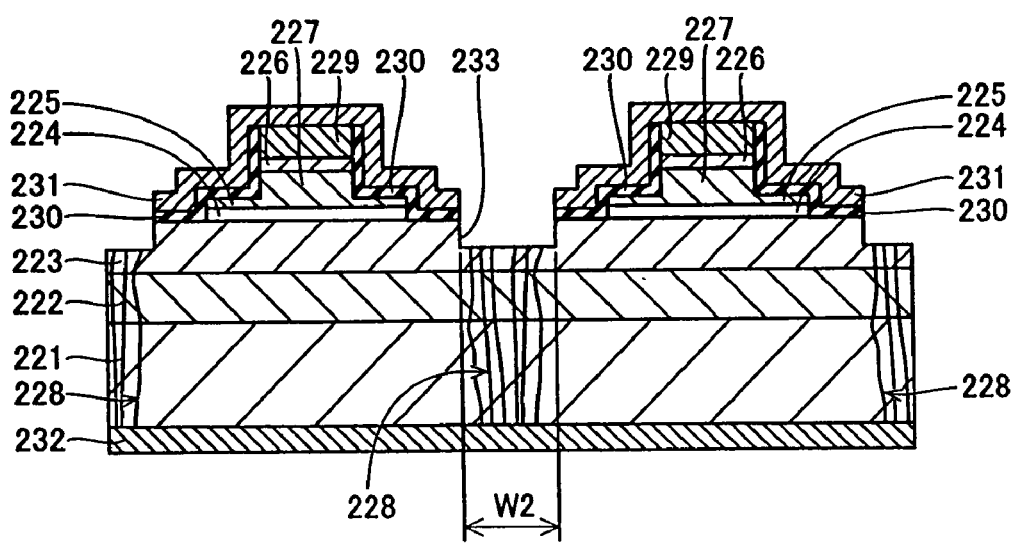

As shown in FIG. 44, the regions 228 having concentrated dislocations are partially removed from the front surface of the p-side pad electrode 231 up to prescribed depths of the insulator films 230 and the n-type cladding layer 223 on the boundary between the nitride-based semiconductor laser device and each adjacent device by RIE with chlorine. Thus, a trench 233 having a width W2 (about 60 µm, for example) larger than that of the regions 228 having concentrated dislocations is formed on each region 228 of the device having concentrated dislocations.

Figure 45:
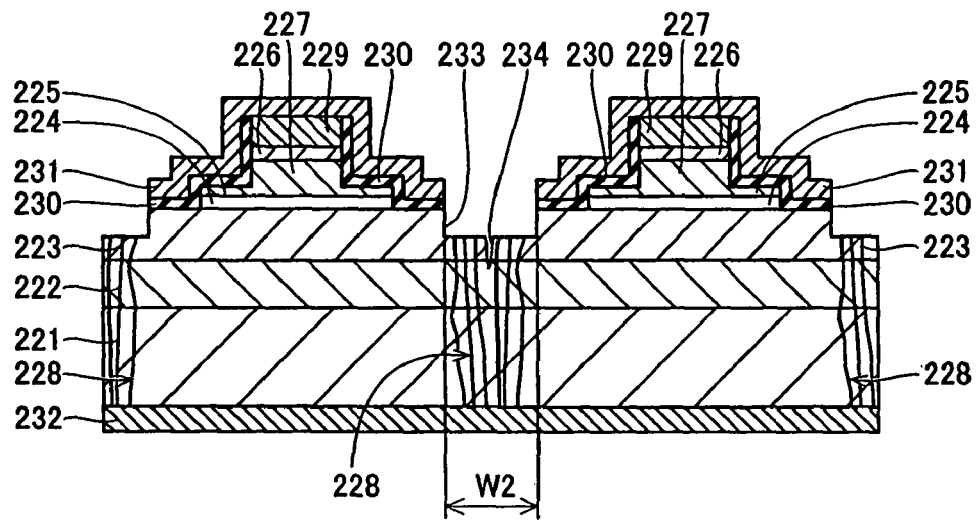

As shown in FIG. 45, a scribing line 234 is formed on the center of the bottom of each trench 233 with a diamond point. Thereafter the device is separated into each chip along the scribing line 234. Thus, the nitride-based semiconductor laser device according to the tenth embodiment is formed as shown in FIG. 39.

Eleventh Embodiment

Figure 46:
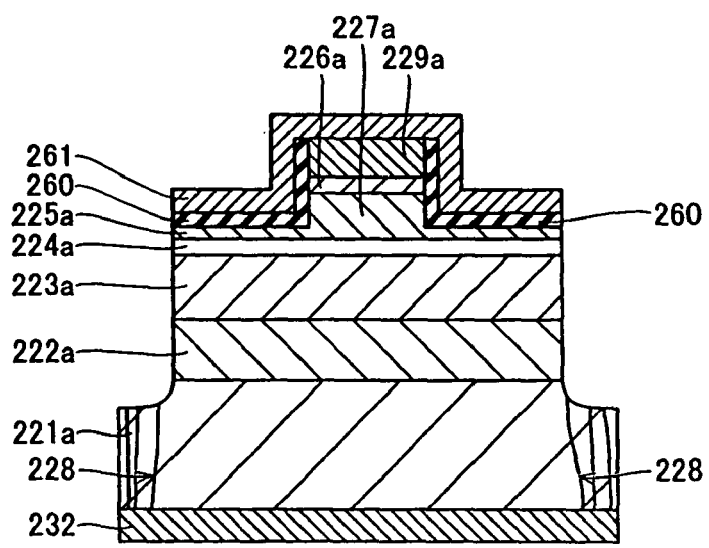
FIG. 46 is a sectional view showing the structure of a nitride-based semiconductor laser device (semiconductor device) according to an eleventh embodiment of the present invention.

Referring to FIG. 46, an emission layer 224a is identical in width to an n-type cladding layer 223a in a nitride-based semiconductor laser device according to an eleventh embodiment of the present invention dissimilarly to the aforementioned tenth embodiment. Further, an n-type GaN substrate 221a is partially removed up to a prescribed depth from the upper surface thereof so that the thickness of regions 228 having concentrated dislocations on the n-type GaN substrate 221 is smaller than that of the remaining region of the n-type GaN substrate 221a other than the regions 228 having concentrated dislocations. An n-type layer 222a, the n-type cladding layer 223a, the emission layer 224a, a p-type cladding layer 225a and a p-type contact layer 226a are successively formed on the region of the n-type GaN substrate 221 other than the regions 228 having concentrated dislocations.

Insulator films 260 are formed on flat portions of the p-type cladding layer 225a and side surfaces of a ridge portion 227a and a p-side ohmic electrode 229a. A p-side pad electrode 261 is formed on the front surfaces of the insulator films 260 to be in contact with the upper surface of the p-side ohmic electrode 229a. The n-type GaN substrate 221a, the n-type layer 222a, the n-type cladding layer 223a, the emission layer 224a, the p-type cladding layer 225a, the p-type contact layer 226a and the p-side ohmic electrode 229a have thicknesses and compositions similar to those of the n-type GaN substrate 221, the n-type layer 222, the n-type cladding layer 223, the emission layer 224, the p-type cladding layer 225, the p-type contact layer 226 and the p-side ohmic electrode 229 in the aforementioned tenth embodiment respectively. Further, the insulator films 260 and the p-side pad electrode 261 also have thicknesses and compositions similar to those of the insulator films 230 and the p-side pad electrode 231 in the aforementioned tenth embodiment respectively.

The remaining structure of the eleventh embodiment is similar to that of the aforementioned tenth embodiment.

According to the eleventh embodiment, as hereinabove described, the thickness of the regions 228 having concentrated dislocations on the n-type GaN substrate 221a is reduced below that of the region of the n-type GaN substrate 221a other than the regions 228 having concentrated dislocations while the n-type layer 222a, the n-type cladding layer 223a, the emission layer 224a, the p-type cladding layer 225a and the p-type contact layer 226a are successively formed on the region of the n-type GaN substrate 221a other than the regions 228 having concentrated dislocations so that the p-n junction region between the n-type cladding layer 223a and the p-type cladding layer 225a formed through the emission layer 224a is formed with no region 228 having concentrated dislocations, whereby operations of the nitride-based semiconductor laser device can be easily stabilized and unnecessary emission from the regions 228 having concentrated dislocations can be reduced similarly to the aforementioned tenth embodiment.

Fabrication processes for the nitride-based semiconductor laser device according to the eleventh embodiment are now described with reference to FIGS. 46 to 48.

Figure 47:
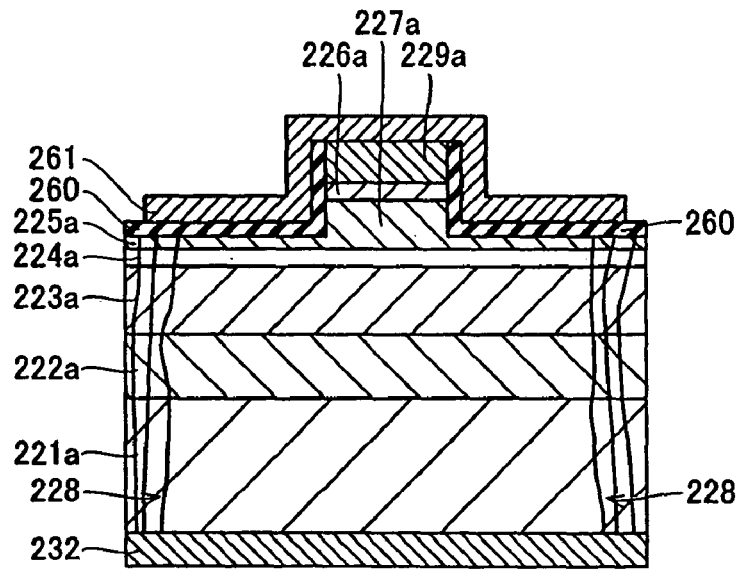
FIGS. 47 and 48 are sectional views for illustrating fabrication processes for the nitride-based semiconductor laser device according to the eleventh embodiment shown in FIG. 46.

First, the layers and films up to the p-side pad electrode 261 are formed through fabrication processes similar to those of the first embodiment shown in FIGS. 3 to 11 and the back surface of the n-type GaN substrate 221a is polished, as shown in FIG. 47. Thereafter the n-side electrode 232 is formed on the back surface of the n-type GaN substrate 221a by vacuum evaporation to be in contact with the overall back surface of the n-type GaN substrate 221a.

Figure 48:
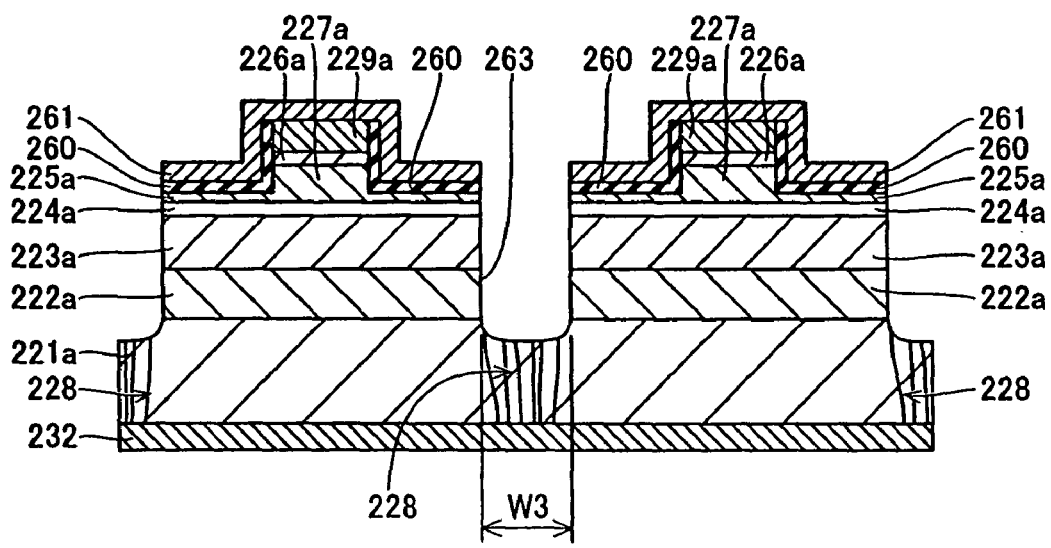

As shown in FIG. 48, irradiation with the third harmonic (355 nm) of a YAG laser (fundamental: 1.06 μm) on the boundary between the nitride-based semiconductor laser device and each adjacent device partially removes the regions 228 having concentrated dislocations from the front surface of the p-side pad electrode 261 up to a prescribed depths of the n-type GaN substrate 221a including the insulator films 260, the p-type cladding layer 225a, the emission layer 224a, the n-type cladding layer 223a and the n-type layer 222a. At this time, the pulse frequency of the YAG laser is set to about 10 kHz, and the scanning speed is set to about 0.75 mm/sec. Thus, a trench 263 having a width W3 (about 100 μm, for example) larger than the width of the regions 228 having concentrated dislocations is formed on each region 228 of the device having concentrated dislocations. Thereafter the device is separated into each chip along the trench 263. Thus, the nitride-based semiconductor laser device according to the eleventh embodiment is formed as shown in FIG. 46.

In the fabrication processes according to the eleventh embodiment, as hereinabove described, the trench 263 for separating the device into each chip with the YAG laser is so formed that the width W3 of the trench 263 can be rendered larger than the width of the regions 228 having concentrated dislocations, whereby the regions 228 having concentrated dislocations can be easily partially removed. Thus, no step of partially removing the regions 228 having concentrated dislocations may be added to the step of forming the trench 263 for separating the device into each chip. Consequently, fabrication steps can be simplified.

Twelfth Embodiment

Figure 49:
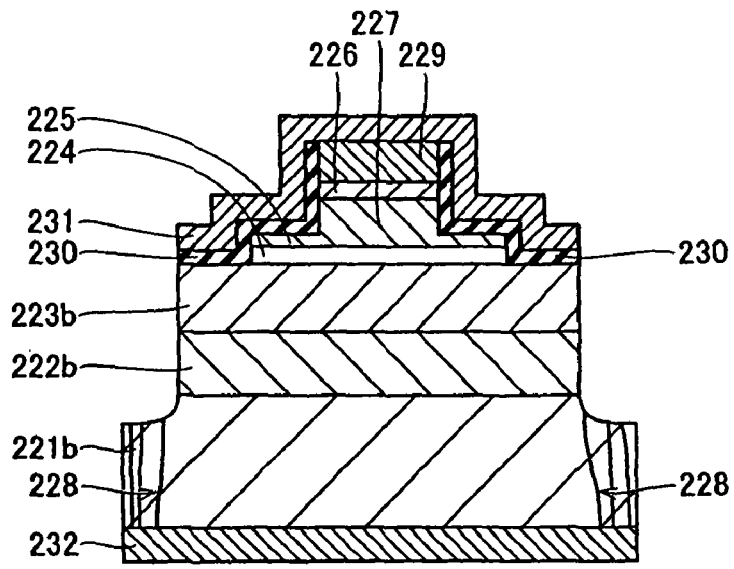
FIG. 49 is a sectional view showing the structure of a nitride-based semiconductor laser device (semiconductor device) according to a twelfth embodiment of the present invention.

Referring to FIG. 49, an n-type GaN substrate 221b is partially removed up to a prescribed depth from the upper surface thereof so that the thickness of regions 228 having concentrated dislocations is smaller than that of the remaining region of the n-type GaN substrate 221b other than the regions 228 having concentrated dislocations in a nitride-based semiconductor laser device according to a twelfth embodiment of the present invention dissimilarly to the aforementioned tenth embodiment. An n-type layer 222b, an n-type cladding layer 223b, an emission layer 224, a p-type cladding layer 225 and a p-type contact layer 226 are successively formed on the region of the n-type GaN substrate 221b other than the regions 228 having concentrated dislocations. The n-type GaN substrate 221b, the n-type layer 222b and the n-type cladding layer 223b have thicknesses and compositions similar to those of the n-type GaN substrate 221, the n-type layer 222 and the n-type cladding layer 223 in the aforementioned tenth embodiment respectively. The emission layer 224 and flat portions of the p-type cladding layer 225 have widths (about 4.5 μm) smaller than that of the n-type cladding layer 223b.

The remaining structure of the twelfth embodiment is similar to that of the aforementioned tenth embodiment.

According to the twelfth embodiment having the aforementioned structure, effects similar to those of the aforementioned tenth embodiment can be attained such that it is possible to suppress development of leakage current resulting from current flowing to the regions 228 having concentrated dislocations.

Fabrication processes for the nitride-based semiconductor laser device according to the twelfth embodiment are described with reference to FIGS. 49 and 50.

First, layers and films up to an n-side electrode 232 are formed through fabrication processes similar to those of the tenth embodiment shown in FIGS. 40 to 43.

Figure 50:
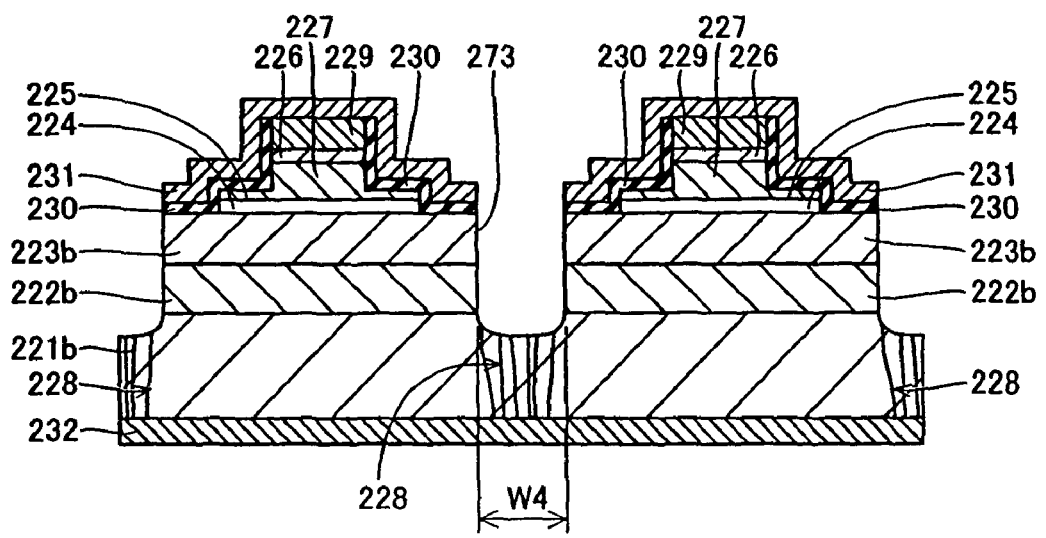
FIG. 50 is a sectional view for illustrating a fabrication process for the nitride-based semiconductor laser device according to the twelfth embodiment shown in FIG. 49.

As shown in FIG. 50, the dicing at the boundary between the nitride-based semiconductor laser device and each adjacent device partially removes regions 228 having concentrated dislocations from the front surface of the p-side electrode 231 up to a prescribed depths of the n-type GaN substrate 221b including the insulator films 230, the n-type cladding layer 223b and the n-type layer 222b. Thus, a trench 273 having a width W4 (about 60 µm, for example) larger than that of the regions 228 having concentrated dislocations is formed on each region 228 of the device having concentrated dislocations. Thereafter the device is separated into each chip along the trench 273. Thus, the nitride-based semiconductor laser device according to the twelfth embodiment is formed as shown in FIG. 49.

In the fabrication processes according to the twelfth embodiment, as hereinabove described, the trench 273 for separating the device into each chip by dicing is so formed that the width W4 of the trench 273 can be rendered larger than that of the regions 228 having concentrated dislocations, whereby the regions 228 having concentrated dislocations can be easily partially removed similarly to the fabrication processes according to the aforementioned eleventh embodiment. Consequently, fabrication steps can be simplified.

Thirteenth Embodiment

Figure 51:
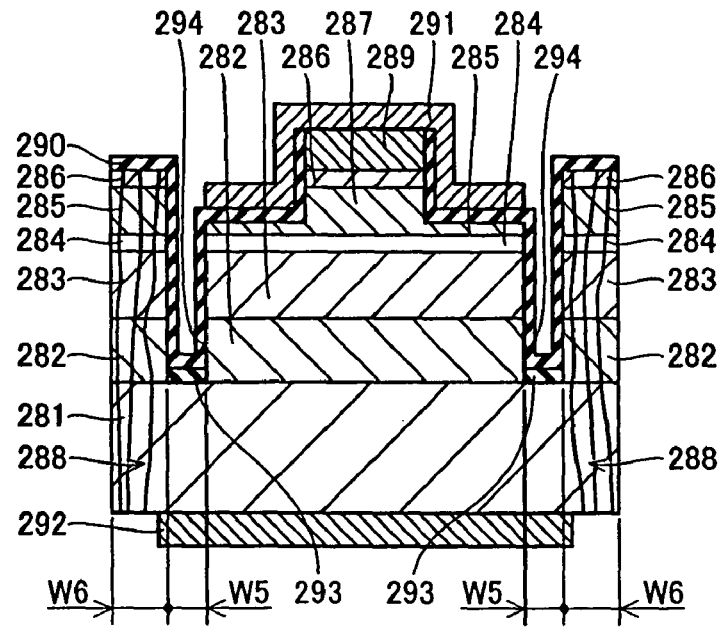
FIG. 51 is a sectional view showing the structure of a nitride-based semiconductor laser device (semiconductor device) according to a thirteenth embodiment of the present invention.

Referring to FIG. 51, selective growth masks 293 are formed on regions located inward beyond regions 288 having concentrated dislocations on an n-type GaN substrate 281 in a nitride-based semiconductor laser device according to a thirteenth embodiment of the present invention dissimilarly to the aforementioned tenth to twelfth embodiments.

In the nitride-based semiconductor laser device according to the thirteenth embodiment, the regions 288 having concentrated dislocations, extending from the back surface to the front surface of the n-type GaN substrate 281 with a width of about 10 µm, are formed in the vicinity of ends of the n-type GaN substrate 281 in a period of about 400 µm in a striped (elongated) shape. The n-type GaN substrate 281 has a thickness and a composition similar to those of the n-type GaN substrate 221 in the aforementioned tenth embodiment. The n-type GaN substrate 281 is an example of the "substrate" in the present invention.

Figure 52:
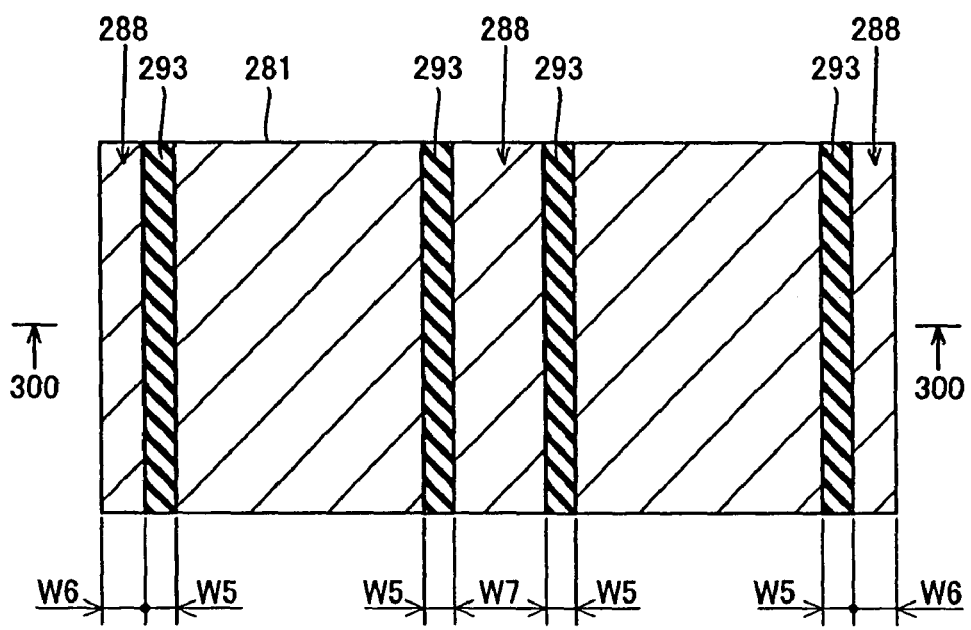
FIGS. 52 to 55 are plan views and sectional views for illustrating fabrication processes for the nitride-based semiconductor laser device according to the thirteenth embodiment shown in FIG. 51.

According to the thirteenth embodiment, the striped (elongated) selective growth masks 293 are formed on the regions located inward beyond the regions 288 having concentrated dislocations on the n-type GaN substrate 281, as shown in FIG. 52. The selective growth masks 293 have a width W5 (about 3 µm) smaller than that of the regions 288 having concentrated dislocations. The interval W6 between each end of the device and an end of each selective growth mask 293 is about 30 µm. The selective growth masks 293 are examples of the "first selective growth mask" in the present invention.

As shown in FIG. 51, n-type layers 282, n-type cladding layers 283, emission layers 284, p-type cladding layers 285 and p-type contact layers 286 are successively formed on regions of the n-type GaN substrate 281 other than those formed with the selective growth masks 293. The central p-type cladding layer 285 has a projecting portion, and the p-type contact layers 286 are formed on regions of the p-type cladding layers 285 other than flat portions. The projecting portion of the central p-type cladding layer 285 located inward beyond the selective growth masks 293 and the central p-type contact layer 286 formed on the projecting portion of this p-type cladding layer 285 constitute a ridge portion 287. Dislocations of the n-type GaN substrate 281 are propagated to the n-type layers 282, the n-type cladding layers 283, the emission layers 284, the p-type cladding layers 285 and the p-type contact layers 286 located outward beyond the selective growth masks 293, thereby forming the regions 288 having concentrated dislocations. The n-type layers 282, the n-type cladding layers 283, the emission layers 284, the p-type cladding layers 285 and the p-type contact layers 286 have thicknesses and compositions similar to those of the n-type layer 222, the n-type cladding layer 223, the emission layer 224, the p-type cladding layer 225 and the p-type contact layer 226 in the aforementioned tenth embodiment respectively. The n-type layers 282, the n-type cladding layers 283, the emission layers 284, the p-type cladding layers 285 and the p-type contact layers 286 are examples of the "semiconductor element layer" in the present invention.

According to the thirteenth embodiment, recess portions 294 are formed between the nitride-based semiconductor layers 282 to 286 located on the region of the n-type GaN substrate 281 located inward beyond the regions 288 having concentrated dislocations and the nitride-based semiconductor layers 282 to 286 located on the regions 288 having concentrated dislocations on the n-type GaN substrate 281.

A p-side ohmic electrode 289 is formed on the central p-type contact layer 286 constituting the ridge portion 287. Insulator films 290 are formed to cover regions other than the upper surface of the p-side ohmic electrode 289. A p-side pad electrode 291 is formed on surface portions of the insulator films 290 located inward beyond the recess portions 294, to be in contact with the upper surface of the p-side ohmic electrode 289. The p-side ohmic electrode 289, the insulator films 290 and the p-side pad electrode 291 have thicknesses and compositions similar to those of the p-side ohmic electrode 229, the insulator films 230 and the p-side pad electrode 231 in the aforementioned tenth embodiment respectively. The p-side ohmic electrode 289 is an example of the "front electrode" in the present invention.

An n-side electrode 292 is formed on the back surface of the n-type GaN substrate 281 to be in contact with the region of the back surface of the n-type GaN substrate 281 other than the regions 288 having concentrated dislocations. The n-side electrode 292 has a thickness and a composition similar to those of the n-side electrode 232 in the aforementioned tenth embodiment.

According to the thirteenth embodiment, as hereinabove described, the selective growth masks 293 are formed on the regions of the n-type GaN substrate 281 located inward beyond the regions 288 having concentrated dislocations so that no nitride-based semiconductor layers 282 to 286 are grown on the selective growth masks 293 when the nitride-based semiconductor layers 282 to 286 are grown on the n-type GaN substrate 281, whereby the recess portions 294 can be formed between the nitride-based semiconductor layers 282 to 286 formed on the region of the n-type GaN substrate 281 located inward beyond the regions 288 having concentrated dislocations and the nitride-based semiconductor layers 282 to 286 formed on the regions 288 having concentrated dislocations on the n-type GaN substrate 281. Therefore, the recess portions 294 can part the nitride-based semiconductor layers 282 to 286 formed with the regions 288 having concentrated dislocations and the nitride-based semiconductor layers 282 to 286 formed with no regions 288 having concentrated dislocations from each other. Thus, it is possible to suppress development of leakage current resulting from current flowing to the regions 288 having concentrated dislocations by forming the p-side ohmic electrode 289 on the central p-type contact layer 286 located inward beyond the selective growth masks 293. Consequently, optical output can be stabilized when the device is subjected to constant current driving, whereby operations of the nitride-based semiconductor layer device can be stabilized. Further, the recess portions 294 part the nitride-based semiconductor layers 282 to 286 formed with the regions 288 having concentrated dislocations and the nitride-based semiconductor layers 282 to 286 formed with no regions 288 having concentrated dislocations from each other so that the regions 288 having concentrated dislocations can be inhibited from absorbing light emitted from the central emission layer 284 located on the region located inward beyond the regions 288 having concentrated dislocations. Thus, light absorbed by the regions 288 having concentrated dislocations can be inhibited from reemission at an unintended wavelength, whereby deterioration of color purity resulting from such reemission can be suppressed.

Fabrication processes for the nitride-based semiconductor laser device according to the thirteenth embodiment are described with reference to FIGS. 51 to 53.

Figure 53:
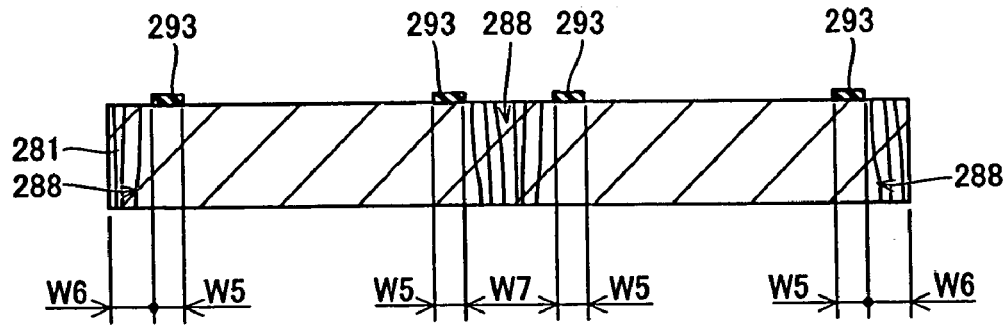

First, the n-type GaN substrate 281 is formed through fabrication processes similar to those of the first embodiment shown in FIGS. 3 to 6, and the striped (elongated) selective growth masks 293 of SiN having a thickness of about 200 nm are thereafter formed on prescribed regions of the n-type GaN substrate 281 by plasma CVD, as shown in FIGS. 52 and 53. More specifically, the selective growth masks 293 having the width W5 of about 3 μm are formed on the n-type GaN substrate 281 at an interval W7 (W6×2) of about 60 μm to hold the regions 288 having concentrated dislocations therebetween.

Figure 54:
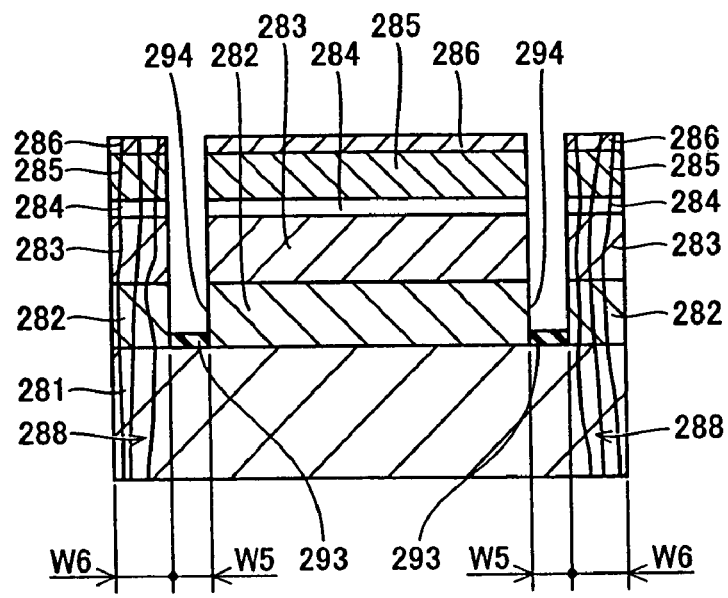

As shown in FIG. 54, the n-type layers 282, the n-type cladding layers 283, the emission layers 284, the p-type cladding layers 285 and the p-type contact layers 286 are successively formed on the n-type GaN substrate 281 formed with the selective growth masks 293 by MOCVD.

According to the thirteenth embodiment, no nitride-based semiconductor layers 282 to 286 are formed on the selective growth masks 293 at this time, whereby the recess portions 294 are formed between the nitride-based semiconductor layers 282 to 286 formed on the region of the n-type GaN substrate 281 located inward beyond the regions 288 having concentrated dislocations and the nitride-based semiconductor layers 282 to 286 formed on the regions 288 having concentrated dislocations on the n-type GaN substrate 281. Further, dislocations of the n-type GaN substrate 281 are propagated to the nitride-based semiconductor layers 282 to 286 formed on the regions 288 having concentrated dislocations on the n-type GaN substrate 281, thereby forming the regions 288 having concentrated dislocations to extend from the back surface of the n-type GaN substrate 281 to the upper surface of the p-type contact layer 286.

Figure 55:
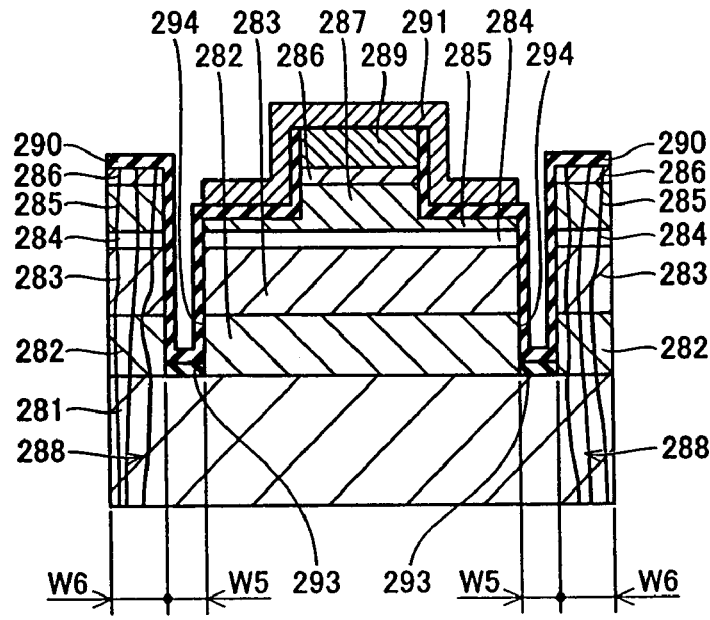

As shown in FIG. 55, the p-side ohmic electrode 289 is formed on the central p-type contact layer 286 located inward beyond the recess portions 294 while forming the ridge portion 287 constituted of the projecting portion of the central p-type cladding layer 285 and the central p-type contact layer 286 through fabrication processes similar to those of the first embodiment shown in FIGS. 8 to 11. The insulator films 290 are formed to cover the regions other than the upper surface of the p-side ohmic electrode 289, and the p-side pad electrode 291 is thereafter formed on the surface portions of the insulator films 290 located inward beyond the recess portions 294 to be in contact with the upper surface of the p-side ohmic electrode 289. Thereafter the back surface of the n-type GaN substrate 281 is polished.

Finally, a metal layer (not shown) for constituting the n-side electrode 292 is formed on the overall back surface of the n-type GaN substrate 281 by vacuum evaporation, and portions of the metal layer located on the regions 288 having concentrated dislocations are removed thereby forming the nitride-based semiconductor laser device according to the thirteenth embodiment, as shown in FIG. 51.

In the fabrication processes according to the thirteenth embodiment, as hereinabove described, the selective growth masks 293 having the width W5 smaller than that of the regions 288 having concentrated dislocations are formed on the regions of the n-type GaN substrate 281 located inward beyond the regions 288 having concentrated dislocations so as to reduce the total quantity of source gas reaching the overall surfaces of the selective growth masks 293, thereby reducing the quantity of the material gas or decomposites thereof diffusing from the surface of the selective growth mask 293 into the front surface under the growth of the nitride-based semiconductor layers 282 to 286 located in the vicinity of the selective growth masks 293. Thus, amount of increase of the quantity of the material gas or decomposites thereof supplied to the front surface under the growth of the nitride-based semiconductor layers 282 to 286 located in the vicinity of the selective growth masks 293 can be so reduced that the atoms constituting the material gas supplied to the front surfaces of the grown nitride-based semiconductor layers 282 to 286 located in the vicinity of the selective growth masks 293 can be reduced, whereby the thicknesses of the nitride-based semiconductor layers 282 to 286 located in the vicinity of the selective growth masks 293 can be inhibited from increase. Consequently, the thicknesses of the nitride-based semiconductor layers 282 to 286 can be inhibited from inequality between positions close to and separated from the selective growth masks 293.

Fourteenth Embodiment

Figure 56:
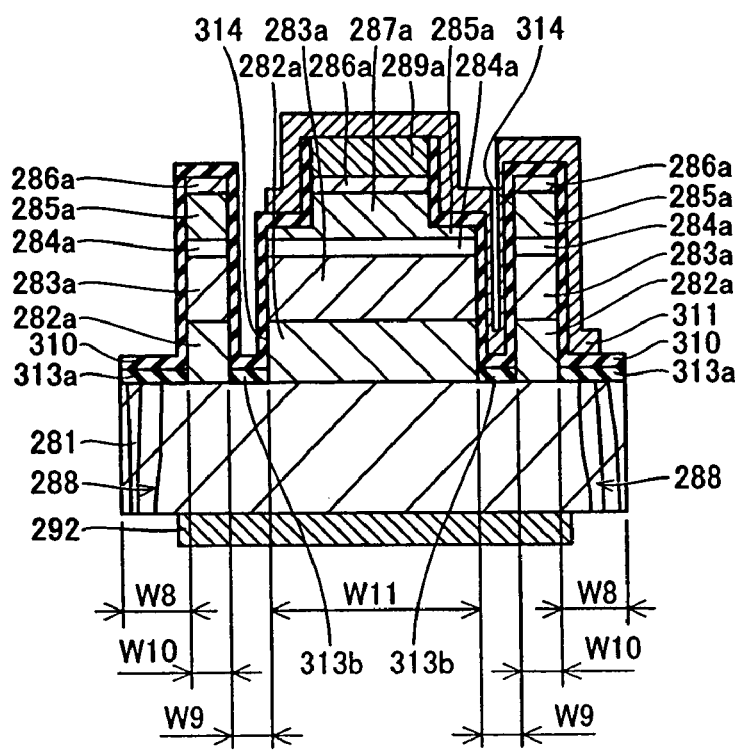
FIG. 56 is a sectional view showing the structure of a nitride-based semiconductor laser device (semiconductor device) according to a fourteenth embodiment of the present invention.

Referring to FIG. 56, selective growth masks 313a and 313b of SiN having thicknesses of about 100 nm are formed on regions 288 having concentrated dislocations on an n-type GaN substrate 281 and regions located inward beyond the regions 288 having concentrated dislocations in a nitride-based semiconductor laser device according to a fourteenth embodiment of the present invention, dissimilarly to the aforementioned thirteenth embodiment. The selective growth masks 313a have a width W8 (about 188 μm) larger than that of the regions 288 having concentrated dislocations. The selective growth masks 313b have a width W9 (about 2 μm) smaller than that of the regions 288 having concentrated dislocations. These selective growth masks 313b are arranged at an interval W10 of about 5 μm from the selective growth masks 313a. The interval W11 between the selective growth masks 313b is about 10 μm. The selective growth masks 313a are examples of the "second selective growth mask" in the present invention, and the selective growth masks 313b are examples of the "first selective growth mask" in the present invention.

N-type layers 282a, n-type cladding layers 283a, emission layers 284a, p-type cladding layers 285a and p-type contact layers 286a are successively formed on regions of the n-type GaN substrate 281 other than those formed with the selective growth masks 313a and 313b. The central p-type cladding layer 285a has a projecting portion, while the p-type contact layers 286a are formed on regions of the p-type cladding layers 285a other than flat portions. The projecting portion of the central p-type cladding layer 285a located inward beyond the selective growth masks 313b and the central p-type contact layer 286a formed on the projecting portion of this p-type cladding layer 285a constitute a ridge portion 287a. The emission layers 284a and the flat portions of the central p-type cladding layer 285a have widths (about 10.5 μm) smaller than that of the n-type cladding layers 285a.

According to the fourteenth embodiment, the nitride-based semiconductor layers 282a to 286a formed on the n-type GaN substrate 281 are formed with no regions 288 having concentrated dislocations. Further, recess portions 314 are formed between the n-type semiconductor layers 282a to 286a located on the regions 288 having concentrated dislocations on the n-type GaN substrate 281 and the nitride-based semiconductor layers 282a to 286a located on the central portion of the n-type GaN substrate 281.

A p-side ohmic electrode 289a is formed on the central p-type contact layer 286a constituting the ridge portion 287a. Insulator films 310 are formed to cover regions other than the upper surface of the p-side ohmic electrode 289a. A p-side pad electrode 311 is formed on prescribed regions of the front surfaces of the insulator films 310 to be in contact with the upper surface of the p-side ohmic electrode 289a. An end of the p-side pad electrode 311 is arranged on the insulator film 310 located on one region 288 having concentrated dislocations while the other end thereof is arranged on the insulator film 310 located on one flat portion of the central p-type cladding layer 285a. The n-type GaN substrate 281, the n-type layers 282a, the n-type cladding layers 283a, the emission layers 285a, the p-type cladding layers 285a, the p-type contact layers 286a and the p-side ohmic electrode 289a have thicknesses and compositions similar to those of the n-type GaN substrate 221, the n-type layer 222, the n-type cladding layer 223, the emission layer 224, the p-type cladding layer 225, the p-type contact layer 226 and the p-side ohmic electrode 229 in the aforementioned tenth embodiment respectively. The insulator films 310 and the p-side pad electrode 311 also have thicknesses and compositions similar to those of the insulator films 230 and the p-side pad electrode 231 in the aforementioned tenth embodiment respectively.

An n-side electrode 292 is formed on the back surface of the n-type GaN substrate 281 to be in contact with a region of the back surface of the n-type GaN substrate 281 other than the regions 288 having concentrated dislocations, similarly to the aforementioned thirteenth embodiment.

According to the fourteenth embodiment, as hereinabove described, the selective growth masks 313a are formed on the regions 288 having concentrated dislocations on the n-type GaN substrate 281 so that no nitride-based semiconductor layers 282a to 286a are grown on the selective growth masks 313a when the nitride-based semiconductor layers 282a to 286a are grown on the n-type GaN substrate 281, whereby the nitride-based semiconductor layers 282a to 286a can be inhibited from formation of the regions 288 having concentrated dislocations. Thus, it is possible to suppress development of leakage current resulting from current flowing to the regions 288 having concentrated dislocations. Consequently, optical output can be stabilized when the device is subjected to constant current driving, whereby operations of the nitride-based semiconductor laser device can be stabilized. Further, the quantity of current flowing to the regions 288 having concentrated dislocations can be so reduced that it is possible to reduce unnecessary emission from the regions 288 having concentrated dislocations.

Fabrication processes for the nitride-based semiconductor laser device according to the fourteenth embodiment are described with reference to FIGS. 56 to 60.

Figure 57:
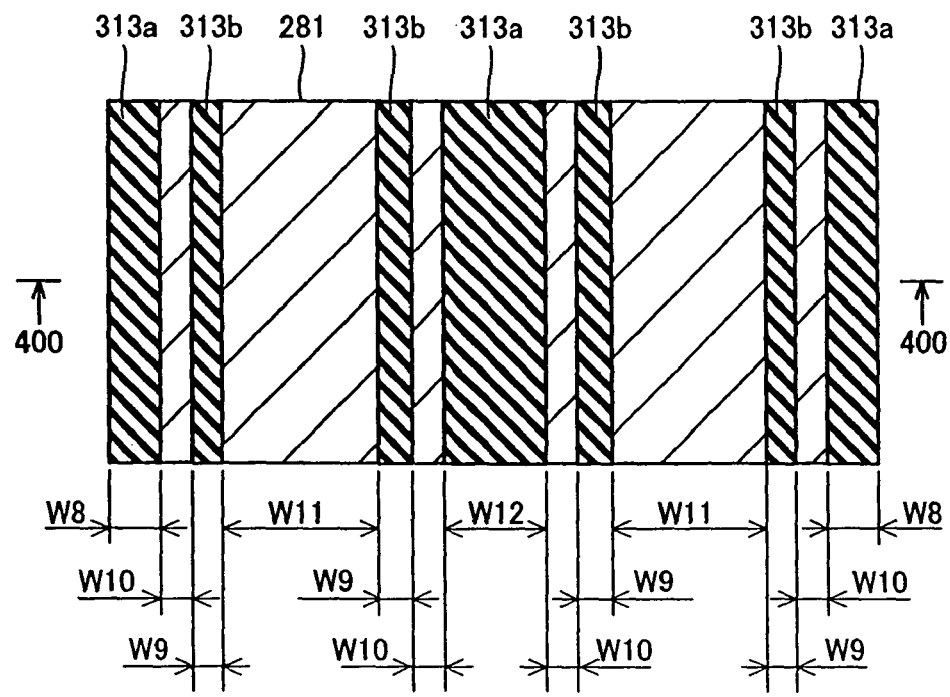
FIGS. 57 to 60 are plan views and sectional views for illustrating fabrication processes for the nitride-based semiconductor laser device according to the fourteenth embodiment shown in FIG. 56.
Figure 58:
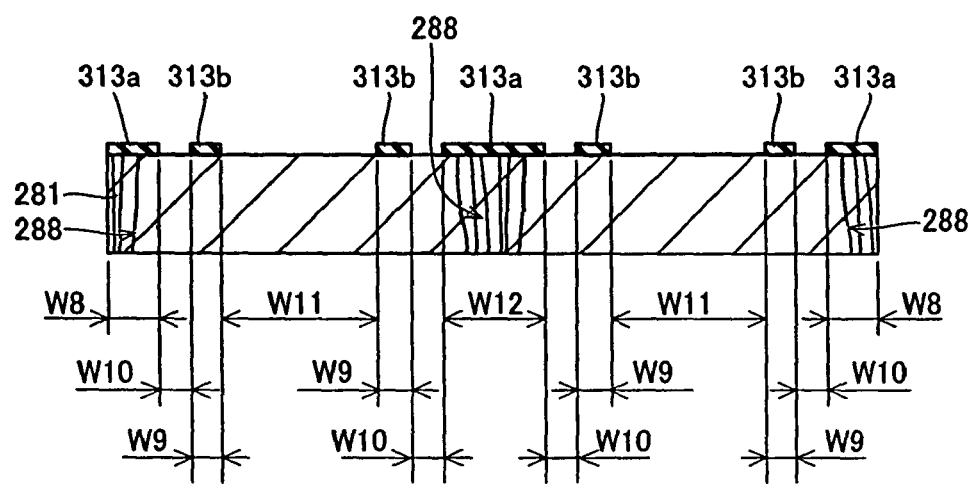

As shown in FIGS. 57 and 58, the n-type GaN substrate 281 is formed through fabrication processes similar to those of the first embodiment shown in FIGS. 3 to 6, and the striped (elongated) selective growth masks 313a and 313b of SiN having the thickness of about 100 nm are thereafter formed on prescribed regions of the n-type GaN substrate 281 by plasma CVD. More specifically, the selective growth masks 313a having a width W12 (W8×2) of about 376 µm are formed on the regions 288 having concentrated dislocations on the n-type GaN substrate 281. Further, the selective growth masks 313b having the width W9 of about 2 µm are formed on the n-type GaN substrate 281 at the interval W10 of about 5 µm from the selective growth masks 313a. The interval W11 between the selective growth masks 313b is set to about 10 µm.

Figure 59:
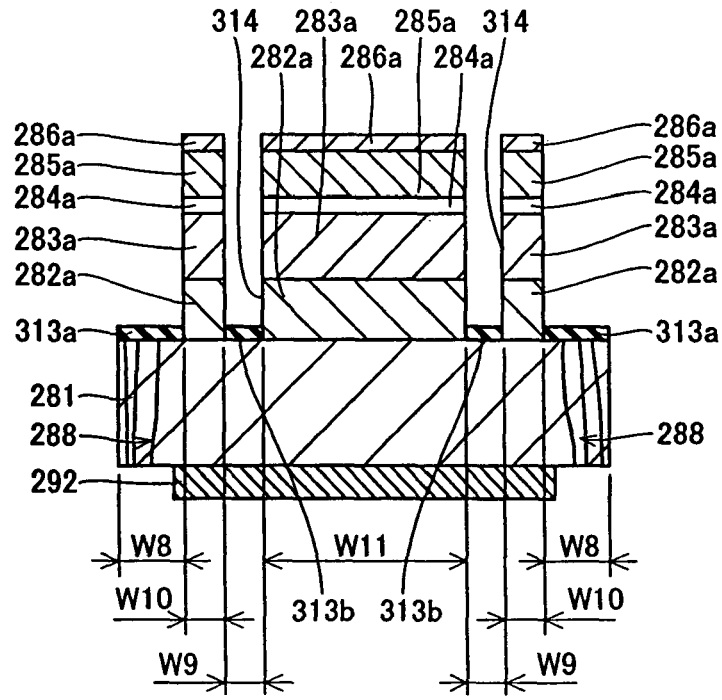

As shown in FIG. 59, the n-type layers 282a, the n-type cladding layers 283a, the emission layers 284a, the p-type cladding layers 285a and the p-type contact layers 286a are successively formed by MOCVD on the n-type GaN substrate 281 formed with the selective growth masks 313a and 313b.

At this time, no nitride-based semiconductor layers 282a to 286a are formed on the selective growth masks 313a and 313b in the fourteenth embodiment. Therefore, the nitride-based semiconductor layers 282a to 286a are formed with no regions 288 having concentrated dislocations. Further, the recess portions 314 are formed between the n-type semiconductor layers 282a to 286a located on the regions 288 having concentrated dislocations on the n-type GaN substrate 281 and the nitride-based semiconductor layers 282a to 286a located on the central portion of the n-type GaN substrate 281.

Figure 60:
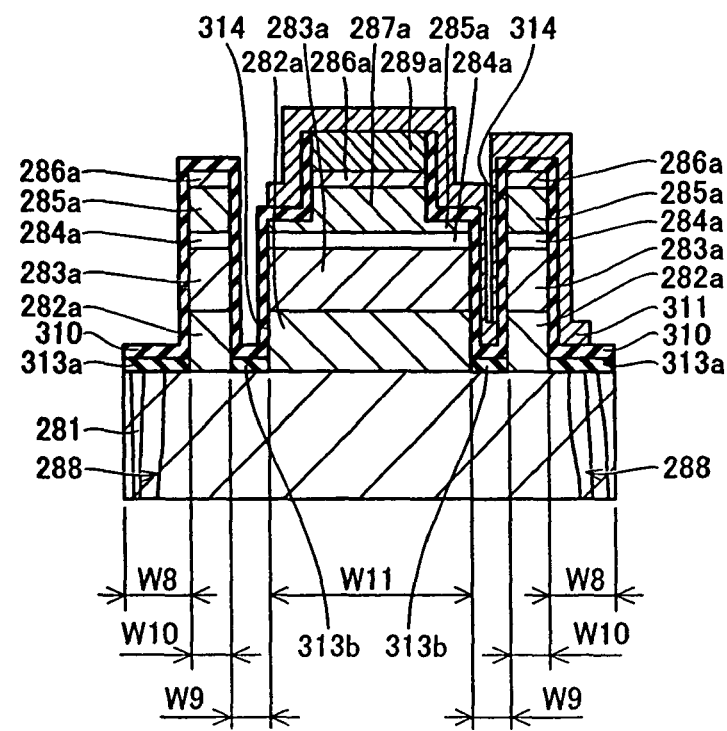

As shown in FIG. 60, the p-side ohmic electrode 289a is formed on the central p-type contact layer 286a located inward beyond the recess portions 314 while forming the ridge portion 287a constituted of the projecting portion of the central p-type cladding layer 285a and the central p-type contact layer 286a through fabrication processes similar to those of the first embodiment shown in FIGS. 8 to 11. The insulator films 310 are formed to cover the regions other than the upper surface of the p-side ohmic electrode 289a, and the p-side pad electrode 311 is thereafter formed on the prescribed regions of the front surfaces of the insulator films 310 to be in contact with the upper surface of the p-side ohmic electrode 289a. Thereafter the back surface of the n-type GaN substrate 281 is polished.

Finally, a metal layer (not shown) for constituting the n-side electrode 292 is formed on the overall back surface of the n-type GaN substrate 281 by vacuum evaporation, and portions of the metal layer located on the regions 288 having concentrated dislocations are removed thereby forming the nitride-based semiconductor laser device according to the fourteenth embodiment as shown in FIG. 56.

In the fabrication processes according to the fourteenth embodiment, as hereinabove described, the selective growth masks 313b having the width W9 smaller than that of the regions 288 having concentrated dislocations are formed on the regions located inward beyond the regions 288 having concentrated dislocations on the n-type GaN substrate 281 for reducing the total quantity of material gas reaching the overall front surfaces of the selective growth masks 313b when growing the nitride-based semiconductor layers 282a to 286a, thereby reducing the quantity of the material gas or decomposites thereof surface-diffusing from the front surfaces of the selective growth masks 313b into the front surfaces under the growth of the nitride-based semiconductor layers 282a to 286a located in the vicinity of the selective growth masks 313b. Thus, amount of increase of the quantity of the material gas or the decomposites thereof supplied to the front surfaces under the growth of the grown nitride-based semiconductor layers 282a to 286a located in the vicinity of the selective growth masks 313b can be so reduced that the nitride-based semiconductor layers 282a to 286a located in the vicinity of the selective growth masks 313b can be inhibited from increase of the thicknesses. Consequently, the thicknesses of the nitride-based semiconductor layers 282a to 286a can be inhibited from inequality between positions close to and separated from the selective growth masks 313b.

A fabrication process for a nitride-based semiconductor laser device according to a modification of the fourteenth embodiment is described with reference to FIG. 61.

Figure 61:
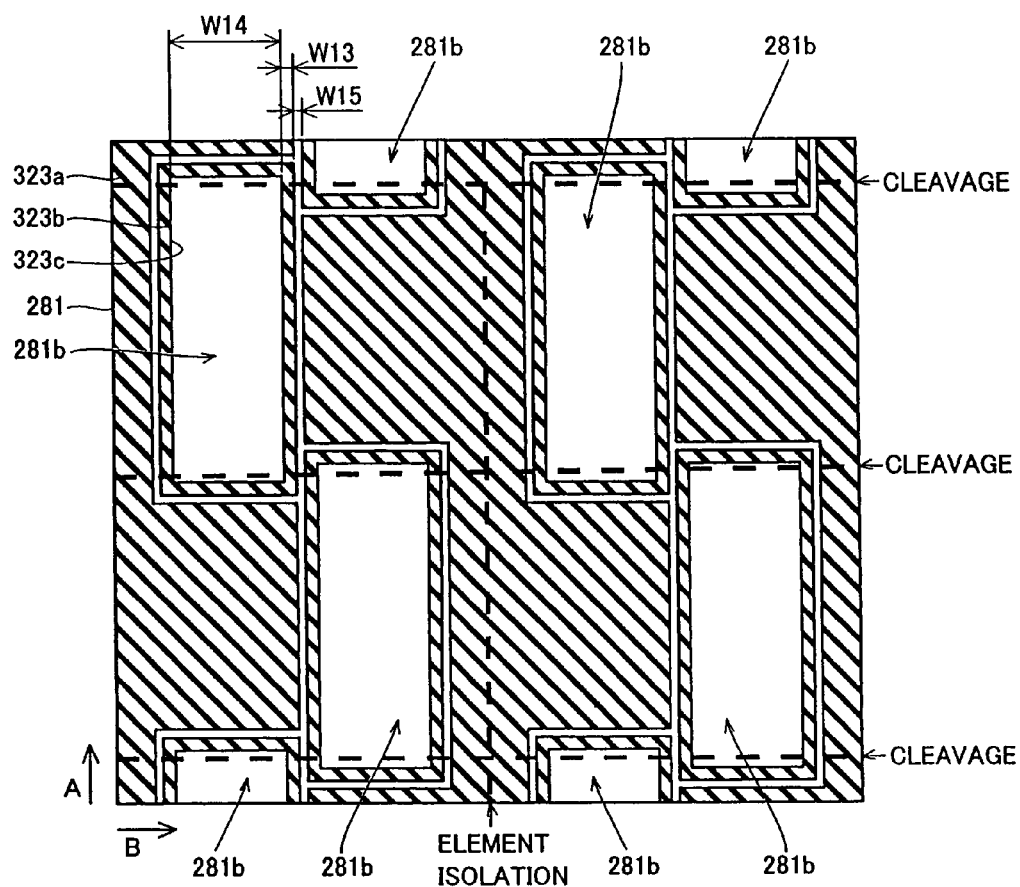
FIG. 61 is a plan view for illustrating a fabrication process for a nitride-based semiconductor laser device according to a modification of the fourteenth embodiment.

In the fabrication process for the nitride-based semiconductor laser device according to the modification of the fourteenth embodiment, selective growth masks 323b having a width W13 (about 3 μm) smaller than that of regions (not shown) having concentrated dislocations are formed on an n-type GaN substrate 281 to enclose element forming regions 281b, as shown in FIG. 61. At this time, the selective growth masks 323b are so formed as to arrange a plurality of openings 323c (the element forming regions 281b) at a prescribed pitch along an element isolation direction (direction A in FIG. 61) while alternately arranging those of the openings 323c (the element forming regions 281b) adjacent to each other in a cleavage direction (direction B in FIG. 61). The width W14 of the openings 323c (the element forming regions 281b) along the direction B is set to about 12 μm. Further, selective growth masks 323a are formed on the overall region at an interval W15 of about 8 μm from the selective growth masks 313b.

Thereafter nitride-based semiconductor layers (not shown) are formed followed by formation of insulator masks (not shown) and respective electrodes (not shown), similarly to the fabrication processes for the nitride-based semiconductor laser device according to the aforementioned fourteenth embodiment.

In the fabrication process for the nitride-based semiconductor laser device according to the modification of the fourteenth embodiment, as hereinabove described, the selective growth masks 323b having the plurality of openings 323c arranged at the prescribed pitch along the direction A with alternate arrangement of those adjacent to each other in the direction B are formed on the n-type GaN substrate 281 followed by formation of the nitride-based semiconductor layers on the regions of the n-type GaN substrate 281 other than those formed with the selective growth masks 323b so that no nitride-based semiconductor layers are formed on the selective growth masks 323b, whereby the nitride-based semiconductor layers are formed only on the regions of the n-type GaN substrate 281 corresponding to the openings 323c. Thus, the distances of the nitride-based semiconductor layers formed on the regions of the n-type GaN substrate 281 corresponding to the openings 323c in the direction A are smaller than those of nitride-based semiconductor layers continuously formed on the n-type GaN substrate 281 in the direction A, whereby cracking can be suppressed due to the reduction of the distances in the direction A. In this case, those of the openings 323c (the element forming regions 281b) adjacent to each other along the direction B are so alternately arranged that the element forming regions 281b can be alternately adjacently arranged also in the direction A. Thus, the element forming regions 281b equivalent to those in a case of forming nitride-based semiconductor layers on the n-type GaN substrate 281 continuously in the direction A can be obtained, whereby the n-type GaN substrate 281 can be inhibited from reduction of availability while preventing cracking.

Fifteenth Embodiment

Figure 62:
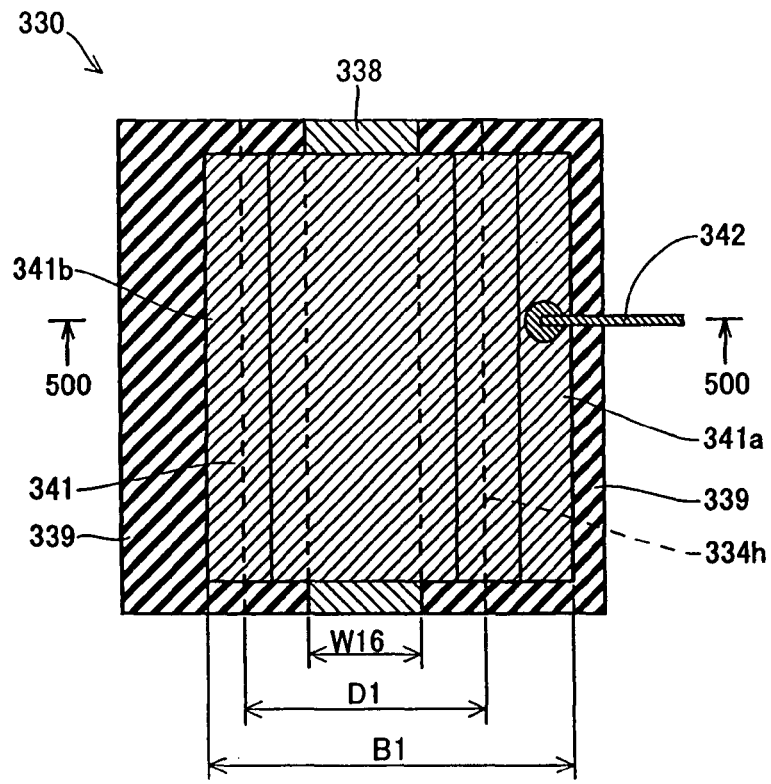
FIG. 62 is a plan view showing the structure of a nitride-based semiconductor laser device according to a fifteenth embodiment of the present invention.
Figure 63:
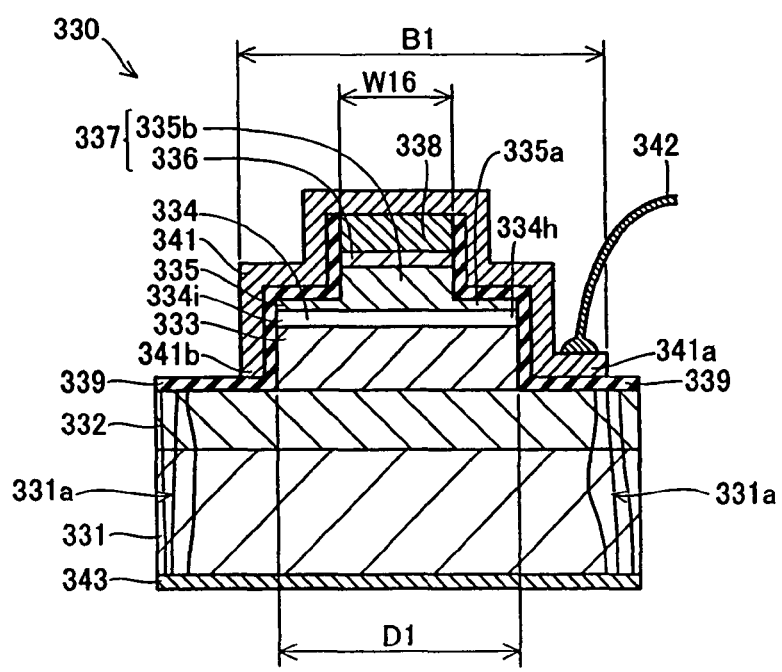
FIG. 63 is a sectional view taken along the line 500-500 in FIG. 62.
Figure 64:
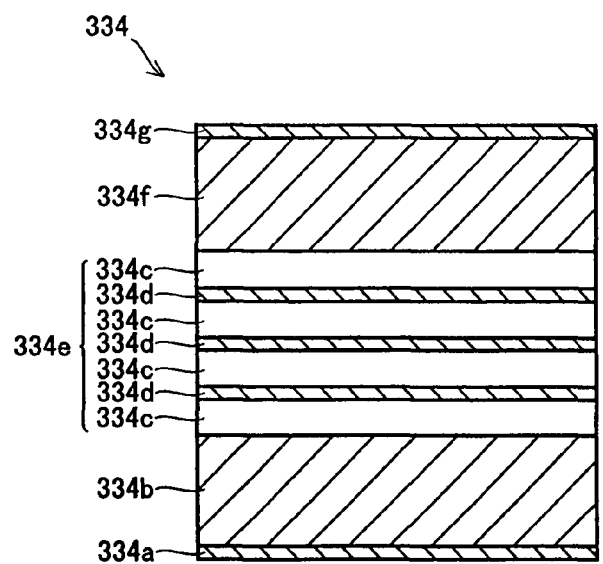
FIG. 64 is a sectional view detailedly showing an emission layer of the nitride-based semiconductor laser device according to the fifteenth embodiment shown in FIGS. 62 and 63.

Referring to FIGS. 62 to 64, regions 331a having concentrated dislocations are partially removed up to an n-type cladding layer 331 in a nitride-based semiconductor laser device 330 according to a fifteenth embodiment of the present invention while the nitride-based semiconductor laser device 330 is mounted in a semiconductor laser, dissimilarly to the aforementioned tenth to fourteenth embodiments.

In the nitride-based semiconductor laser device 330 according to the fifteenth embodiment, an n-type layer 332 having a thickness of about 100 nm and consisting of n-type GaN doped with Si having an atomic density of about $5 \times 10^{18}$ cm$^{-3}$ is formed on an n-type GaN substrate 331 of about 100 μm in thickness doped with oxygen having a carrier concentration of about $5 \times 10^{18}$ cm$^{-3}$, as shown in FIG. 63. The n-type GaN substrate 331 has a wurtzite structure, with a front surface of the (0001) plane. The regions 331a having concentrated dislocations are formed in a striped (elongated) shape in the vicinity of both ends of the n-type GaN substrate 331 and the n-type layer 332 to extend from the back surface of the n-type GaN substrate 331 up to the upper surface of the n-type layer 332 with a width of about 10 μm. The n-type GaN substrate 331 is an example of the "substrate" in the present invention, and the n-type layer 332 is an example of the "semiconductor element layer" or the "first semiconductor layer" in the present invention.

According to the fifteenth embodiment, the n-type cladding layer 333 having a width D1 (about 7.5 μm) smaller than that of the n-type GaN substrate 331, an emission layer 334 and a p-type cladding layer 335 are successively formed on a region of the n-type layer 332 other than the regions 331a having concentrated dislocations.

The n-type cladding layer 333 has a thickness of about 400 nm, and consists of n-type Al$_{0.05}$Ga$_{0.95}$N doped with Si having an atomic density of about $5 \times 10^{18}$ cm$^{-3}$ and a carrier concentration of about $5 \times 10^{18}$ cm$^{-3}$. The n-type cladding layer 333 is an example of the "semiconductor element layer" or the "first semiconductor layer" in the present invention.

As shown in FIG. 64, the emission layer 334 is constituted of an n-type carrier blocking layer 334a, an n-type light guide layer 334b, an MQW active layer 334e, an undoped light guide layer 334f and a p-type cap layer 334g. The n-type carrier blocking layer 334a has a thickness of about 5 nm, and consists of n-type Al$_{0.1}$Ga$_{0.9}$N doped with Si having an atomic density of about $5 \times 10^{18}$ cm$^{-3}$ and a carrier concentration of about $5 \times 10^{18}$ cm$^{-3}$. The n-type light guide layer 334b has a thickness of about 100 nm, and consists of n-type GaN doped with Si having an atomic density of about $5 \times 10^{18}$ cm$^{-3}$ and a carrier concentration of about $5 \times 10^{18}$ cm$^{-3}$. The MQW active layer 334e is formed by alternately stacking four barrier layers 334c of undoped In$_{0.05}$Ga$_{0.95}$N each having a thickness of about 20 nm and three well layers 334d of undoped In$_{0.15}$Ga$_{0.85}$N each having a thickness of about 3 nm. The emission layer 334 is an example of the "semiconductor element layer" in the present invention, and the MQW active layer 334e is an example of the "active layer" in the present invention. The undoped light guide layer 334f has a thickness of about 100 nm and consists of undoped GaN. The p-type cap layer 334g has a thickness of about 20 nm, and consists of p-type Al$_{0.1}$Ga$_{0.9}$N doped with Mg having an atomic density of about $4 \times 10^{19}$ cm$^{-3}$ and a carrier concentration of about $5 \times 10^{17}$ cm$^{-3}$.

As shown in FIG. 63, the p-type cladding layer 335 consists of p-type Al$_{0.05}$Ga$_{0.95}$N doped with Mg having an atomic density of about $4 \times 10^{19}$ cm$^{-3}$ and a carrier concentration of about $5 \times 10^{17}$ cm$^{-3}$. This p-type cladding layer 335 includes a flat portion 335a and a projecting portion 335b formed to project upward from the center of the flat portion 335a. The flat portion 335a of the p-type cladding layer 335 has a width D1 (about 7.5 μm) smaller than that of the aforementioned n-type GaN substrate 331 and identical to that of the emission layer 334 with a thickness of about 100 nm. The projecting portion 335b of the p-type cladding layer 335 has a width W16 (about 1.5 μm) smaller than that of the emission layer 334 and a height of about 30 nm from the upper surface of the flat portion 335a. The p-type cladding layer 335 is an example of the "semiconductor element layer" or the "second semiconductor layer" in the present invention.

A p-type contact layer 336 having a thickness of about 10 nm and consisting of p-type GaN doped with Mg having an atomic density of about $4\times10^{19}$ cm$^{-3}$ and a carrier concentration of about $5\times10^{17}$ cm$^{-3}$ is formed on the projecting portion 335b of the p-type cladding layer 335. The projecting portion 335b of the p-type cladding layer 335 and the p-type contact layer 336 constitute a striped (elongated) ridge portion 337 defining a current path region. A p-side ohmic electrode 338 constituted of a Pt layer having a thickness of 5 nm, a Pd layer having a thickness of about 100 nm and an Au layer having a thickness of about 150 nm in ascending order is formed on the p-type contact layer 336 constituting the ridge portion 337. The p-type cladding layer 335 and the p-type contact layer 336 are examples of the "semiconductor element layer" and the "second semiconductor layer" in the present invention respectively, and the p-side ohmic electrode 338 is an example of the "front electrode" in the present invention. Insulator films 339 of SiN having a thickness of about 250 nm are formed to cover regions other than the upper surface of the p-side ohmic electrode 338.

According to the fifteenth embodiment, a p-side pad electrode 341 having a width B1 (about 150 μm) smaller than the width of the n-type GaN substrate 331 is formed on prescribed regions of the insulator films 339 to be in contact with the upper surface of the p-side ohmic electrode 338, as shown in FIGS. 62 and 63. This p-side pad electrode 341 is rectangularly formed in plan view, as shown in FIG. 62. A first end 341a of the p-side pad electrode 341 is formed on one insulator film 339 located on the upper surface of the n-type layer 332, to extend toward a region beyond that on which a first end 334h of the emission layer 334 is located. A second end 341b of the p-side pad electrode 341 is formed on the other insulator film 339 located on the side surface of the n-type cladding layer 333, to extend toward a region beyond that on which a second end 334i of the emission layer 334 is located. The first end 341a of the p-side pad electrode 341 is formed to have a wire-bondable flat surface, while the second end 341b of the p-side pad electrode 341 has no wire-bondable flat surface. Therefore, the second end 341b of the p-side pad electrode 341 has a smaller distance from the ridge portion 337 as compared with the first end 341a. The p-side pad electrode 341 is constituted of a Ti layer having a thickness of about 100 nm, a Pd layer having a thickness of about 100 nm and an Au layer having a thickness of about 3 μm in ascending order. A wire 342 is bonded onto the first end 341a of the p-side pad electrode 341, for electrically connecting the first end 341a of the p-side pad electrode 341 with an external device.

An n-side electrode 343 constituted of an Al layer having a thickness of about 10 nm, a Pt layer having a thickness of about 20 nm and an Au layer having a thickness of about 300 nm successively from the side closer to the back surface of the n-type GaN substrate 331 is formed on a region of the back surface of the n-type GaN substrate 331 other than the regions 331a having concentrated dislocations.

The structure of the semiconductor laser employing the nitride-based semiconductor laser device 330 according to the fifteenth embodiment is described with reference to FIGS. 62, 63 and 65.

Figure 65:
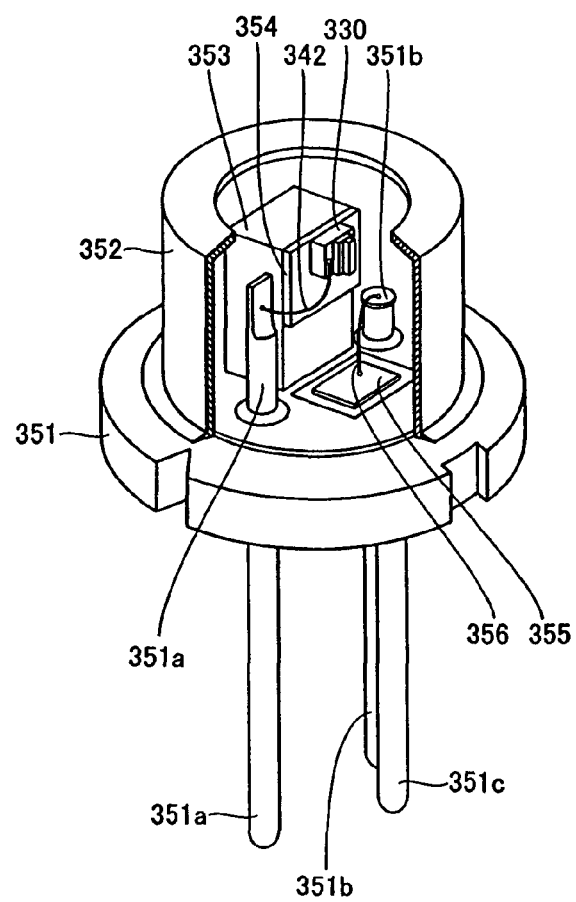
FIG. 65 is a perspective view showing the structure of a semiconductor laser employing the nitride-based semiconductor laser device according to the fifteenth embodiment shown in FIGS. 62 and 63.

As shown in FIG. 65, the semiconductor laser employing the nitride-based semiconductor laser device 330 according to the fifteenth embodiment comprises a stem 351 mounted with the nitride-based semiconductor laser device 330 and a cap 352 for hermetic sealing. The stem 351 is provided with three leads 351a to 351c, while the leads 351a and 351b project from the upper surface of the stem 351. A block 353 is provided on the upper surface of the stem 351, while a submount 354 is provided on the side surface of the block 353. The nitride-based semiconductor laser device 330 according to the fifteenth embodiment is mounted on the submount 354. More specifically, a cleavage plane of the nitride-based semiconductor laser device 330 is arranged in parallel with the upper surface of the stem 351 for emitting a laser beam perpendicularly to the upper surface of the stem 351. The wire 342 bonded to the first end 341a (see FIGS. 62 and 63) of the p-side pad electrode 341 constituting the nitride-based semiconductor laser device 330 is electrically connected with the lead 351a. A photodetector 355 is mounted on a region of the upper surface of the stem 351 opposite to the cleavage plane of the nitride-based semiconductor laser device 330. An end of a wire 356 is bonded to the photodetector 355, while the other end of the wire 356 is boned to the lead 351b. The cap 352 is welded to the upper surface of the stem 351, to cover the nitride-based semiconductor laser device 330 and the photodetector 355.

According to the fifteenth embodiment, as hereinabove described, the width D1 (about 7.5 μm) of the emission layer 334 formed on the n-type cladding layer 333 is set smaller than the width of the n-type GaN substrate 331 while the width of the p-type cladding layer 335 formed on the emission layer 334 is equalized with that of the emission layer 334 for reducing a p-n junction region between the n-type cladding layer 333 and the p-type cladding layer 335 formed through the emission layer 334, whereby the p-n junction capacitance can be reduced. Further, the width B1 (about 150 μm) of the p-side pad electrode 341 formed on the prescribed regions of the insulator films 339 is reduced below the width of the n-type GaN substrate 331, so that a parasitic capacitance formed by the p-side pad electrode 341, the insulator films 339 and the n-type layer 332 can also be reduced. Consequently, the speed of response of the nitride-based semiconductor laser device 330 can be increased.

According to the fifteenth embodiment, further, the first end 341a of the p-side electrode 341 is formed on the insulator film 339 located on the upper surface of the n-type layer 332 to extend toward the region beyond that on which the first end 334h of the emission layer 334 is located, whereby the first end 341a of the p-side pad electrode 341 extending beyond the region on which the first end 334h of the emission layer 334 is located can be electrically connected with the lead 351a also when the width B1 (about 150 μm) of the p-side pad electrode 341 is smaller than the width of the n-type GaN substrate 331. Thus, it is not difficult to connect the p-side pad electrode 341 and the lead 351a with each other despite the width B1 (about 150 μm) of the p-side pad electrode 341 smaller than the width of the n-type GaN substrate 331. Further, the p-type cladding layer 335 formed on the emission layer 334 is provided with the flat portion 335a so that the flat portion 335a can suppress excess of lateral optical confinement also when the p-type cladding layer 335 is provided with the projecting portion 335b having the width W16 (about 1.5 μm) smaller than the width of the emission layer 334, whereby a transverse mode can be stabilized. Thus, the nitride-based semiconductor laser device 330 can be inhibited from reduction of emission characteristics.

According to the fifteenth embodiment, in addition, the n-type cladding layer 333, the emission layer 334 and the p-type cladding layer 335 are formed on the region of the n-type layer 332 other than the regions 331a having concentrated dislocations so that the n-type cladding layer 333, the emission layer 334 and the p-type cladding layer 335 are provided with no regions 331a having concentrated dislocations, whereby current can be inhibited from flowing to the regions 331a having concentrated dislocations. Thus, it is possible to suppress development of leakage current resulting from current flowing to the regions 331a having concentrated dislocations. Further, the quantity of current flowing to the regions 331a having concentrated dislocations can be so suppressed that it is possible to reduce unnecessary emission from the regions 331a having concentrated dislocations. Thus, operations of the nitride-based semiconductor laser device 330 can be stabilized.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a nitride-based semiconductor laser device or a light-emitting diode device as an exemplary semiconductor device in each of the aforementioned first to fifteenth embodiments, the present invention is not restricted to this but is also applicable to a semiconductor device other than the nitride-based semiconductor laser device or the light-emitting diode device.

While an n-type GaN substrate or a sapphire substrate including a nitride-based semiconductor layer is employed as the substrate in each of the aforementioned first to fifteenth embodiments, the present invention is not restricted to this but still another substrate such as a spinel substrate, an Si substrate, an SiC substrate, a GaAs substrate, a GaP substrate, an InP substrate, a quartz substrate or a $ZrB_2$ substrate may alternatively be employed.

While the nitride-based semiconductor layers have wurtzite structures in each of the aforementioned first to fifteenth embodiments, the present invention is not restricted to this but the nitride-based semiconductors layer may alternatively have zinc blende crystal structures.

While the nitride-based semiconductor layers are grown by MOCVD in each of the aforementioned first to fifteenth embodiments, the present invention is not restricted to this but the nitride-based semiconductor layers may alternatively be grown by HVPE or gas source MBE (molecular beam epitaxy) employing TMAl, TMGa, TMIn, $NH_3$, $SiH_4$, $GeH_4$, $Cp_2Mg$ etc. as material gas.

While the front surfaces of the nitride-based semiconductor layers are formed by the (0001) planes in each of the aforementioned first to fifteenth embodiments, the present invention is not restricted to this but the nitride-based semiconductor layers may alternatively be stacked so that the front surfaces thereof are oriented in another direction. For example, the nitride-based semiconductor layers may be so stacked that the front surfaces are formed by (H, K, —H—K, 0) planes such as (1-100) planes of (11-20) planes. In this case, no piezoelectric field is generated in the MQW active layer so that recombination probability of holes and electrons can be inhibited from reduction resulting from inclination of the energy bands in the well layers. Consequently, the luminous efficiency of the MQW active layer can be improved. Further alternatively, the substrate may alternatively be inclined from the (1-100) plane or the (11-20) plane.

While the active layer has the MQW structure in each of the aforementioned first to fifteenth embodiments, the present invention is not restricted to this but a similar effect can be attained with a thick single-layered active layer having no quantum effect or an active layer having a single quantum well structure.

While the substrate is formed with the regions having concentrated dislocations in a striped shape in each of the aforementioned first to fifteenth embodiments, the present invention is not restricted to this but the substrate may alternatively be formed with regions having concentrated dislocations in a shape other than a striped shape. For example, the masks 24 may be replaced with masks interspersed with openings in the form of a triangular grid in FIG. 4, thereby forming a substrate interspersed with regions having concentrated dislocations in the form of a triangular grid. In this case, a similar effect can be attained by forming interspersal insulator films or interspersal high resistance regions in correspondence to the interspersal regions having concentrated dislocations. A similar effect can also be attained by forming recess portions to enclose the interspersal regions having concentrated dislocations.

While the n-type GaN substrate is formed by growing the n-type GaN layer on the sapphire substrate in each of the aforementioned first to eighth and tenth to fifteenth embodiments, the present invention is not restricted to this but the n-type GaN substrate may alternatively formed by growing an n-type GaN layer on a GaAs substrate. More specifically, an n-type GaN layer of about 120 μm to about 400 μm in thickness doped with oxygen is formed on a GaAs substrate by HVPE and the GaAs substrate is thereafter removed thereby forming the n-type GaN substrate. At this time, the n-type GaN substrate is preferably so formed that a carrier concentration according to Hall effect measurement is about $5 \times 10^{18}$ $cm^{-3}$ and an impurity concentration according to SIMS (secondary ion mass spectroscopy) is about $1 \times 10^{19}$ $cm^{-3}$. Further alternatively, a selective growth mask layer may be formed on a prescribed region of the GaAs substrate, thereby laterally growing the n-type GaN layer.

While the ridge portion is formed on a substantially central portion between the regions having concentrated dislocations in each of the aforementioned first, second, fourth, sixth to ninth and tenth to fifteenth embodiments, the present invention is not restricted to this but the ridge portion may alternatively be formed on a position of about 150 μm from a first end and about 250 μm from a second end. In this case, a nitride-based semiconductor located on a region deviating from the central portion between the regions having concentrated dislocations is superior in crystallinity to a nitride-based semiconductor located substantially at the central portion between the regions having concentrated dislocations, whereby the life of the nitride-based semiconductor laser device can be improved.

While the ohmic transparent electrode is formed on the n side in each of the aforementioned third and fifth embodiments, the present invention is not restricted to this but the ohmic transparent electrode may alternatively be formed on the p side.

What is claimed is:

1. A method of fabricating a semiconductor device with a back electrode, the method comprising steps of:
    forming a semiconductor element layer on a front surface of a substrate provided with a region having concentrated dislocations at least on part of a back surface of said substrate;
    after said step of forming said semiconductor element layer, forming plural front electrodes to be in contact with regions of a front surface of said semiconductor element layer corresponding to each semiconductor device,
    after said step of forming said plural front electrodes, reducing a thickness of said substrate;
    after said step of reducing said thickness of said substrate, forming said back electrode to be in contact with said back surface of said substrate; and removing said region having said concentrated dislocations after said step of forming said back electrode, wherein said step of removing said region having said concentrated dislocations includes the steps of:

forming a pair of scribing lines between said plural front electrodes apart from said region having said concentrated dislocations so as to hold said region having said concentrated dislocations therebetween; and separating said substrate and said semiconductor element layer along said scribing lines, thereby removing a portion including said region having said concentrated dislocations and ranging from said back surface to a front surface of said semiconductor element layer.

2. The method of fabricating a semiconductor device according to claim 1, wherein said portion has a substantially identical width of said back surface and said front surface of said semiconductor element layer.

3. The method of fabricating a semiconductor device according to claim 1, wherein said substrate includes a nitride-based semiconductor substrate.

4. The method of fabricating a semiconductor device according to claim 1, wherein said step of separating said substrate and said semiconductor element layer includes a step of cleaving said substrate and said semiconductor element layer.

5. The method of fabricating a semiconductor device according to claim 1, wherein said scribing lines are formed on a side of said front surface of said semiconductor element layer.

6. A method of fabricating a semiconductor device with a back electrode, the method comprising steps of:

forming a semiconductor element layer on a front surface of a substrate provided with a region having concentrated dislocations at least on part of a back surface of said substrate;

after said step of forming said semiconductor element layer, forming plural front electrodes to be in contact with regions of a front surface of said semiconductor element layer corresponding to each semiconductor device;

forming said back electrode to be in contact with said back surface of said substrate; and removing said region having said concentrated dislocations after said step of forming said semiconductor element layer and said back electrode, wherein said step of removing said region having said concentrated dislocations includes the steps of:

forming a pair of scribing lines between said plural front electrodes apart from said region having said concentrated dislocations so as to hold said region having said concentrated dislocations therebetween; and separating said substrate and said semiconductor element layer along said scribing lines, thereby removing a portion including said region having said concentrated dislocations and ranging from said back surface to a front surface of said semiconductor element layer, wherein:

a striped ridge portion is formed at said front surface of said semiconductor element layer, an insulating film is formed on said front surface of said semiconductor element layer so as to expose an upper surface of said ridge portion, and said front electrode includes an ohmic electrode formed on said upper surface of said ridge portion and a pad electrode formed on said ohmic electrode and said insulating film.

7. The method of fabricating a semiconductor device according to claim 6, wherein said portion including said region having said concentrated dislocations has a substantially identical width of said back surface and said front surface of said semiconductor element layer.

8. The method of fabricating a semiconductor device according to claim 6, wherein said substrate includes a nitride-based semiconductor substrate.

9. The method of fabricating a semiconductor device according to claim 6, wherein said step of separating said substrate and said semiconductor element layer includes a step of cleaving said substrate and said semiconductor element layer.

10. The method of fabricating a semiconductor device according to claim 6, wherein said scribing lines are formed on a side of said front surface of said semiconductor element layer.

* * * * *